(12) United States Patent
Yamamoto et al.

(10) Patent No.: US 8,158,517 B2
(45) Date of Patent: Apr. 17, 2012

(54) METHOD FOR MANUFACTURING WIRING SUBSTRATE, THIN FILM TRANSISTOR, DISPLAY DEVICE AND TELEVISION DEVICE

(75) Inventors: Hiroko Yamamoto, Kanagawa (JP); Ryo Tokumaru, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 260 days.

(21) Appl. No.: 11/158,004

(22) Filed: Jun. 22, 2005

(65) Prior Publication Data
US 2005/0287721 A1 Dec. 29, 2005

(30) Foreign Application Priority Data
Jun. 28, 2004 (JP) ................................ 2004-189240

(51) Int. Cl.
*H01L 21/44* (2006.01)
(52) U.S. Cl. . 438/674; 438/759; 438/587; 257/E21.174; 257/E21.176; 257/E21.464
(58) Field of Classification Search .................. 438/455, 438/584, 616, 622, 669, 628, 614, FOR. 347, 438/FOR. 405, FOR. 385, 587, 674, 759, 438/FOR. 388; 257/E23.141, E21.159, E21.464, 257/E21.479, E21.174, E21.586, E21.176
See application file for complete search history.

(56) References Cited

U.S. PATENT DOCUMENTS

| 4,076,575 A | * | 2/1978 | Chang | ........................... 438/622 |
| 4,400,409 A | | 8/1983 | Izu et al. | |
| 4,612,085 A | | 9/1986 | Jelks et al. | |
| 4,727,234 A | | 2/1988 | Oprysko et al. | |
| 5,142,079 A | | 8/1992 | Chiba et al. | |
| 5,303,072 A | * | 4/1994 | Takeda et al. | ................... 349/48 |
| 5,467,882 A | | 11/1995 | Ahn | |
| 5,477,360 A | * | 12/1995 | Sunohara et al. | ............. 349/132 |

(Continued)

FOREIGN PATENT DOCUMENTS
EP 1087428 3/2001
(Continued)

OTHER PUBLICATIONS

Kuwahara et al., "Thermal Lithography for 0.1 μm pattern fabrication", Micro Electronic Engineering, 2002, vol. 61-62, pp. 415-421.

(Continued)

*Primary Examiner* — Matthew Smith
*Assistant Examiner* — Quovaunda V Jefferson
(74) *Attorney, Agent, or Firm* — Nixon Peabody LLP; Jeffrey L. Costellia

(57) ABSTRACT

An object of the present invention is to provide a method for manufacturing a display device by improving the utilization efficiency of materials and simplifying manufacturing process. Another object of the invention is to provide a technique for forming a pattern such as a wiring having a predetermined shape included in a display device with good controllability. A method for manufacturing a wiring substrate of the invention includes the steps of: forming a first region having a subject material; modifying the surface of the subject material partly to form a second region having a boundary with respect to the first region; continuously discharging a composition containing a conductive material to a part of the first region across the boundary and the second region; solidifying the composition to form a conductive layer; and removing the conductive layer formed in a part of the first region across the boundary.

44 Claims, 35 Drawing Sheets

U.S. PATENT DOCUMENTS

| | | | |
|---|---|---|---|
| 5,512,514 A | 4/1996 | Lee | |
| 5,626,919 A | 5/1997 | Chapman et al. | |
| 5,696,011 A | 12/1997 | Yamazaki et al. | |
| 5,852,488 A | 12/1998 | Takemura | |
| 5,892,562 A | 4/1999 | Yamazaki et al. | |
| 5,962,192 A * | 10/1999 | Holman et al. | 430/302 |
| 6,080,606 A * | 6/2000 | Gleskova et al. | 438/151 |
| 6,132,800 A | 10/2000 | Shimada et al. | |
| 6,177,710 B1 | 1/2001 | Nishikata et al. | |
| 6,224,667 B1 | 5/2001 | Kato | |
| 6,225,750 B1 | 5/2001 | Kimura | |
| 6,284,044 B1 | 9/2001 | Sakamoto et al. | |
| 6,294,313 B1 | 9/2001 | Kobayashi et al. | |
| 6,313,435 B1 | 11/2001 | Shoemaker et al. | |
| 6,337,731 B1 | 1/2002 | Takemura | |
| 6,350,405 B2 * | 2/2002 | Horine | 266/202 |
| 6,399,257 B1 | 6/2002 | Shirota et al. | |
| 6,416,583 B1 | 7/2002 | Kitano et al. | |
| 6,503,831 B2 | 1/2003 | Speakman | |
| 6,552,405 B2 | 4/2003 | Sugawara et al. | |
| 6,627,263 B2 | 9/2003 | Kitano et al. | |
| 6,630,274 B1 | 10/2003 | Kiguchi et al. | |
| 6,645,830 B2 | 11/2003 | Shimoda et al. | |
| 6,673,680 B2 | 1/2004 | Calafut | |
| 6,709,806 B2 | 3/2004 | Hotta et al. | |
| 6,715,871 B2 | 4/2004 | Hashimoto et al. | |
| 6,723,576 B2 | 4/2004 | Nozawa et al. | |
| 6,734,029 B2 | 5/2004 | Furusawa | |
| 6,807,213 B1 | 10/2004 | Shimoyama et al. | |
| 6,810,814 B2 | 11/2004 | Hasei | |
| 6,846,616 B2 | 1/2005 | Kobayashi et al. | |
| 6,875,996 B2 | 4/2005 | Nakamura | |
| 6,878,445 B2 | 4/2005 | Hattori et al. | |
| 6,936,532 B2 * | 8/2005 | Sakaida | 438/616 |
| 6,957,608 B1 | 10/2005 | Hubert et al. | |
| 6,994,414 B2 | 2/2006 | Hashimoto et al. | |
| 7,018,779 B2 | 3/2006 | Li et al. | |
| 7,045,438 B2 | 5/2006 | Yamazaki et al. | |
| 7,119,026 B2 | 10/2006 | Honda et al. | |
| 7,122,954 B2 | 10/2006 | Nozawa | |
| 7,131,194 B2 | 11/2006 | Hashimoto | |
| 7,164,455 B2 | 1/2007 | Takagi et al. | |
| 7,176,040 B2 | 2/2007 | Sirringhaus et al. | |
| 7,176,069 B2 | 2/2007 | Yamazaki et al. | |
| 7,189,654 B2 | 3/2007 | Yamazaki et al. | |
| 7,208,401 B2 | 4/2007 | Nelson et al. | |
| 7,252,923 B2 | 8/2007 | Kobayashi | |
| 7,273,773 B2 | 9/2007 | Yamazaki et al. | |
| 7,300,686 B2 | 11/2007 | Morii | |
| 7,364,769 B2 | 4/2008 | Yoshida et al. | |
| 7,365,805 B2 | 4/2008 | Maekawa et al. | |
| 7,435,515 B2 | 10/2008 | Kobayashi et al. | |
| 7,449,372 B2 | 11/2008 | Fujii et al. | |
| 7,462,514 B2 | 12/2008 | Shiroguchi et al. | |
| 7,470,604 B2 | 12/2008 | Fujii | |
| 7,476,572 B2 | 1/2009 | Morisue et al. | |
| 7,510,893 B2 | 3/2009 | Yamazaki et al. | |
| 7,569,334 B2 | 8/2009 | Kobayashi et al. | |
| 7,575,845 B2 | 8/2009 | Kobayashi et al. | |
| 7,585,783 B2 | 9/2009 | Nakamura et al. | |
| 7,615,488 B2 | 11/2009 | Maekawa et al. | |
| 7,625,493 B2 | 12/2009 | Yamazaki | |
| 7,642,038 B2 | 1/2010 | Fujii | |
| 7,749,684 B2 | 7/2010 | Kobayashi | |
| 7,812,355 B2 | 10/2010 | Shiroguchi et al. | |
| 7,939,888 B2 | 5/2011 | Yamazaki et al. | |
| 2001/0023938 A1 * | 9/2001 | Allen et al. | 252/582 |
| 2001/0035926 A1 | 11/2001 | Yamaguchi et al. | |
| 2001/0045974 A1 | 11/2001 | Shoemaker et al. | |
| 2002/0000426 A1 | 1/2002 | Mead et al. | |
| 2002/0006558 A1 | 1/2002 | Kobayashi et al. | |
| 2002/0079832 A1 | 6/2002 | Van Tongeren et al. | |
| 2002/0094604 A1 * | 7/2002 | Hayama et al. | 438/108 |
| 2002/0109456 A1 | 8/2002 | Morii | |
| 2002/0136829 A1 | 9/2002 | Kitano et al. | |
| 2002/0146893 A1 | 10/2002 | Shimoda et al. | |
| 2002/0158259 A1 | 10/2002 | Ono et al. | |
| 2003/0017303 A1 | 1/2003 | Shindo et al. | |
| 2003/0025118 A1 | 2/2003 | Yamazaki et al. | |
| 2003/0030689 A1 | 2/2003 | Hashimoto et al. | |
| 2003/0059686 A1 | 3/2003 | Kobayashi et al. | |
| 2003/0059987 A1 * | 3/2003 | Sirringhaus et al. | 438/149 |
| 2003/0083203 A1 | 5/2003 | Hashimoto et al. | |
| 2003/0087073 A1 | 5/2003 | Kobayashi | |
| 2003/0104647 A1 * | 6/2003 | Siegel et al. | 438/50 |
| 2003/0129321 A1 | 7/2003 | Aoki | |
| 2003/0215634 A1 | 11/2003 | Hattori et al. | |
| 2004/0016115 A1 * | 1/2004 | Hashimoto | 29/842 |
| 2004/0041158 A1 | 3/2004 | Hongo et al. | |
| 2004/0043334 A1 * | 3/2004 | Kobayashi et al. | 430/315 |
| 2004/0056588 A1 | 3/2004 | Nozawa | |
| 2004/0131979 A1 | 7/2004 | Li et al. | |
| 2004/0174469 A1 | 9/2004 | Takagi et al. | |
| 2004/0232411 A1 * | 11/2004 | Nakamura | 257/40 |
| 2004/0241897 A1 | 12/2004 | Rhee et al. | |
| 2004/0241923 A1 | 12/2004 | Toida | |
| 2004/0253896 A1 | 12/2004 | Yamazaki | |
| 2004/0266073 A1 | 12/2004 | Yamazaki | |
| 2005/0003645 A1 * | 1/2005 | Hirai | 438/584 |
| 2005/0009327 A1 * | 1/2005 | Yoshida et al. | 438/661 |
| 2005/0011752 A1 | 1/2005 | Yamazaki et al. | |
| 2005/0013927 A1 | 1/2005 | Yamazaki | |
| 2005/0043186 A1 | 2/2005 | Maekawa et al. | |
| 2005/0064091 A1 | 3/2005 | Yamazaki | |
| 2005/0090029 A1 | 4/2005 | Yamazaki et al. | |
| 2005/0112810 A1 | 5/2005 | Kobayashi | |
| 2005/0142896 A1 | 6/2005 | Imai et al. | |
| 2005/0147766 A1 | 7/2005 | Aoki | |
| 2005/0158665 A1 | 7/2005 | Maekawa et al. | |
| 2005/0163938 A1 | 7/2005 | Yamazaki et al. | |
| 2005/0196710 A1 | 9/2005 | Shiroguchi | |
| 2005/0196711 A1 | 9/2005 | Shiroguchi et al. | |
| 2005/0221203 A1 | 10/2005 | Fuji | |
| 2005/0287721 A1 | 12/2005 | Yamamoto et al. | |
| 2006/0040435 A1 | 2/2006 | Morisue et al. | |
| 2006/0043518 A1 | 3/2006 | Nakaji et al. | |
| 2006/0046512 A1 | 3/2006 | Nakamura et al. | |
| 2006/0121745 A1 | 6/2006 | Fujii | |
| 2006/0134918 A1 | 6/2006 | Fujii et al. | |
| 2006/0141619 A1 | 6/2006 | Hattori et al. | |
| 2006/0158482 A1 | 7/2006 | Nakamura et al. | |
| 2007/0093002 A1 | 4/2007 | Maekawa et al. | |
| 2007/0196962 A1 | 8/2007 | Morisue et al. | |
| 2007/0207274 A1 | 9/2007 | Fujii | |
| 2007/0267953 A1 | 11/2007 | Seki | |
| 2007/0295396 A1 | 12/2007 | Takahashi et al. | |
| 2008/0001538 A1 | 1/2008 | Cok | |
| 2008/0012076 A1 | 1/2008 | Yamazaki et al. | |
| 2008/0044745 A1 | 2/2008 | Kobayashi et al. | |
| 2008/0050662 A1 | 2/2008 | Kobayashi et al. | |
| 2008/0105875 A1 | 5/2008 | Maekawa et al. | |
| 2008/0199992 A1 | 8/2008 | Maekawa et al. | |
| 2008/0315428 A1 | 12/2008 | Fujii | |
| 2009/0314203 A1 | 12/2009 | Nakamura et al. | |
| 2010/0051943 A1 | 3/2010 | Fujii | |

FOREIGN PATENT DOCUMENTS

| | | | |
|---|---|---|---|
| JP | 54-45102 | * | 4/1979 |
| JP | 58-015242 | | 1/1983 |
| JP | 60-103622 | | 6/1985 |
| JP | 62-108368 | | 7/1987 |
| JP | 08-062445 | | 3/1996 |
| JP | 08-155670 | | 6/1996 |
| JP | 09-260808 | | 10/1997 |
| JP | 11-207979 | | 8/1999 |
| JP | 11-251259 | | 9/1999 |
| JP | 2000-249821 | | 9/2000 |
| JP | 2001-179167 | | 7/2001 |
| JP | 2001-272526 | | 10/2001 |
| JP | 2001-332383 | | 11/2001 |
| JP | 2002-208635 | | 7/2002 |
| JP | 2003-059940 | | 2/2003 |
| JP | 2003-318515 | | 11/2003 |
| JP | 2004-089878 | | 3/2004 |
| WO | WO00/28604 | | 5/2000 |
| WO | WO00/59014 | | 10/2000 |
| WO | WO2005/091375 | | 9/2005 |

OTHER PUBLICATIONS

Moore J et al., Building Scientific Apparatus, 2009, pp. 277-280, Cambridge University Press.

Sales T, "Structured microlens arrays for beam shaping,", Optical Engineering, Nov. 1, 2003, vol. 42, No. 11, pp. 3084-3085.

* cited by examiner

METHOD FOR MANUFACTURING WIRING SUBSTRATE, THIN FILM TRANSISTOR, DISPLAY DEVICE AND TELEVISION DEVICE

BACKGROUND OF THE INVENTION

1. Field of the Invention

The present invention relates to a method for manufacturing a wiring substrate, a thin film transistor, a display device and a television device.

2. Description of the Related Art

A thin film transistor (hereinafter referred to as a "TFT") and an electric circuit using the thin film transistor are formed by laminating various kinds of thin films containing semiconductor, insulator or conductor over a substrate and adequately patterning into predetermined shapes using photolithography. Photolithography is a technique in which a pattern of a circuit or the like, which is referred to as a photomask and formed using a material that does not transmit light, over a transparent flat plate is transferred to an intended substrate by utilizing light. The photolithography technique is widely used in a process of manufacturing a semiconductor integrated circuit and the like.

The conventional manufacturing process using photolithography requires multiple steps such as exposure, development, baking and peeling only for treating a mask pattern formed by using a photosensitive organic resin material that is referred to as a photoresist. Therefore, the manufacturing cost is inevitably increased with increasing the number of photolithography steps. In order to solve this problem, it has been attempted to manufacture TFTs with lower number of photolithography steps (e.g., see the patent document 1).

[Patent Document 1]: Japanese Patent Application Laid-Open No. Hei 11-251259

SUMMARY OF THE INVENTION

It is an object of the present invention to provide a method for manufacturing a TFT, an electronic circuit using the TFT, a display device formed using the TFT over a large size substrate having 1 m or more on a side with high yield at low cost by reducing the number of photolithography steps and thereby simplifying the manufacturing process.

Further, another object of the invention is to provide a technique for forming a component such as a wiring of a display device having a predetermined shape with good controllability.

In the present invention, a region of a subject on which a conductive layer used for a wiring etc., an insulating layer or the like is formed is modified by irradiating light. According to this modification, an adherence property of a region of the subject on which a conductive layer will be formed is different from that of a region of the subject on which a conductive layer will not be formed. Thereafter, a conductive material is discharged (sprayed or the like) in the region of the subject on which a conductive layer will be formed and vicinity of the region and attached thereto so as to form the conductive layer. When the pretreatment is performed to form the region on which a conductive layer will be formed with a high adherence property to the conductive layer and the region on which a conductive layer will not be formed with low adherence property, an unnecessary portion formed on the region on which a conductive layer will not be formed can be removed mechanically by utilizing the difference in the adherence properties, and therefore, the patterning can be performed precisely.

Display devices according to the invention include a light emitting display device including a light emitting element connected to a TFT, wherein a layer including an organic material or a mixture of an organic material and an inorganic material which emit light (referred to as electroluminescence (EL)) is sandwiched between electrodes in the light emitting element; a liquid crystal display device that uses a liquid crystal element including liquid crystal material as a display element; and the like.

In an aspect of the invention, a method for manufacturing a wiring substrate includes the steps of: forming a subject; modifying a part of a surface of the subject to form a first region and a second region having a boundary with respect to the first region; putting a composition containing a conductive material on continuously from the part of the first region to the second region across the boundary by discharging the composition; solidifying the composition to form a conductive layer; and removing the conductive layer formed on the part of the first region In another aspect of the invention, a method for manufacturing a wiring substrate includes the steps of; forming a subject; modifying a part of a surface of the subject to form a first region and a second region having a boundary with respect to the first region; putting a composition containing a conductive material on continuously from the part of the first region to the second region across the boundary by discharging the composition; solidifying the composition to form a conductive layer; attaching an object having a surface with adhesive property to the conductive layer; and peeling off the object having a surface with adhesive property and the conductive layer formed on the part of the first region.

In another aspect of the invention, a method for manufacturing a wiring substrate includes the steps of: forming a subject; modifying a part of a surface of the subject material by irradiating light to form a first region and a second region having a boundary with respect to the first region; putting a composition containing a conductive material on continuously from the part of the first region to the second region across the boundary by discharging the composition; solidifying the composition to form a conductive layer; and peeling off the conductive layer formed on the part of the first region across the boundary.

In another aspect of the invention, a method for manufacturing a wiring substrate includes the steps of: forming a subject; modifying a part of a surface of the subject material by irradiating light to form a first region and a second region having a boundary with respect to the first region; putting a composition containing a conductive material on continuously from the part of the first region to the second region across the boundary by discharging the composition; solidifying the composition to form a conductive layer; attaching an object having a surface with adherence property to the conductive layer; and peeling off the object having a surface with adherence property and the conductive layer formed on the part of the first region.

In another aspect of the invention, a method for manufacturing a thin film transistor includes the steps of: forming a subject; modifying a part of a surface of the subject to form a first region and a second region having a boundary with respect to the first region; putting a composition containing a conductive material on continuously from the part of the first region to the second region across the boundary by discharging the composition; solidifying the composition to form a conductive layer; and removing the conductive layer formed on the part of the first region, thereby forming a gate electrode.

In another aspect of the invention, a method for manufacturing a thin film transistor includes the steps of: forming a subject; modifying a part of a surface of the subject to form a first region and a second region having a boundary with respect to the first region; putting a composition containing a conductive material on continuously from the part of the first region to the second region across the boundary by discharging the composition; solidifying the composition to form a conductive layer; attaching an object having a surface with adherence property to the conductive layer; and peeling off the object having a surface with adherence property and the conductive layer formed on the part of the first region, thereby forming a gate electrode.

In another aspect of the invention, a method for manufacturing a thin film transistor includes the steps of: forming a subject; modifying a part of a surface of the subject by irradiating light to form a first region and a second region having a boundary with respect to the first region; putting a composition containing a conductive material on continuously from the part of the first region to the second region across the boundary by discharging the composition; solidifying the composition to form a conductive layer; and removing the conductive layer formed on the part of the first region, thereby forming a gate electrode.

In another aspect of the invention, a method for manufacturing a thin film transistor includes the steps of: forming a subject; modifying a part of a surface of the subject by irradiating light to form a first region and a second region having a boundary with respect to the first region; putting a composition containing a conductive material on continuously from the part of the first region and the second region across the boundary by discharging the composition; solidifying the composition to form a conductive layer; attaching an object having a surface with adherence property to the conductive layer; and peeling off the object having a surface with adherence property and the conductive layer formed on the part of the first region, thereby forming a gate electrode.

According to the present invention, a wiring or the like having a desirable shape can be formed easily with good controllability. In addition, cost can be low since loss of material is little. Therefore, a high-performance, highly reliable display device can be manufactured with high yield.

DETAILED DESCRIPTION OF THE INVENTION

Embodiment Mode 1

Figure 1A:
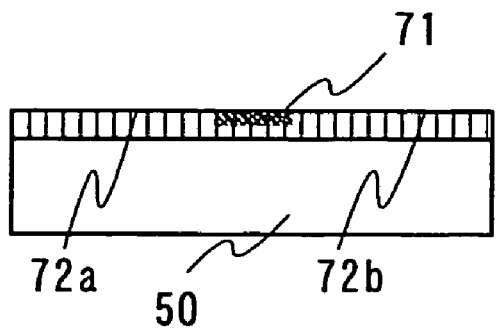
FIGS. 1A to 1C are cross sectional views explaining the invention.
Figure 1B:
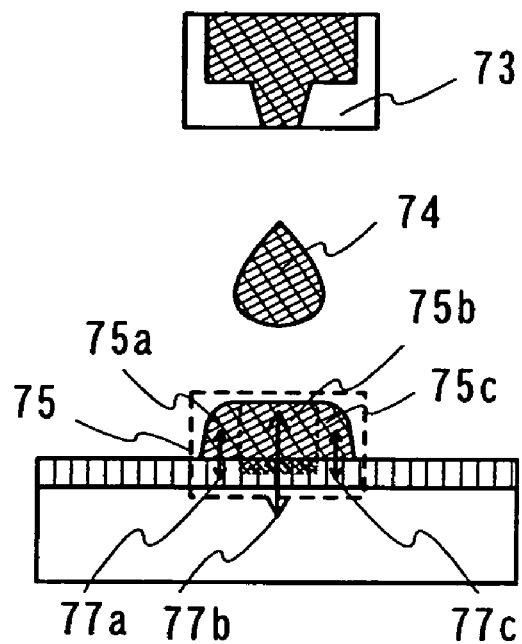

The embodiment modes and embodiments according to the present invention will hereinafter be described referring to the accompanying drawings. It is easily understood by those who skilled in the art that the embodiment modes and details herein disclosed can be modified in various ways without departing from the purpose and the scope of the invention. The present invention should not be interpreted as being limited to the description of the embodiment modes to be given below. Further, in the structure of the invention, same portions or portions having the same function are marked by the same reference numerals in the drawings so as not to explain repeatedly.

One embodiment mode of the invention will be described with reference to FIGS. 1A to 1C, FIGS. 2A to 2C and FIGS. 3A to 3C.

One feature of the present invention is that at least one or more of objects (existing in various modes like a film or a layer according to a purpose and a function thereof) necessary for manufacturing a display panel such as a wiring layer, a conductive layer of an electrode and a mask layer used for forming a predetermined pattern is/are selectively formed to have a predetermined shape to form a display device. The present invention can be applied to all component elements having predetermined shapes like a conductive layer such as a gate electrode layer, a source electrode layer and a drain electrode layer, a semiconductor layer, an insulating layer and the like, which are included in a thin film transistor or a display device. A droplet discharging jetting) method (also referred to as an ink jetting method depending on its method) in which a liquid of composition that is prepared for forming a conductive layer, an insulating layer or the like is selectively discharged (sprayed) thereon to form a predetermined pattern is used as a method for forming a pattern having a predetermined shape selectively. Additionally, a technique in which a material having a predetermined shape can be transferred or written, for example, various kinds of printing techniques (e.g., screen printing, offset (planography) printing, relief printing, gravure printing) can be employed.

A technique in which a composition containing a material having fluidity is discharged (sprayed) to form a predetermined pattern is employed in this embodiment mode. A droplet containing a material to be formed is discharged in a subject region on which a pattern will be formed, and then baked and dried to solidify the composition, thereby obtaining a predetermined pattern. In the present invention, a pretreatment is carried out in the subject region on which the pattern will be formed.

Figure 28:
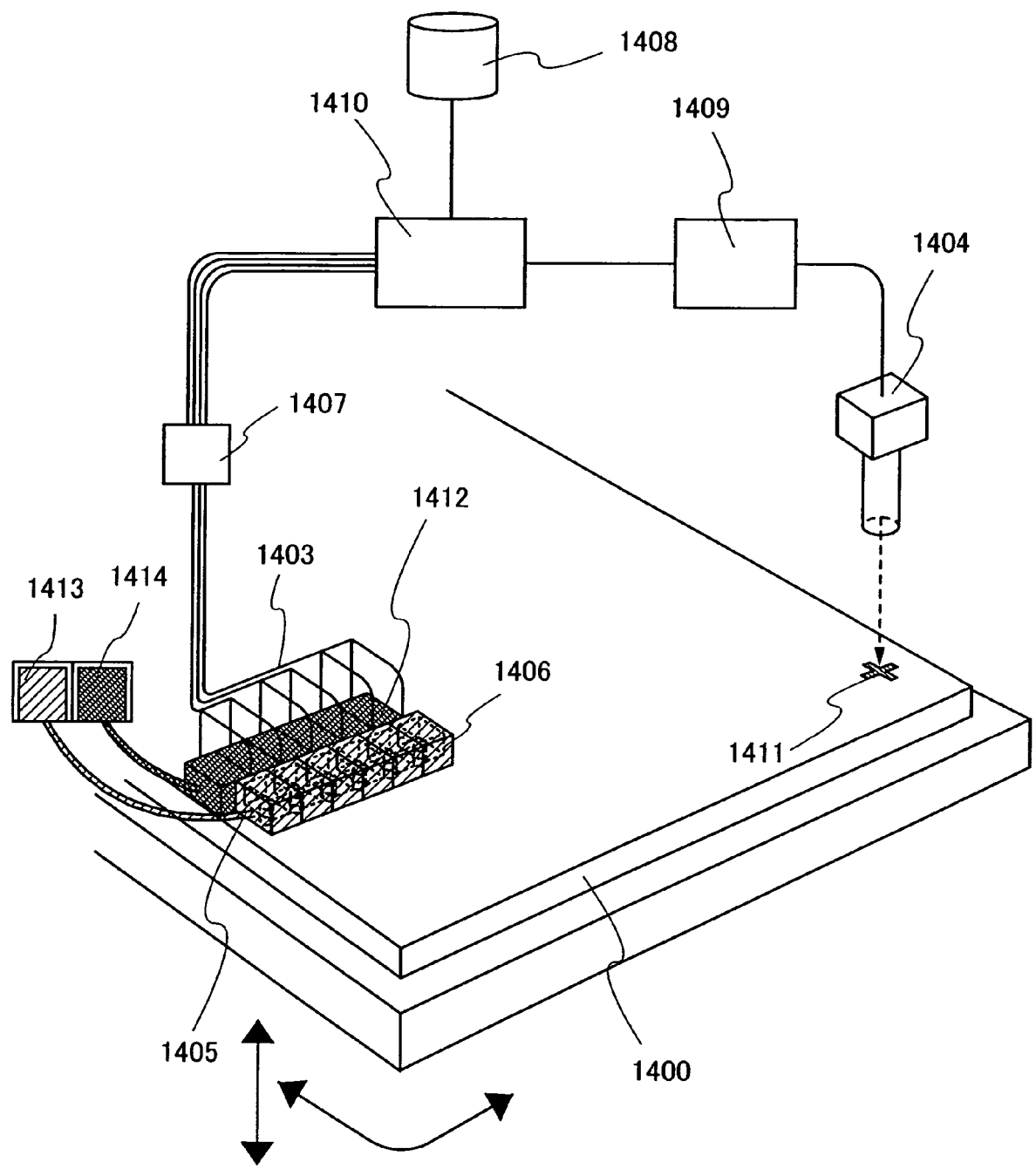
FIG. 28 is a diagram explaining a structure of a droplet discharging device that can be applied to the present invention.

One mode of a droplet discharging device used for the droplet discharging method is shown in FIG. 28. Individual heads 1405 and 1412 of droplet discharging means 1403 are connected to controlling means 1407. By controlling the respective heads using a computer 1410, a predetermined pattern that has been programmed in the computer in advance can be written. For example, the alignment of the pattern may be determined in accordance with a marker 1411 provided over a substrate 1400. Alternatively, the edge of the substrate 1400 may be determined as a reference point. Information about the marker 1411 is detected by imaging means 1404 and converted into a digital signal in image processing means 1409. When the digital signal is recognized by the computer 1410, a control signal is generated and sent to the controlling means 1407. As the imaging means 1404, an image sensor utilizing a charge-coupled device (CCD) or a complementary metal-oxide semiconductor (CMOS) can be used. Of course, information of the pattern to be formed over the substrate 1400 is stored in a recording medium 1408. The control signal is sent to the controlling means 1407 based on this information about the pattern so that the heads 1405 and 1412 of the droplet discharging means 1403 can be controlled individually.

The sizes of nozzles for the head 1405 and the head 1412 are changed from each other so that patterns with different widths can be written using different materials. A conductive material, an organic material, an inorganic material and the like can be discharged respectively through one head to write patterns. When a pattern is written in a large area such as an interlayer film, a same material can be simultaneously discharged through plural nozzles to write the pattern so that throughput can be improved. In the case of using a large size substrate, the heads 1405 and 1412 can scan over the substrate in directions of arrows, and therefore, a region to be written can be set freely. Accordingly, plural same patterns can be written over one substrate.

As shown in FIGS. 2A to 2C and FIGS. 3A to 3C, a light irradiation treatment is performed in the subject region on which a pattern will be formed as a pretreatment to modify a surface of the subject region selectively. According to this treatment of changing the property, at least two or more kinds of regions having different adherence properties with respect to the pattern can be formed in the region on which the composition containing a material to be formed is discharged.

The light used for the treatment of changing the property is not particularly limited, and any one of infrared light, visible light, ultraviolet light or a combination thereof can be used. For instance, light emitted from an ultraviolet lamp, a black light, a halogen lamp, a metal halide lamp, a xenon arc lamp, a carbon arc lamp, a high-pressure sodium vapor lamp or a high-pressure mercury lamp may be used. In this case, light of a light source may be emitted for a required period or emitted several times.

Figure 32:
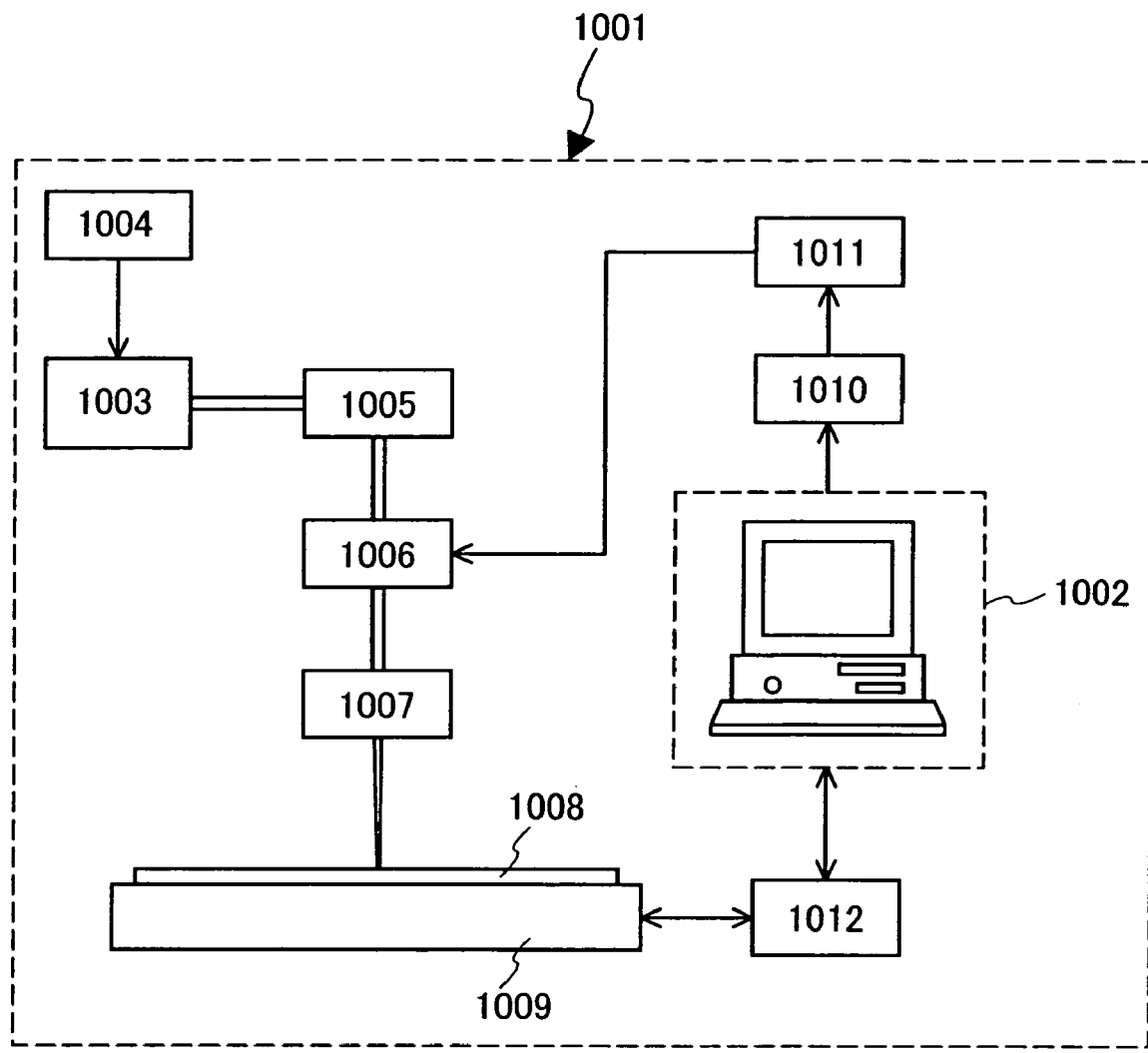
FIG. 32 is a diagram showing a structure of a laser light direct writing device that can be applied to the invention.

In addition, laser light may be employed. When using laser light, a property of the subject region on which the pattern will be formed can be changed precisely so that an object formed on the subject region can also be formed precisely. A laser light writing device for writing laser light (also referred to as laser beam) in a processing region, that can be applied to the present invention, will be described using FIG. 32. A laser light direct writing device is used in this embodiment mode since a processing region is selected to be directly irradiated with laser light rather than irradiating laser light through a mask or the like. As shown in FIG. 32, a laser light direct writing device 1001 comprises: a personal computer (hereinafter, PC) 1002 for executing various kinds of controls in irradiating laser light; a laser oscillator 1003 for oscillating laser light; a power source 1004 of the laser oscillator 1003; an optical system (ND filter) 1005 for attenuating laser light; an acoustooptical modulator (AOM) 1006 for modulating the intensity of laser light; an optical system 1007 including a lens for zooming in or out a cross section of laser light, a mirror for changing a light path, and the like; a substrate transferring mechanism 1009 having an X stage and a Y stage; a D/A converter 1010 for converting control data output from the PC 1002 into digital/analog data; a driver 1011 for controlling the acoustooptical modulator 1006 in accordance with an analog voltage output from the D/A converter; and a driver 1012 for outputting a driving signal for driving the substrate transferring mechanism 1009.

As the laser oscillator 1003, a laser oscillator capable of oscillating ultraviolet light, visible light or infrared light can be used. As the laser oscillator, an excimer laser oscillator such as KrF, ArF, XeCl and Xe, a gas laser oscillator such as He, He—Cd, Ar, He—Ne and HF, a solid-state laser oscillator using a crystal such as YAG, GdVO$_4$, YVO$_4$, YLF and YAlO$_3$ doped with Cr, Nd, Er, Ho, Ce, Co, Ti or Tm, and a semiconductor laser oscillator such as GaN, GaAs, GaAlAs and InGaAsP can be used. Further, a fundamental wave and second to fifth harmonics are preferably applied in the solid-state laser oscillator.

Next, a treatment for modifying a substance (surface) using the laser light direct writing device will be described. When a substrate 1008 is placed in the substrate transferring mechanism 1009, the PC 1002 detects a position of a marker marked on the substrate by a camera not shown in the drawing. The PC 1002 generates transferring data for moving the substrate transferring mechanism 1009 based on the positional data of the marker detected by the camera and a writing pattern data that has been input in the PC 1002 previously. Thereafter, the PC 1002 controls the amount of light output from the acoustooptical modulator 1006 through the driver 1011 and laser light output from the laser oscillator 1003 is attenuated by the optical system 1005 so that the amount of light is controlled by the acoustooptical modulator 1006 to have a predetermined amount. Meanwhile, a light path and a shape of the laser light (a beam spot) output from the acoustooptical modulator 1006 are changed by the optical system 1007 and condensed by the lens. Thereafter, the condensed laser light is emitted to a subject material formed over the substrate to modify the subject material. At this moment, the substrate transferring mechanism 1009 is controlled to be moved in the X direction and the Y direction according to the transferring data generated by the PC 1002. As a result, the laser light is emitted to a predetermined portion so that the property of the subject material is changed.

As shown in FIG. 1A, the property of the subject material is changed in the region irradiated with the laser light, thereby increasing the adherence property of the subject material with respect to a pattern formed on the subject material. Accordingly, the adherence property of a region 71 is increased as compared with those of a region 72a and a region 72b so that regions having different adherence properties with respect to a pattern to be formed thereon, i.e., a region 71 with a relatively high adherence property (hereinafter referred to as a high adherence region) and regions 72a and 72b with low adherence properties (hereinafter referred to as low adherence regions) are formed over the substrate 50. Since energy of the laser light is partly converted into heat by the material of the subject material and the heat reacts with a part of the subject material, the width of the region 71 of the subject material, where is irradiated with the laser light, becomes sometimes slight larger than the width of the laser light. In addition, laser light with a shorter wavelength can be condensed to have a shorter diameter of the laser light, and therefore, laser light with a short wavelength is preferably emitted to form a processing region with a minute width.

The laser light is processed by an optical system so as to have a beam spot with a dot shape, a circular shape, an elliptical shape, a rectangular shape, or a linear shape (more specifically, an elongated rectangular shape) over the surface of a film.

Although the laser light is herein selectively emitted to the substrate while moving the substrate, the present invention is not limited thereto. Alternatively, laser light can be emitted to the substrate while scanning the laser light in the X-Y axis directions. In this case, a polygon mirror or a galvanometer mirror is preferably used as the optical system 1007.

Also, light of a lamp source can be used in combination with laser light. In this case, light of the lamp can be emitted to a large region by using a mask while laser light can be emitted to only a microscopic region. According to this light irradiation treatment, the throughput can be improved and a wiring substrate or the like that is patterned precisely can be obtained.

In this embodiment mode, light is emitted to an intended region so as to change an adherence property thereof. Therefore, a region having a different adherence property with respect to the pattern is formed in the vicinity of the subject region on which the pattern will be formed. The adherence properties are different between the both regions relatively. Accordingly, the both regions may have the different adherence properties from each other such that the degrees of adherence properties with respect to the pattern are different between the subject region on which the pattern will be formed and the region around the subject region. The difference in the adherence properties indicates that the adhesion with respect to the pattern to be formed is different between the subject region and the region around the subject region. In a region with a high adherence property, the pattern is difficult to be removed mechanically (e.g., removed by peeling off, suction, blowing air or the like). In a region with low adherence property, the pattern is easily removed mechanically (e.g., removed by peeling off, suction, blowing air or the like). By utilizing the difference in the adherence properties, a pattern of a conductive layer, an insulating layer, a semiconductor layer or the like can selectively be patterned precisely. Since the difference in the adherence properties between the subject region and the region around the subject region is important in the present invention, it does not matter whether or not a composition containing a material with fluidity, which is attached to the subject region on which the pattern will be formed, is well-adhered to the subject region. For example, in the case of a composition having fluidity that is not well-adhered to the subject region, when the composition is solidified by steps of baking, drying and the like, the adherence property of the composition is possibly increased with respect to the subject region or decreased with respect to the subject region. In consideration of these cases, a subject region, a condition of a treatment for changing a property, and a subject material may arbitrarily be selected.

In order to form regions having different adherence properties from each other, a light irradiation treatment is performed in this embodiment mode. Specifically, a substance that is a subject material is formed in a subject region and the vicinity thereof and light is selectively emitted to the substance to relatively increase or decrease its adherence property. In this embodiment mode, a substance with low adherence property is formed as a subject material in the vicinity of the subject region on which a pattern will be formed. Subsequently, light is selectively emitted to the substance with low adherence property such that the substance with low adherence property is decomposed. The substance with low adherence property in the processing region is decomposed and removed to increase the adherence property of the processing region relative to the peripheral region, thereby achieving a high adherence region. Due to the formation of the high adherence region, the concentration of the substance with low adherence property included in a low adherence region (e.g., the concentration or quantity of fluorocarbon chain that has an effect of reducing the adherence property in this embodiment mode) becomes relatively higher. As the substance with low adherence property, a substance containing a material which adherence property is relatively changed can be used. By decomposing or destroying the material having the effect of relatively changing an adherence property by the light irradiation treatment, the effect of reducing the adherence property is degraded.

With respect to a wavelength of light, a wavelength that is absorbed by the substance with low adherence property is required. In order to increase the processing efficiency by the light irradiation treatment, it is effective that a light-absorbing material that has an absorption band in the wavelength range of the laser light is added to the substance with low adherence property. The light-absorbing material having an absorption region in the wavelength region of the laser light absorbs irradiated light and then emits (radiates) light around it. The radiant energy affects a peripheral substance, thereby modifying the peripheral substance. Since the light-absorbing material may be selected in accordance with the type of light, the range of choices for light is widened. In addition, since the light irradiation efficiency can be increased, the light irradiation treatment can be carried out sufficiently even if the light itself has low energy. Therefore, the device or process is simplified so that cost and time are reduced, thereby improving the productivity.

Figure 2A:
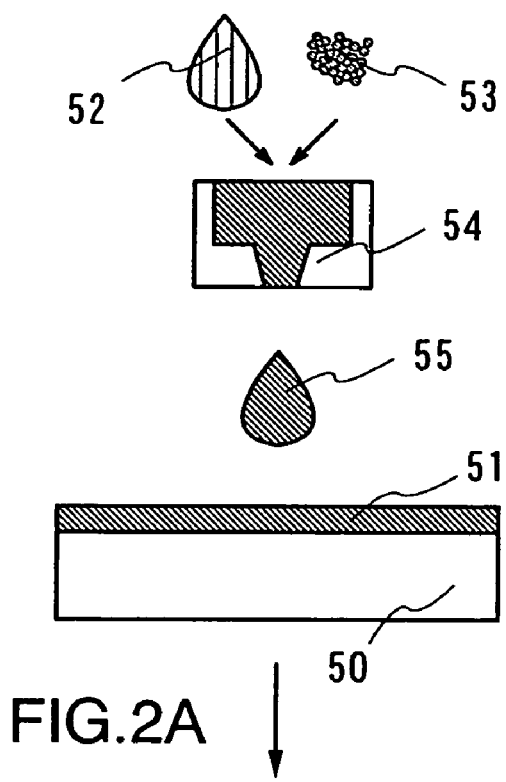
FIGS. 2A to 2C are cross sectional views explaining the invention.

A light-absorbing material 53 is added to a substance 52 with low adherence property in this embodiment mode (see FIG. 2A). In this embodiment mode, the substance 52 with low adherence property is mixed in a solvent and the like and remains in a liquid state since the substance 52 with low adherence property in the liquid state is formed by coating. However, the method for forming the substance 52 with low adherence property is not limited to this embodiment mode so long as the substance may attach to the subject region and the vicinity of the subject region on which the substance with low adherence property will be formed. For example, the substance 52 with low adherence property can be formed by dip coating of the sol-gel technique, spin coating, the droplet discharging method, ion plating, ion beam, CVD, sputtering, RF magnetron sputtering, plasma spray coating, plasma spraying, and the like. When the substance 52 with low adherence property is formed by applying a liquid such as the dip coating and the spin coating, the liquid may be baked and dried to remove a solvent. The utilization efficiency of a material can be improved by using the method for forming a predetermined pattern directly in a subject region and the vicinity of the subject region on which the predetermined pattern will be formed, such as the drop discharging method, and therefore, the cost can be reduced.

The light-absorbing material added in the substance 52 with low adherence property is mixed (by dissolving or dispersing) in the substance 52 with low adherence property as shown in FIG. 2A to form a composition with low adherence property in a liquid state. The composition with low adherence property is discharged over a substrate 50 as a droplet 55 by a discharging device 54 to form a composition 51 with low adherence property.

Light 56 is selectively irradiated only to a subject region on which the composition 51 with low adherence property will be formed. In this embodiment mode, laser light is used as the light 56 and is emitted by a laser irradiating device. The light-absorbing material contained in the composition 51 with low adherence property has an absorption band in the wavelength of the light 56 so that the light-absorbing material absorbs light emitted from the laser irradiating device and emits energy of the light. The substance with low adherence property is decomposed and destroyed by the radiant energy, thereby increasing the adherence property of the subject region on which the pattern will be formed. Accordingly, a high adherence region 58, which is a region with a high adherence property, is formed while regions having a different degree of adherence property are formed around the high adherence region 58. Accordingly, the adherence property of the non-subject regions where are not treated with the light 56 is relatively low compared to the property of the high adherence region 58, and the non-subject regions become a low adherence region 57a and a low adherence region 57b (see FIG. 2B).

After forming the regions having different degree of the adherence properties, the light-absorbing material included in the composition with low adherence property may be washed to be removed by using alcohol, water or the like. In this case, to eliminate only the light-absorbing material, a solvent having high selectivity is necessary to be selected so as not to dissolve the substance 52 with low adherence property. In this embodiment mode, the composition with low adherence property is washed by using a dissoluble solvent to remove the light-absorbing material 53, thereby achieving a high adherence region 71, a low adherence region 72a and a low adherence region 72b (see FIG. 2C).

The light-absorbing material may be included in the substance with low adherence property, and therefore, it may be dissolved in the substance with low adherence property or dispersed therein as particles. When the light-absorbing material is dispersed in the substance with low adherence property, a particle having a size smaller than the size of the processing region is necessary to be used. This is because the energy emitted from the particle affects a neighboring substance so that a minimum size of the processing region is determined by the size of the particle. Further, the shape of the light-absorbing material dispersed in the substance with low adherence property may be a granular shape, a columnar shape, a needle shape, a plate shape or the like. Alternatively, at least substances that are identical to any one of plural substances forming a surface of a subject pattern may be aggregated as an aggregation of a simple body.

In addition, FIG. 32 shows an example of the device in which a top surface of the substrate is irradiated with light to be exposed. However, a laser light writing device in which laser light is irradiated to a back surface of the substrate may be used by changing the optical system and the substrate transferring mechanism arbitrarily.

Figure 3A:
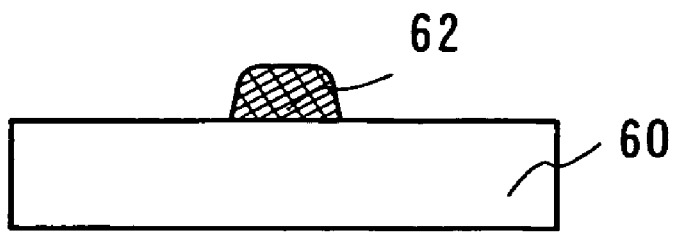
FIGS. 3A to 3C are cross sectional views explaining the invention.
Figure 3B:
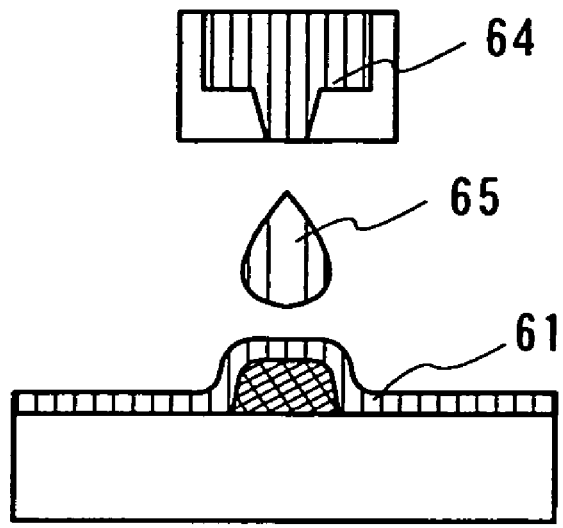

An example of modifying a subject region by exposing a substrate to light from a back surface thereof will be described with reference to FIGS. 3A to 3C. A transparent substrate 60 is used and a mask 62 is formed thereon (see FIG. 3A). To use the mask 62 as a mask for shielding light emitted from a light source, the mask 62 is necessary to be made using a material that is difficult to transmit light.

Figure 2B:
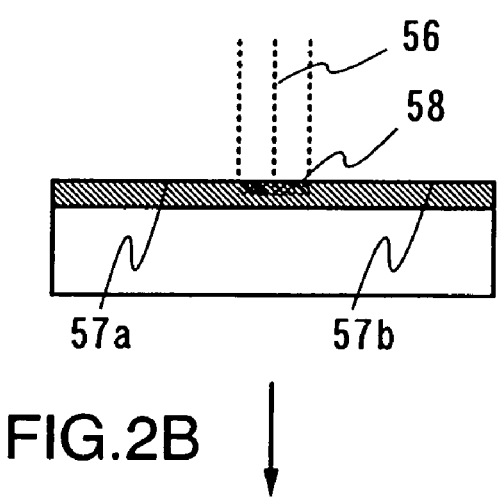
Figure 2C:
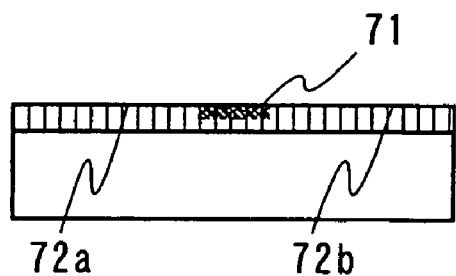

A light-absorbing material may be added to a substance 65 with low adherence property as used in FIGS. 2A to 2C. The substance 65 with low adherence property is discharged as a droplet to the surface of the substrate 60 by a discharging device 64 to form a composition 61 with low adherence property (see FIG. 3B).

Figure 3C:
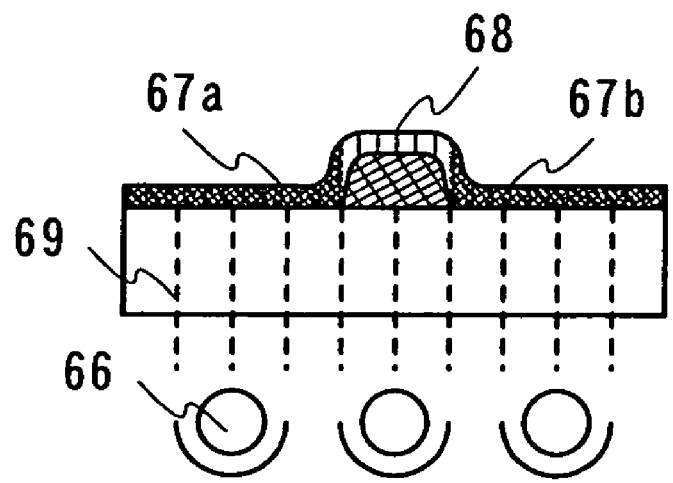

Light 69 is emitted to the composition 61 with low adherence property through the substrate 60 from light sources 66 (see FIG. 3C). In this example as shown in FIGS. 3A to 3C, lamp light sources are used as the light sources. Since the light 69 is blocked by the mask 62 in the region on which the mask 62 is formed, the surface of the composition 61 with low adherence property provided on the mask 62 is not irradiated with the light. Therefore, a high adherence region 67a and a high adherence region 67b, which are regions having high adherence properties, are formed so that a region having different degree of an adherence property is formed between the high adherence regions. That is, an adherence property of a non-subject region where is not irradiated by light is relatively low compared to those of the subject regions, and hence, the non-subject region becomes a low adherence region 68.

According to the above process, plural regions having different degree of the adherence properties are formed in the subject region on which a pattern will be formed and the vicinity thereof (see FIG. 1A).

A droplet 74 containing a material to be formed is discharged on the high adherence region 71, where is a subject region on which a pattern will be formed, through a nozzle of a droplet discharging device 73. The discharged droplet 74 is attached to the high adherence region 71 and a part of the low adherence regions 72a and 72b (see FIG. 1B). The droplet 74 is baked and dried to form a pattern 75. This pattern 75 is formed astride the three regions having different degree of the adherence properties. Concretely, a pattern 75b is formed on the high adherence region 71, a pattern 75a is formed on the low adherence region 72a, and a pattern 75c is formed on the low adherence region 72b, respectively. Dashed lines marked between the patterns 75a and 75b and between the patterns 75b and 75c indicate boundaries between a region irradiated by light and the regions not irradiated by light. The adhesion 77a, the adhesion 77b and the adhesion 77c act between the respective regions and the patterns formed thereon depending on the degrees of the respective adherence properties. The adhesion marked by the arrows are simply illustrated in FIG. 1B such that the force generated therebetween can be recognized intuitively. Since the adherence property of the high adherence region 71 is changed to be increased, the high adherence region 71 is well-adhered to the pattern 75b so that the great adhesion 77b is generated. On the other hand, since the properties of the low adherence regions 72a and 72b are not changed, the low adherence regions are not well-adhered to the patterns 75a and 75c so that poor adhesion 77a and 77c is generated.

Figure 1C:
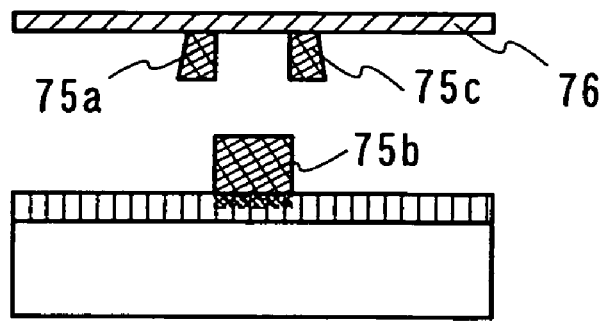

A substance 76 having a bonding surface is attached to the pattern 75 so as to peel off and remove the patterns 75a and 75b from the substrate (see FIG. 1C). The adhesion 77b between the pattern 75b and the high adherence region 71 is higher than the adhesion between the pattern 75b and the substance 76 having the bonding surface, and hence, the pattern 75b remains over the substrate 50. On the other hand, the adhesion 77a and 77c between the patterns 75a and 75c and the low adherence regions 72a and 72b are lower than the adhesion between the patterns 75a and 75c and the substance 76 having the bonding surface, and therefore, the patterns 75a and 75c are attached to the bonding surface of the substance 76 and removed from the substrate 50. Accordingly, it is necessary that the force used for removing the patterns as unnecessary portions be greater than the adhesion between the patterns to be removed and the regions on which the patterns are formed and smaller than the adhesion between the remaining pattern and the subject region on which the pattern remains. Under this condition, the unnecessary portions can be selectively removed so as to obtain a pattern having a predetermined shape.

In this embodiment mode, a conductive layer is formed as the pattern 75 by using a composition containing a conductive material. The thus-obtained conductive layer can be formed precisely with good controllability according to the above-mentioned process, thereby manufacturing a wiring substrate that is patterned precisely. When using a composition containing an insulating material, an insulating layer such as an interlayer insulating layer that is patterned precisely can be formed similarly. Alternatively, when using such an insulating layer as a mask layer, it can be used in patterning as a microscopic mask.

Removing means used in the present invention will be explained with reference to FIG. 4. The removing means 91 comprises a roller and a bonding surface 92 attached with an adhesive (agglutinant) having a removal function, which is in contact with a substrate. The bonding surface 92 may be formed by directly attaching an adhesive to the surface of the removing means 91. Alternatively, a flexible material such as a paper, a film and a tape attached with an adhesive may be installed in the removing means 91 as the bonding surface. When the removing means 91 has a bonding surface formed using a medium such as a paper, a film and a tape, the whole used medium such as a paper having a bonding surface that losing the removal function can be replaced by a new medium having a bonding surface with the removal function. Therefore, the bonding surface formed using the medium is convenient. Of course, the bonding surface of the roller can be used repeatedly by washing and cleaning the bonding surface. The adhesive is not particularly limited so long as it has suitable adhesion. For example, a solvent-based adhesive, a water-based adhesive and a hot-melt-based adhesive may be employed. As a material for the adhesive, rubber, acrylic mainly containing acrylic polymer such as acrylic ester and methacrylic acid ester, silicon, and the like can be used. A substance having a bonding surface attached with an adhesive is not particularly limited, and it may be made from either a conductive material or an insulating material. By rotating the removing means 91 in directions of arrows 96, the removing means scans over the substrate. At this moment, the substrate 90 may also scan in directions of arrows 97. The substrate and the removing means may be controlled relatively to scan each other. Also, the removing means 91 can scan in directions denoted by arrows 98 so that the intensity and direction of the pressure can be controlled in bonding the roller to a pattern 93. For instance, there is a case in which after peeling off an unnecessary portion from the pattern, the shape of the pattern is sometimes varied depending on a peeling method with respect to an unnecessary portion, e.g., the direction of peeling off the unnecessary portion. The peeling method and the removing means may be arbitrarily selected according to a material and a size of the pattern. According to this removing method, patterns formed by using the same material through the same process can be formed to have different shapes.

Figure 35A:
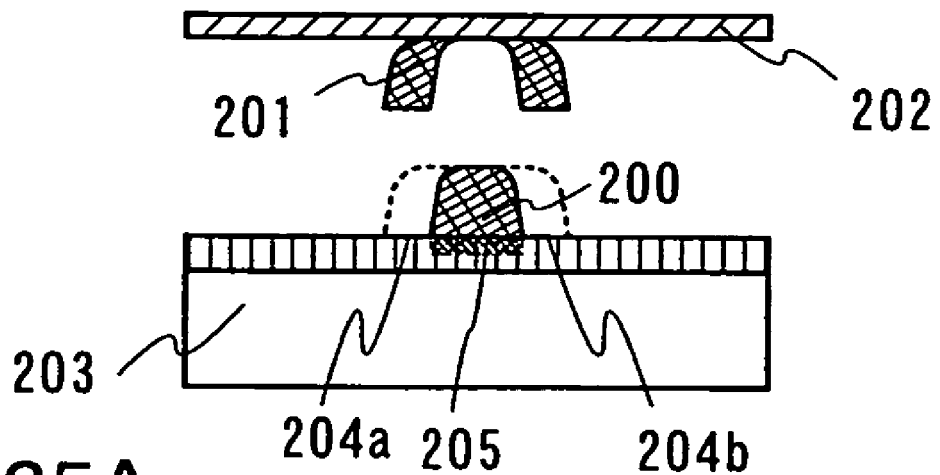
FIGS. 35A to 35C are cross sectional views explaining the present invention.

Examples of the shape of the pattern will be described with reference to FIGS. 35A to 35C. As shown in FIG. 35A, a high adherence region 205 in which a property thereof with respect to a pattern 200 is changed and low adherence regions 204a and 204b that are non-subject regions in which a property thereof is not changed are formed on a substrate 203. A pattern 201 is attached to a bonding surface of a substance 202 and then peeled off from the substrate 203 by utilizing the adhesion of the substance 202 having the bonding surface. The pattern 200 remaining over the substrate 203 thus has a tapered shape as shown in FIG. 35A.

Figure 35B:
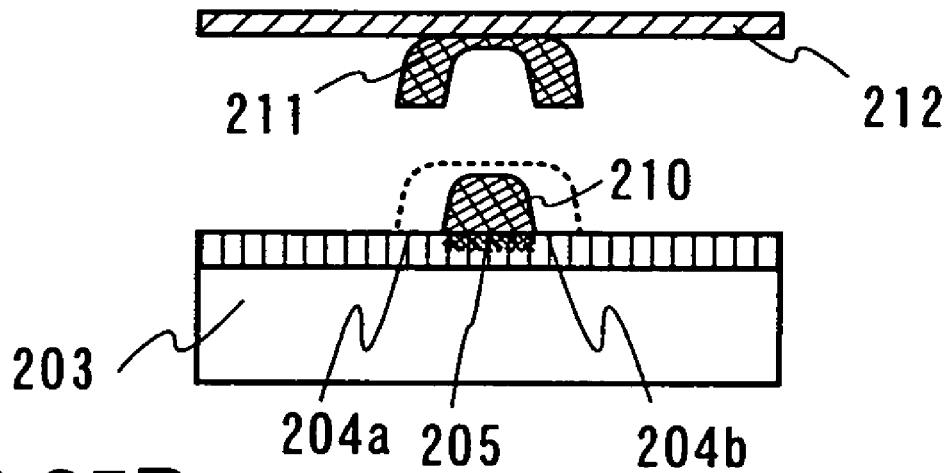

As show in FIG. 35B, a pattern 211 is attached to a bonding surface of a substance 212 and then peeled off from the substrate 203 by utilizing the adhesion of the substance 212 having the bonding surface. The pattern 211 removed from the substrate is a part of a pattern formed on the low adherence regions 204a, 204b and the high adherence region 205. A pattern 210 remaining over the substrate 203 becomes to have a lesser thickness as compared with the original pattern as shown in FIG. 35B.

Figure 35C:
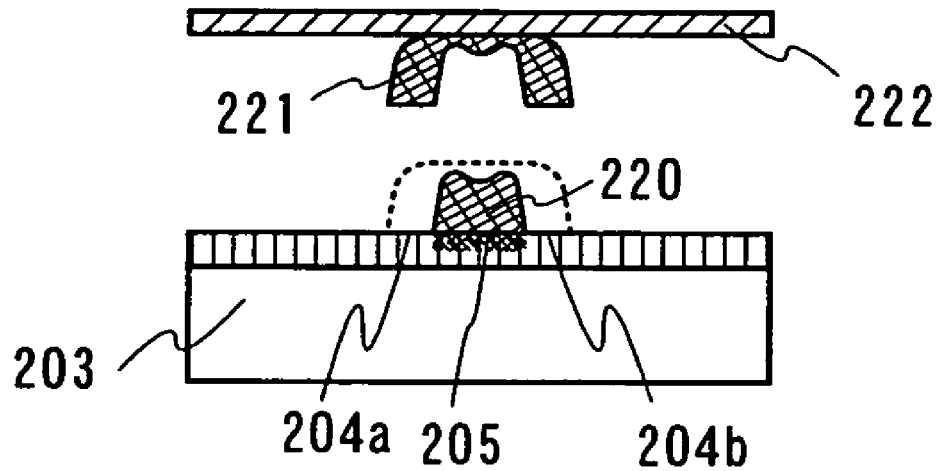

As shown in FIG. 35C, a pattern 221 is attached to a bonding surface of a substance 222 and then peeled off from the substrate 203 by utilizing the adhesion of the substance 222 having the bonding surface. The pattern 221 removed from the substrate is a part of the pattern formed on the low adherence regions 204a, 204b and the high adherence region 205. A pattern 220 remaining on the substrate 203 becomes to have a depression like a dent as depicted in FIG. 35C. As set forth above, the shape of the pattern to be obtained can be varied depending on the adhesion and the peeling force of the substance that is used as removing means and a peeling method (e.g., a direction and a speed).

Figure 4:
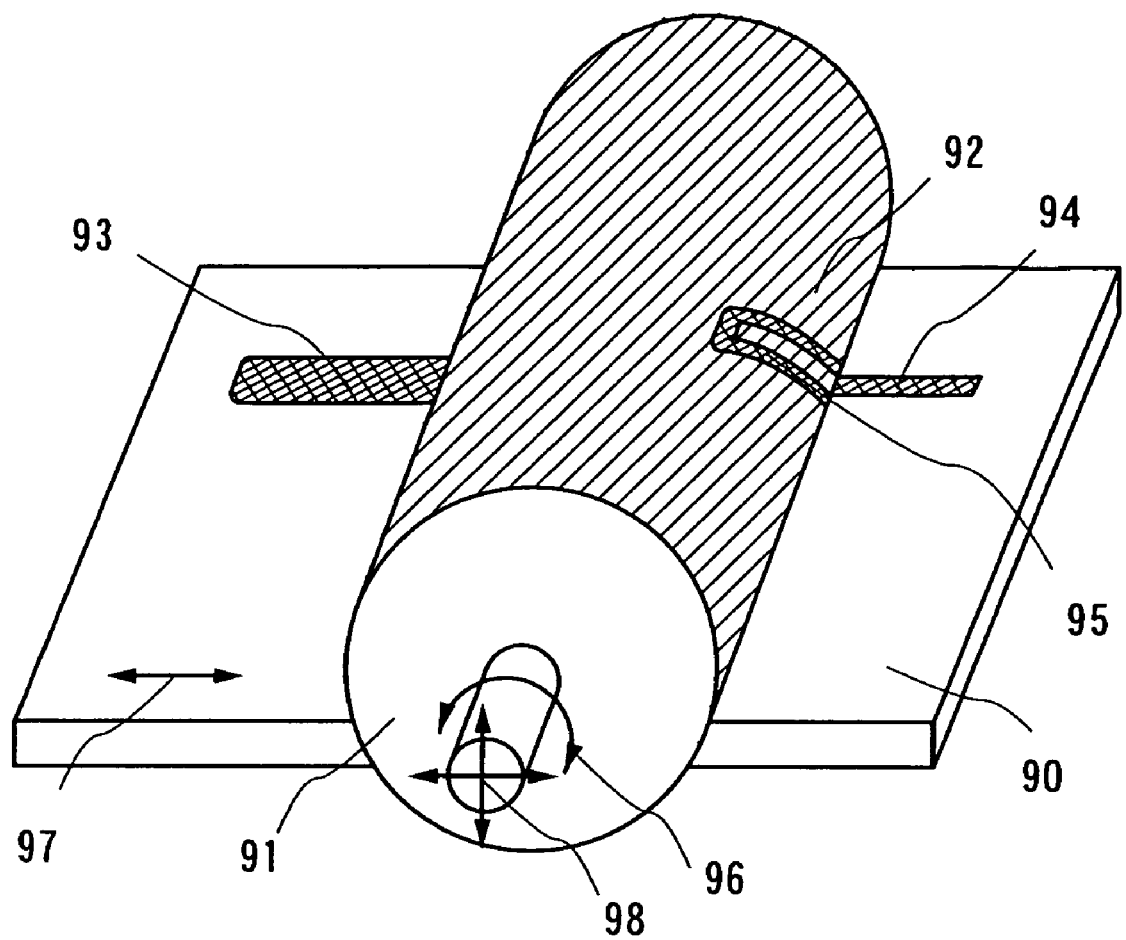
FIG. 4 is a diagram explaining a method for manufacturing a display device according to the invention.

In FIG. 4, an adherence property of a subject region on which a pattern will be formed is increased as compared to a peripheral non-subject region over the substrate 90. A pattern 95 formed on a low adherence region, where is a portion to be removed, of a pattern 93 formed in the subject region and the vicinity thereof is attached to the bonding surface 92 by the removing means 91, thereby peeling off and removing the pattern 95 from the substrate. Therefore, only a pattern 94 remaining on the high adherence region is obtained as a predetermined pattern over the substrate 90. Although the removing means having the roller is shown in FIG. 4, the present invention is not limited thereto. Sheet-like removing means may be attached only to an unnecessary portion to be removed. Alternatively, the bonding surface of the removing means may be partly attached only to the region of the unnecessary portion to be removed. Additionally, the removing step may be repeated several times.

The pattern formed on the low adherence region is mechanically removed by using the substance having the bonding surface in this embodiment mode. However, the pattern formed in the low adherence region may be removed by aspiration, or removed by selectively blowing off a portion to be removed using an air blower, an air gun and the like, in addition to the peeling treatment using the above-described adhesion. In addition, the portion to be removed may be applied with a physical impact or removed in combination of the above-mentioned removing methods. Since an unnecessary portion is mechanically removed by using physical force, a contaminated material such as waste fluid that is caused in a chemical treatment is not caused. Hence, any countermeasures of adding a step or installing another device for a waste fluid treatment and the like in consideration of the environment may not be carried out. Consequently, the process is simplified and the cost is reduced. As shown in this embodiment mode, a pattern patterned into a predetermined shape can accurately be obtained with good controllability by performing a convenient step of peeling off an unnecessary portion using a substance with a bonding surface.

When forming a microscopic pattern such as an electrode layer, even if a droplet for the electrode layer is discharged in a part of a region other than a region on which the pattern will be formed through a discharge port with a little bit large size, the droplet discharged on an unnecessary portion can be removed according to the present invention so that a microscopic linear pattern can be obtained. Additionally, the amount of the droplet is not necessary to be controlled in accordance with the wiring width, the thickness of the wiring can be controlled. When a property of a surface of a substance is changed by irradiating laser light according to this embodiment mode, a microscopic wiring, electrode or the like can be formed with good controllability since the laser light allows to process it precisely. Also, loss of materials can be prevented by employing the droplet discharging method as compared with a case where a droplet is applied on an entire surface of a substrate by spin coating or the like, thereby reducing the cost.

The composition with low adherence property is formed as the pretreatment in this embodiment mode. A very thin film is required as the composition with low adherence property depending on a pattern condition, and therefore, the composition with low adherence property may not have a film form. Further, only a surface of a composition contacting to the pattern may be changed to have low adherence property and the whole composition not necessary to have the same adherence property in the thickness direction.

After forming the pattern into a predetermined shape, the composition which adherence property has been changed may be left over the substrate. Alternatively, an unnecessary portion of the composition which low adherence property has been changed may be removed after forming the pattern. The unnecessary portion may be removed by ashing using oxygen or the like or etching. The pattern can be used as a mask.

As an example of a composition of a solution for forming a low adherence region, a silane coupling agent denoted by a chemical formula: $R_n$—Si—$X_{(4-n)}$ (n=1, 2, 3) is used. In this chemical formula, R represents a substance containing a relatively inactive group such as alkyl group. X represents a hydrolysate group such as halogen, a methoxy group, an ethoxy group and an acetoxy group that is bondable with a hydroxyl group or an adsorbed water of a substrate surface due to condensation.

The adherence property can be further reduced by using a silane coupling agent containing fluorine (such as fluoroalkylsilane (FAS)) that has a fluoroalkyl group as R as a representative example of the silane coupling agent. R in the FAS has a structure expressed by $(CF_3)(CF_2)_x(CH_2)_y$ (x is an integer in the range of 0 to 10, and y is an integer in the range of 0 to 4). When a plurality of Rs or Xs are bonded to Si, the Rs or Xs may be the same or different from one another. Typically, fluoroalkylsilane such as, heptadecafluoro tetrahydrodecyl triethoxysilane, heptadecafluoro tetrahydrodecyl trichlorosilane, tridecafluoro tetrahydrooctyl trichlorosilane, and trifluoropropyl trimethoxysilane, can be cited as the FAS.

As a solvent for forming a low adherence region, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene, and squalane; a solvent for forming a low adherence region such as tetrahydrofran; and the like can be used.

As an example of a composition of a solution for forming a low adherence region, a substance having fluorocarbon chain (e.g., fluorocarbon resin) can be used. As the fluorocarbon resin, the followings can be used: polytetrafluoroethylene (PTFE); perfluoroalkoxyalkane (PFA); perfluoroethylene propen copolymer (PFEP); ethylene-tetrafluoroethylene copolymer (ETFE); polyvinylidene fluoride (PVDF); polychlorotrifluoro ethylene (PCTFE); ethylene-chlorotrifluoroethylene copolymer (ECTFE); polytetrafluoroethylene-perfluorodioxole copolymer (TFE/PDD); polyvinyl fluoride (PVF); and the like.

Further, an organic material having no low adherence property (i.e., having a high adherence property) may be used and treated by $CF_4$ plasma etc. to form a low adherence region. As the organic material, for instance, a material of a solvent such as $H_2O$ mixed with a water-soluble resin such as polyvinyl alcohol (PVA) can be used. In addition, a combination of PVA and another water-soluble resin can be used. It is possible to use an organic (resin) material (e.g., polyimide, and acrylic) or a siloxane resin. Further, the siloxane resin corresponds to a resin containing Si—O—Si bonds. The siloxane has skeleton formed by the bond of silicon (Si) and oxygen (O). An organic group containing at least hydrogen (e.g., alkyl group or aromatic hydrocarbon) is used as the substituent of the siloxane. A fluoro group may be used as the substituent. In addition, the organic group containing at least hydrogen and the fluoro group may be used as the substituent. Meanwhile, in the case of a material that forms a low adherence region, the adherence property can be further reduced by performing plasma processing etc.

As a light-absorbing material, an organic material, an inorganic material, a substance containing both an organic material and an inorganic material and the like can be used. A material having an absorption band corresponding to a wavelength of laser light to be used may be selected from the above-mentioned materials. Also, a conductive material such as metal or an insulating material such as an organic resin may be used. As for the inorganic material, iron, gold, copper, silicon, germanium and the like can be used. As for the organic material, plastic such as polyimide and acrylic, a pigment and the like can be used. For example, as a pigment corresponding to a 532 nm laser wavelength, rhodamine B, eosin Y, methyl orange, rose bengal and the like can be used. As a pigment corresponding to a 405 nm laser wavelength, coumarin (such as coumarin 6H, coumarin 102, coumarin 152 and coumarin 153) can be used. In addition, carbon black, a black resin of a colorant and the like can be employed as a pigment.

In order to improve the processing efficiency by light irradiation, a photocatalytic substance may be formed in contact with a substance to be processed. Since the photocatalytic substance has a photocatalytic function, it is activated by being irradiated with light so that the efficiency of changing a property can be improved by its energy.

Titanium oxide (TiOx), strontium titanate ($SrTiO_3$), cadmium selenide (CdSe), potassium tantalate ($KTaO_3$), cadmium sulfide (CdS), zirconium oxide ($ZrO_2$), niobium oxide ($Nb_2O_5$), zinc oxide (ZnO), iron oxide ($Fe_2O_3$), tungsten oxide ($WO_3$), and the like are preferably used as the photocatalytic substance. The photocatalytic substance may be irradiated with light of ultraviolet region (having the wavelength of 400 nm or less, preferably, 380 nm or less), which allows to generate photocatalytic activity.

The photocatalytic substance can be formed by dip coating of the sol-gel technique, spin coating, the droplet discharging method, ion plating, ion beam, CVD, sputtering, RF magnetron sputtering, plasma spray coating, plasma spraying, or anodization. A photocatalytic substance may not have a continuity like a film. For instance, a photocatalytic substance including an oxide semiconductor that contains a plurality of metals can be formed by mixing and dissolving salt that is a constituent element. In the case where a photocatalytic substance is formed by coating such as dip coating and spin coating, a photocatalytic substance may be baked or dried to eliminate a solvent. Concretely, the photocatalytic substance may be heated at a certain temperature (e.g., 300° C. or more). Preferably, this heating treatment is performed under an atmosphere including oxygen.

By carrying out the pretreatment for increasing the adherence property of the subject region, on which the pattern will be formed, with respect to the pattern as compared with the peripheral region thereof, the pattern can be formed to have a predetermined shape. Also, a thin line pattern can be freely designed by a microscopic processing using laser light. According to the present invention, a pattern with a predetermined shape can be formed with good controllability. Additionally, loss of materials can be suppressed, thereby reducing the cost. As a consequence, a high performance, highly reliable display device can be manufactured with high yield.

Embodiment Mode 2

Another embodiment mode of the invention will be described with reference to FIGS. 5A to 5C, FIGS. 6A to 6C, FIGS. 7A to 7C, FIGS. 8A to 8C, FIGS. 9A to 9C, FIGS. 10A to 10C, FIGS. 11A to 11C, FIGS. 12A and 12B, FIGS. 15A and 15B and FIGS. 33A to 33C. Specifically, a method for manufacturing a display device having a channel-etched thin film transistor according to the present invention will be described. FIGS. 5A, 6A, 7A, 8A, 9A, 10A and 1A are top views of a pixel portion of the display device. FIGS. 5B, 6B, 7B, 8B, 9B, 10B and 11B are cross sectional views along lines A-C thereof while FIGS. 5C, 6C, 7C, 8C, 9C, 10C and 11C are cross sectional views along lines B-D thereof.

Figure 33A:
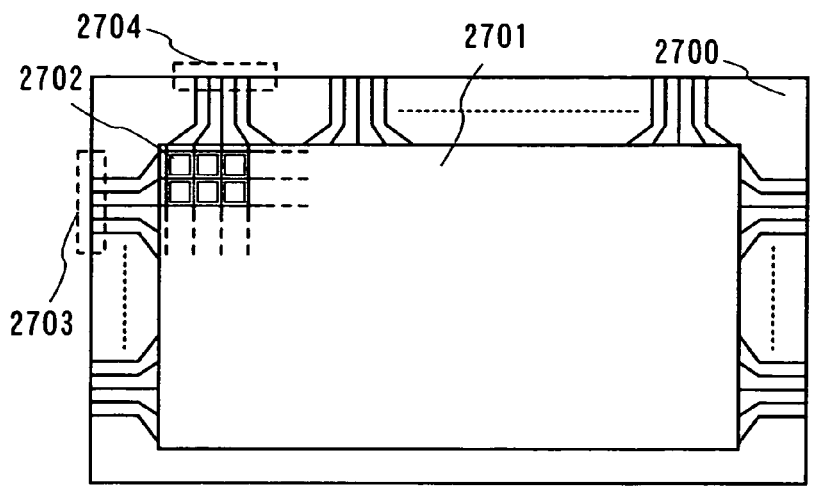
FIGS. 33A to 33C are top views of display devices according to the invention.

FIG. 33A is a top view showing a structure of a display panel according to the invention, wherein a pixel portion 2701 in which pixels 2702 are arranged in matrix form, a scanning line input terminal 2703, and a signal line input terminal 2704 are formed over a substrate 2700 with an insulated surface. The number of pixels may be determined in accordance with various standards. The number of pixels for XGA may be 1,024×768×3 (RGB), and that for UXGA may be 1,600×1,200×3 (RGB). In the case of forming a display panel corresponding to a full-specification high-definition, the number of pixels may be 1,920×1,080×3 (RGB).

The pixels 2702 are arranged in matrix form by intersecting scanning lines extending from the scanning line input terminal 2703 with signal lines extending from the signal line input terminal 2704. Each pixel 2702 includes a switching element and a pixel electrode connecting to the switching element. A TFT can be cited as a representative example of the switching element. Connecting a gate electrode side of the TFT to the scanning line and connecting a source or drain side thereof to the signal line enables independent control of respective pixels by a signal input from an external portion.

A TFT comprises a semiconductor layer, a gate insulating layer and a gate electrode layer as its main constituents. The TFT further includes a wiring layer connecting to source and drain regions formed in the semiconductor layer. A top gate TFT in which a semiconductor layer, a gate insulating layer and a gate electrode layer are sequentially provided in this order over a substrate, a bottom gate TFT in which a gate electrode layer, a gate insulating layer and a semiconductor layer are sequentially provided over a substrate or the like are typically known as a TFT structure. Any of structures may be employed in the invention.

Figure 15A:
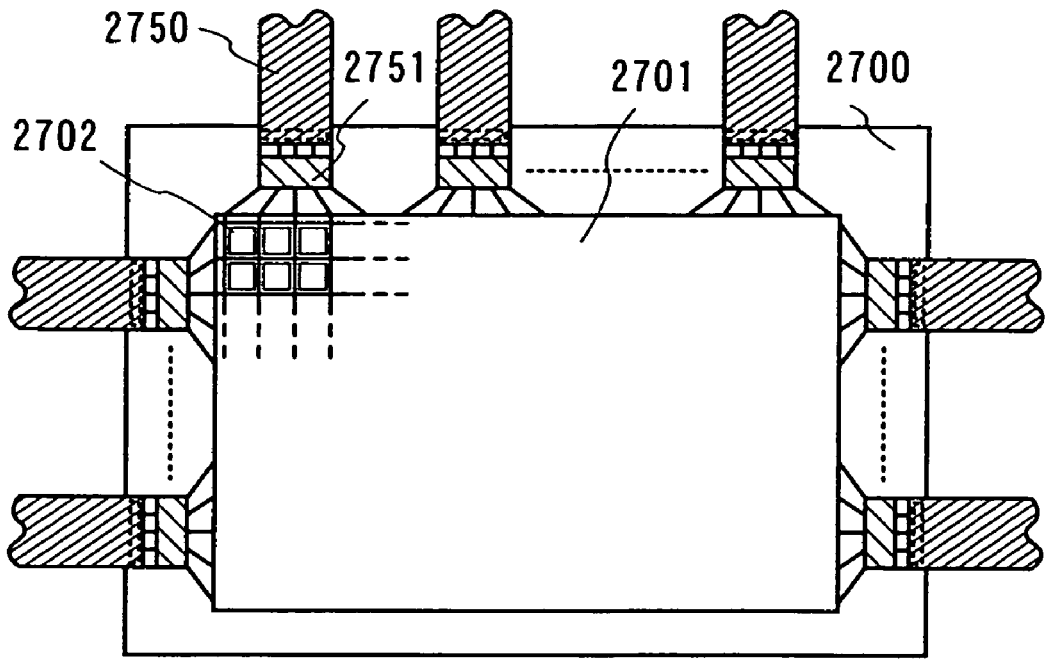
FIGS. 15A and 15B are top views of display devices according to the invention.
Figure 15B:
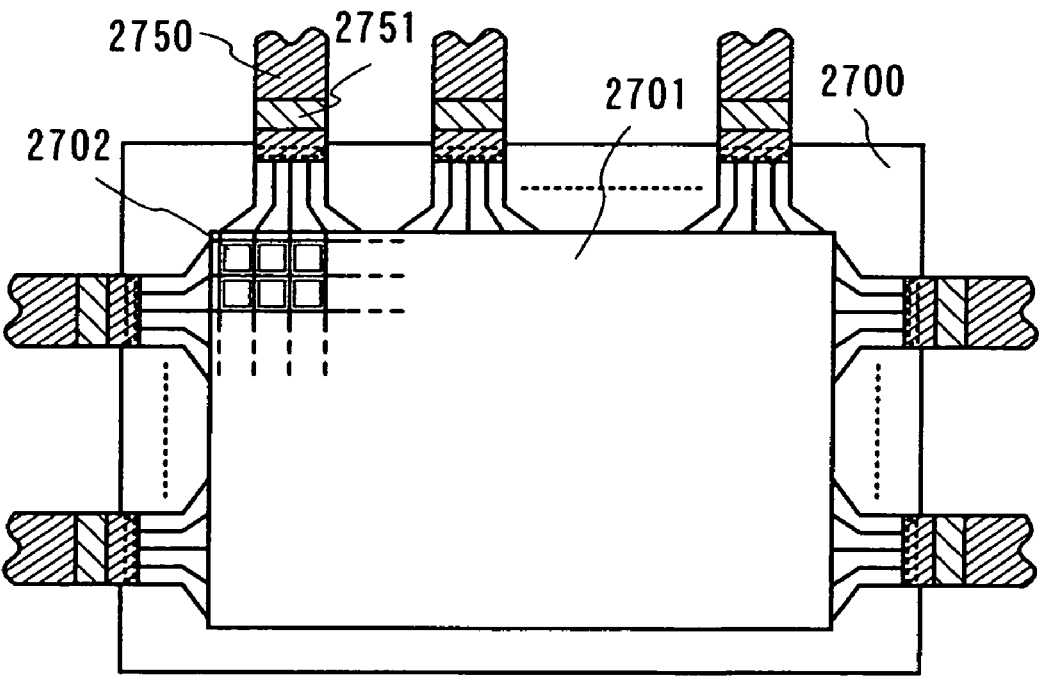

FIG. 33A shows a structure of a display panel that controls a signal being input into the scanning lines and the signal lines by an external driver circuit. As shown in FIG. 15A, driver ICs 2751 may be mounted over a substrate 2700 by the COG (Chip on Glass) technology. As shown in FIG. 15B, the TAB (tape automated bonding) technology may be used as another mounting mode. The driver ICs may be formed on a single crystal semiconductor substrate or over a glass substrate by using a TFT. In FIGS. 15A and 15B, the driver ICs 7251 are connected to FPCs (flexible printed circuits) 2750, respectively.

Figure 33B:
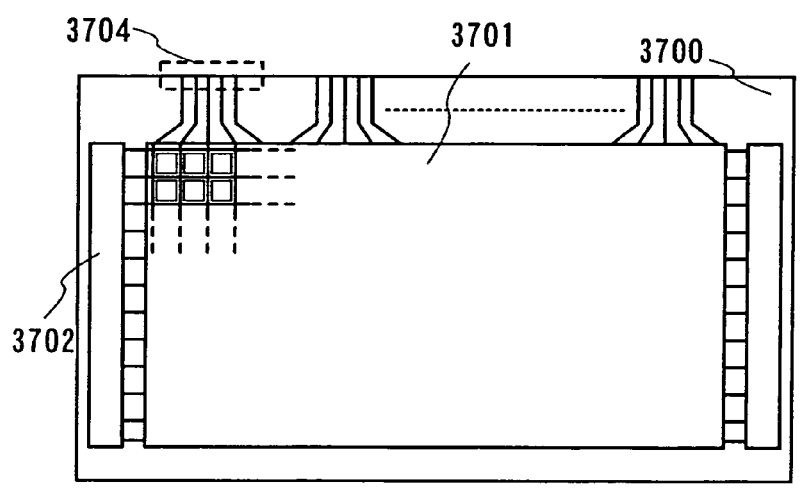
Figure 33C:
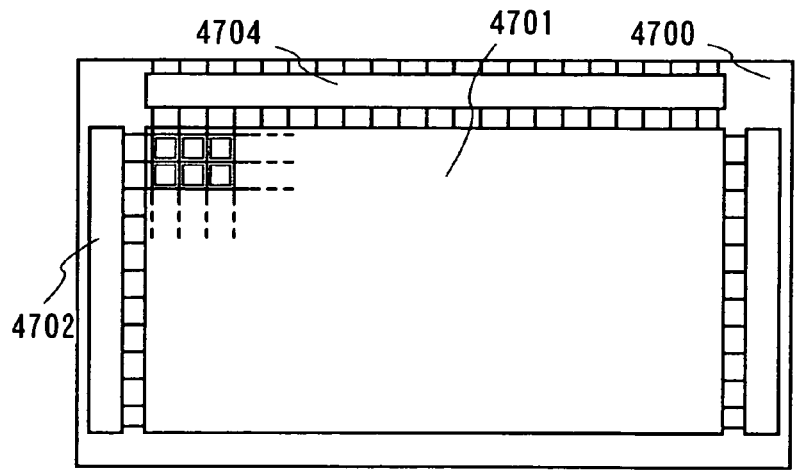

In the case where a TFT that is formed in a pixel is made from an SAS, a scanning line driver circuit 3702 can be integrated over a substrate 3700 as shown in FIG. 33B. In FIG. 33B, a pixel portion 3701 is controlled by an external driver circuit connecting to a signal line input terminal 3704 as well as FIG. 33A. When a TFT formed in each pixel is made from a polycrystalline (microcrystalline) semiconductor, a single crystalline semiconductor or the like having high mobility, a pixel portion 4701, a scanning line driver circuit 4702 and a signal line driver circuit 4704 can be provided over a substrate 4700 as shown in FIG. 33C.

Figure 5A:
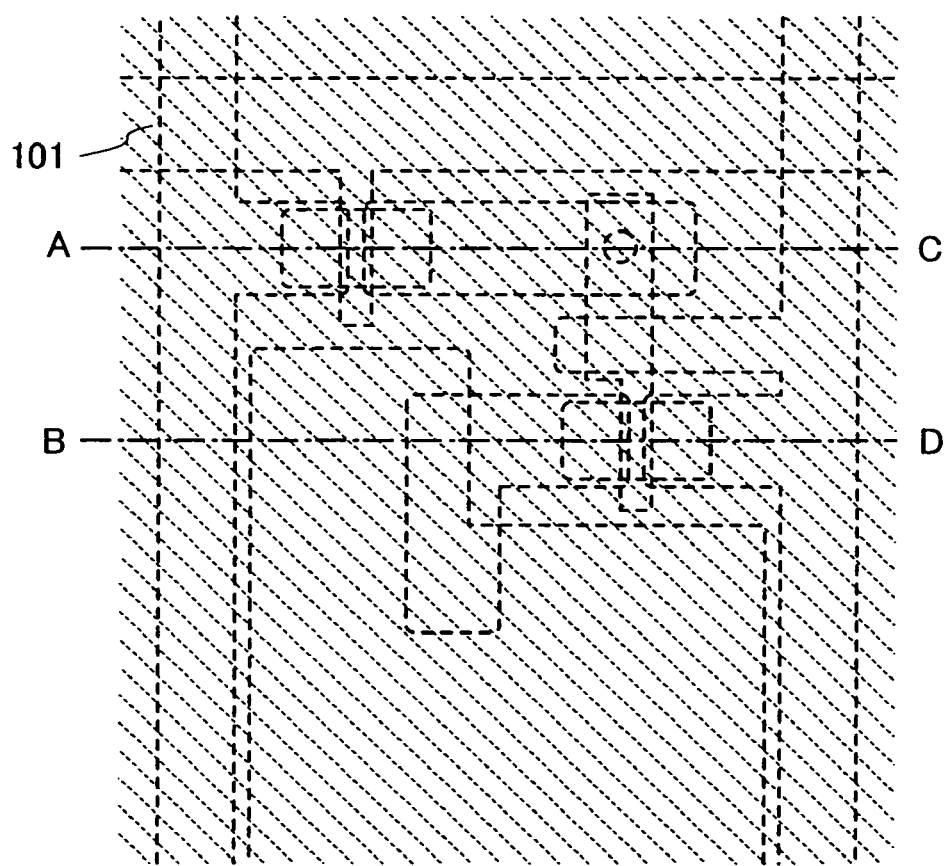
FIG. 5A is a top view and FIGS. 5B and 5C are cross sectional views explaining a method for manufacturing a display device according to the invention.
Figure 5B:
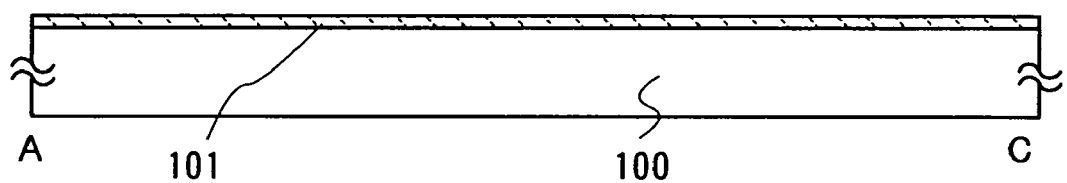

As a substrate 100 of FIG. 5B, a glass substrate such as a barium borosilicate glass and an alumino borosilicate glass, a quartz substrate, a silicon substrate, a metal substrate, a stainless substrate, a heat-resistant plastic substrate that can withstand a processing temperature of the manufacturing process, and the like can be used. The surface of the substrate 100 may be polished by the CMP method or the like so as to planarize the surface thereof. An insulating layer may be formed on the substrate 100. The insulating layer is made from an oxide material containing silicon or a nitride material containing silicon by a known method such as CVD, plasma CVD, sputtering and spin coating so as to have a single layer or a lamination layer. This insulating layer may not necessarily be formed. When the insulating layer is formed, it can prevent contaminants from penetrating through the substrate 100. In the case of forming a base film for inhibiting the contaminations through a glass substrate, plural regions having different adherence properties (i.e., a high adherence region and a low adherence region) are formed thereon.

A property of subject regions on which patterns will be formed is relatively changed compared to peripheral regions as a pretreatment. In this embodiment mode, a substance with low adherence property is formed over the substrate and the adherence property of the substance is selectively changed by irradiating light to form high adherence regions and low adherence regions. The difference in the adherence properties indicates difference in adhesion (an adhesion of the patterns) acting between the patterns and the regions on which the patterns are formed. To improve the processing efficiency of light irradiation, a light-absorbing material having an absorption band in a wavelength of laser light to be irradiated may be added (mixed) in the substance with low adherence property.

Figure 5C:
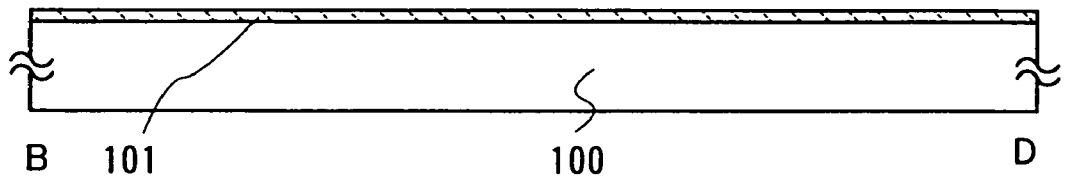
Figure 6A:
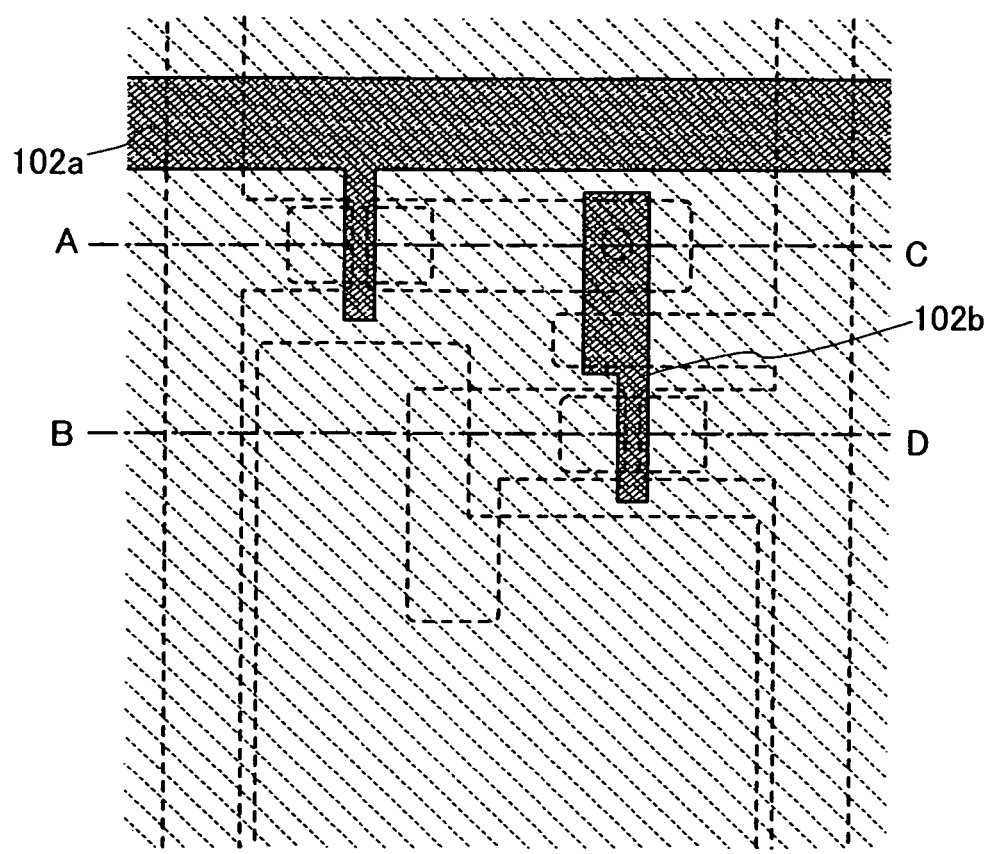
FIG. 6A is a top view and FIGS. 6B and 6C are cross sectional views explaining a method for manufacturing a display device according to the invention.
Figure 6B:
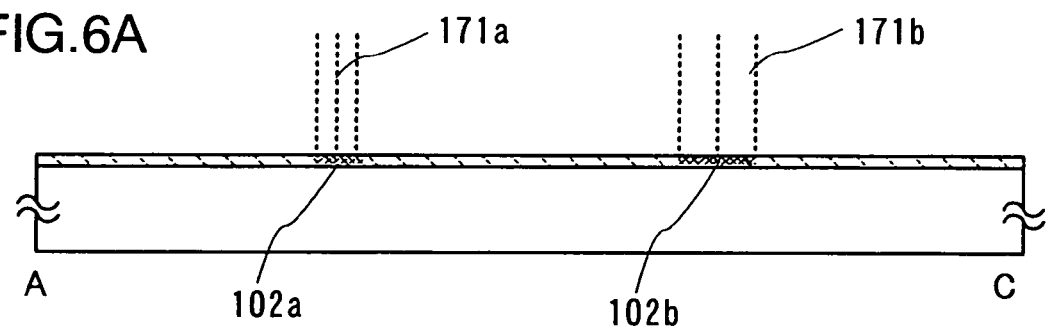
Figure 6C:
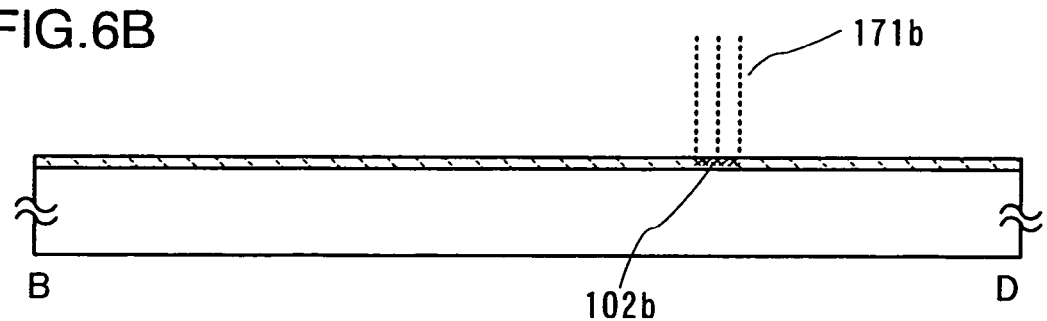

A composition 101 containing a substance with low adherence property is formed over the substrate 100 (see FIGS. 5A to 5C).

As an example of a composition for a solution for forming a low adherence region, a silane coupling agent denoted by a chemical formula: $R_n$—Si—$X_{(4-n)}$ (n=1, 2, 3) is used. In the chemical formula, R represents a substance containing a relatively inactive group such as alkyl group. X represents a hydrolysate group such as halogen, a methoxy group, an ethoxy group and an acetoxy group that is bondable with a hydroxyl group or an adsorbed water of a matrix surface due to condensation.

The adherence property can be further reduced by using a silane coupling agent containing fluorine (such as fluoroalkylsilane (hereinafter, FAS)) that has a fluoroalkyl group as R as a representative example of the silane coupling agent. R in the FAS has a structure expressed by $(CF_3)(CF_2)_x(CH_2)_y$ (x is an integer in the range of 0 to 10, and y is an integer in the range of 0 to 4). When a plurality of Rs or Xs are bound to Si, the Rs or Xs may be same or different from one another. Typically, fluoroalkylsilane such as: heptadecafluoro tetrahydrododecyl triethoxysilane; heptadecafluoro tetrahydrodecyl trichlorosilane; tridecafluoro tetrahydrooctyl trichlorosilane; and trifluoropropyl trimethoxysilane can be cited as the FAS.

As a solvent of a solution for forming the low adherence region, a solvent containing hydrocarbon such as n-pentane, n-hexane, n-heptane, n-octane, n-decane, dicyclopentane, benzene, toluene, xylene, durene, indene, tetrahydronaphthalene, decahydronaphthalene and squalane; a solvent for forming a low adherence surface such as tetrahydrofran; and the like can be used.

As an example of the composition of the solution for forming the low adherence region, a material having fluorocarbon chain (e.g., fluorocarbon resin) can be used. As the fluorocarbon resin, the followings can be used: polytetrafluoroethylene (PTFE); perfluoroalkoxyalkane (PFA); perfluoroethylene propen copolymer (PFEP); ethylene-tetrafluoroethylene copolymer (ETFE); polyvinylidene fluoride (PVDF); polychlorotrifluoro ethylene (PCTFE); ethylene-chlorotrifluoroethylene copolymer (ECTFE); polytetrafluoroethylene-perfluorodioxole copolymer (TFE/PDD); polyvinyl fluoride (PVF); and the like.

Further, an organic material having no low adherence property (i.e., having a high adherence property) may be used and treated by $CF_4$ plasma etc. to form a low adherence region. For instance, a material in which a solvent such as $H_2O$ is mixed with a water-soluble resin such as polyvinyl alcohol (PVA) can be used. In addition, a combination of PVA and another water-soluble resin can be used. It is possible to use an organic (resin) material (e.g., polyimide and acrylic) or a siloxane resin. Further, the siloxane resin corresponds to a resin containing Si—O—Si bonds. Meanwhile, in the case of a material having low adherence property, the adherence property can be further reduced by performing plasma processing or the like.

In this embodiment mode, FAS is used as the substance with low adherence property. The adherence property of this substance is low with respect to a gate electrode layer that will be formed later. The FAS is applied over an entire surface of the substrate in this embodiment mode. Alternatively, the FAS may selectively be formed in the subject regions and the vicinity thereof to be formed with the gate electrode layers by the droplet discharging method and the like. In this case, since a waste material can be reduced, the utilization efficiency of a material can be improved.

Next, laser light 171a and laser light 171b are irradiated to the regions to be formed with the gate electrode layers by using a laser irradiation device to decompose the substance with low adherence property in the region irradiated with the laser light, thereby increasing the adherence property of the substance. The present embodiment mode employs laser light that can perform a microscopic processing as light for processing the substance with low adherence property. Since the FAS is used as the substance with low adherence property in this embodiment mode, light having a wavelength of 200 nm or less by which the FAS is decomposed is irradiated. As described above, however, when adding a substance with a function of increasing light processing efficiency such as a light-absorbing material and a photocatalytic substance into the substance with low adherence property, the type of light to be used may be arbitrarily selected in accordance with an absorbing wavelength of a substance to be added. By irradiating the laser light, the irradiated regions become to have the higher adherence properties compared to the peripheral regions so that a high adherence region 102a and a high adherence region 102b are formed (see FIGS. 6B and 6C).

When adding the light-absorbing material or the photocatalytic substance in the composition with low adherence property, after forming the regions having different adherence properties, the light-absorbing material or the photocatalytic substance may be washed with alcohol, water or the like to be eliminated. In order to remove only the light-absorbing material or the photocatalytic substance, a solvent having high selectivity is necessary to be selected such that the substance with low adherence property is not dissolved. In the case of a dual emission type or a bottom emission type light emitting display device in which light is extracted through the substrate 100 or a transmission liquid crystal display device, since the light extraction efficiency is possibly to be reduced, the light-absorbing material is preferably eliminated. Meanwhile, the light-absorbing material is not necessarily removed in the case of a wiring substrate, a top emission light emitting display device, a reflective liquid crystal display device, or the like.

Figure 7A:
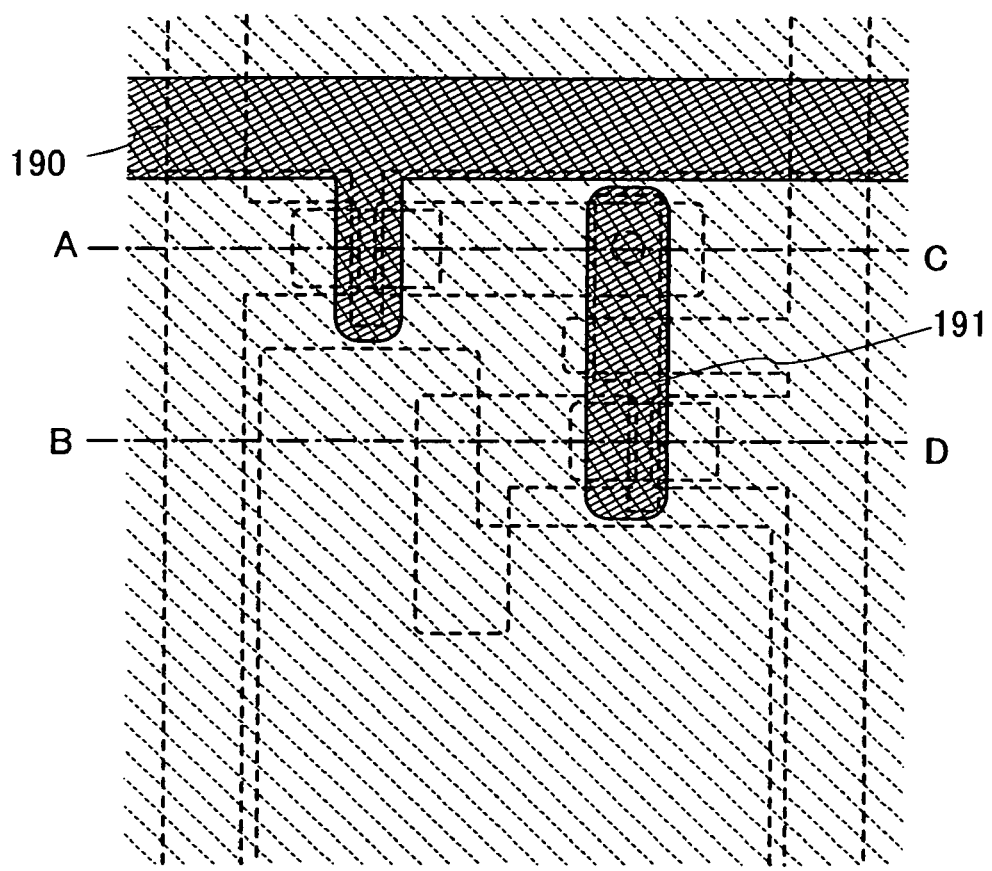
FIG. 7A is a top view and FIGS. 7B and 7C are cross sectional views explaining a method for manufacturing a display device according to the invention.
Figure 7B:
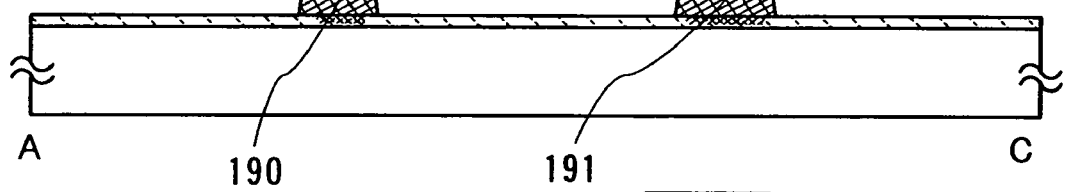
Figure 7C:
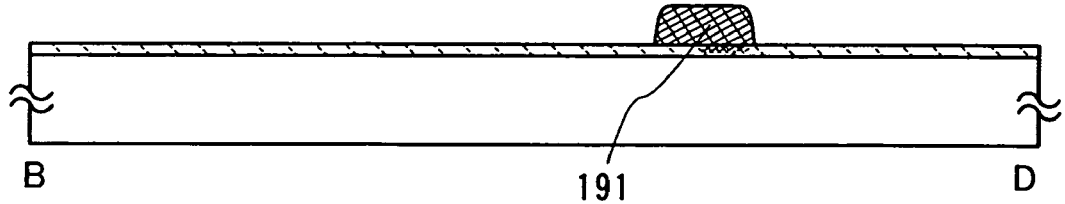
Figure 8A:
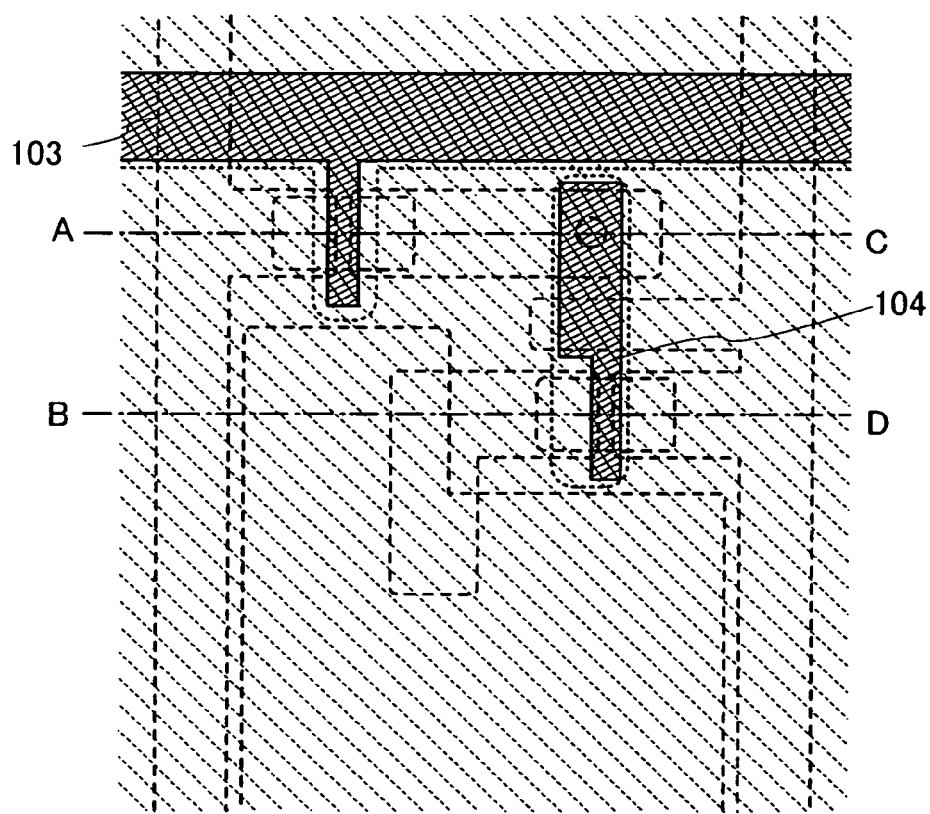
FIG. 8A is a top view and FIGS. 8B and 8C are cross sectional views explaining a method for manufacturing a display device according to the invention.
Figure 8B:
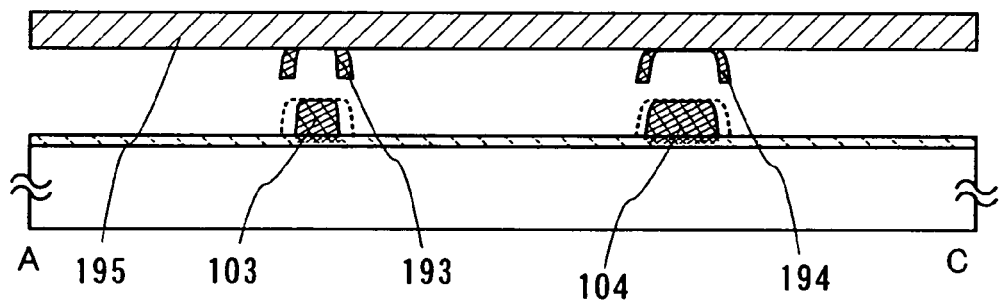
Figure 8C:
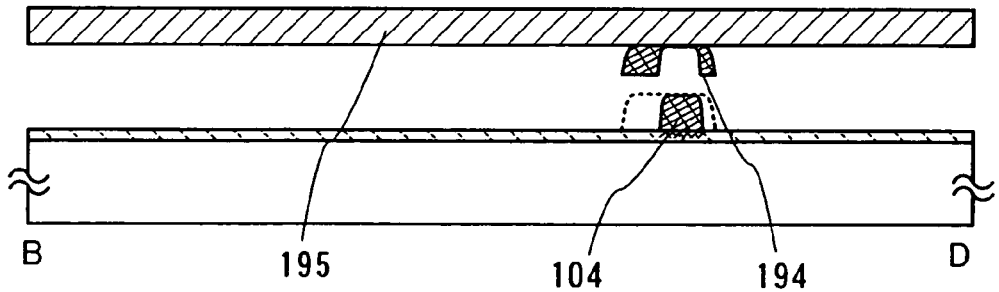

A composition containing a conductive material is discharged in the high adherence regions 102a and 102b, where are the subject regions in which the gate electrode layers will be formed, and the vicinity thereof, by droplet discharging devices 180a and 180b to form conductive layers 190 and 191 (see FIGS. 7B and 7C). Although the conductive layers 190 and 191 are also formed in a part of the non-subject regions of a design on which the gate electrode layers will not be formed, since the non-subject regions are low adherence regions, unnecessary portions of the conductive layers formed on the non-subject regions can be removed in a latter step. The predetermined line width and thickness can simultaneously be controlled, and therefore, a problem in which a predetermined thickness cannot be obtained and the like can be solved by controlling the amount of liquid for forming a thin line. When the size of a discharge portion of a nozzle through which a droplet is discharged is larger than the size of a predetermined pattern to be formed, or when a droplet is discharged in a large area to increase the throughput, a predetermined pattern can be formed according to the present invention.

An object 195 having a surface with adhesive property is attached to the conductive layers 190 and 191 such that the surface with adhesive property is adhered to the conductive layers. After the attachment, the substance 195 with the bonding surface is peeled off from the substrate 100 to remove the conductive layers 193 and 194 where are unnecessary portions formed on the low adherence regions from the conductive layers 190 and 191. Since the conductive layers 190 and 191, which are formed on the high adherence regions 102a and 102b having the adherence properties improved by light irradiation, are well-adhered to the subject regions over the substrate, these conductive layers are not peeled off by the substance 195 with the bonding surface and remain over the substrate 100. Therefore, gate electrode layers 103 and 104 that are patterned into predetermined shapes are formed (see FIGS. 8A to 8C). Further, the width of the microscopic gate electrode layers in a channel direction is preferably set to be 10 μm or less, more preferably, 5 μm or less.

When a property of a substance is changed by irradiating laser light according to this embodiment mode, since a microscopic processing can be performed by using the laser light, a microscopic wiring, electrode or the like can be formed with good controllability. In addition, the loss of materials can be prevented by using the droplet discharging method as compared with the case where a liquid is applied over an entire surface of a substrate by spin coating etc., thereby reducing the cost.

In addition, in order to increase the adherence property with respect to a pattern formed by the droplet discharging method, a substance of an organic material functioning as an adhesive or a base film such as titanium oxide may be formed as the pretreatment. In this case, regions having different adherence properties may be formed on this substance. Also, an organic (resin) material (e.g., polyimide and acrylic) or a siloxane resin may be used.

The conductive layers 190 and 191 are formed by droplet discharging means. This droplet discharging means generically represents means for discharging a droplet such as a nozzle comprising a discharge port for a composition and a head comprising one or plural nozzles. The diameter of a nozzle equipped with the droplet discharging means is set to be 0.02 to 100 μm (preferably, 30 μm or less). The amount of the droplet discharged through the nozzle is set to be 0.001 to 100 pl (preferably, 0.1 pl or more and 40 pl or less, more preferably, 10 pl or less). The discharged amount is increased in proportion to the size of the nozzle. The discharge port of the nozzle is preferably closer to a predetermined portion as much as possible. Preferably, the distance between the discharge port and the predetermined portion is set to be about 0.1 to 3 mm (more preferably, 1 mm or less).

As the composition discharged through the discharge port, a conductive material dissolved or dispersed in a solvent is used. As the conductive material, metal such as Ag, Au, Cu, Ni, Pt, Pd, Ir, Rh, W and Al, metallic sulfide such as Cd and Zn, oxide such as Fe, Ti, Si, Ge, Zr and Ba, a fine particle or a dispersant nanometer-size particle of silver halide or the like can be used. In addition, indium tin oxide (ITO) used as a transparent conductive film, ITSO including indium tin oxide and silicon oxide, organic indium, organic tin, zinc oxide, titanium nitride and the like can be used. A particle including a single element or plural kinds of elements can be used as the conductive material. Further, in consideration of a specific resistance value, a solvent in which any one of gold, silver and copper is dissolved or dispersed is preferably used as the composition discharged through the discharge port. More preferably, low-resistance silver or copper is used. When using silver or copper, a barrier film is additionally provided to prevent an impurity. As the barrier film, a silicon nitride film or nickel boron (NiB) can be employed.

Also, a particle having plural layers in which a conductive material is coated with another conductive material may be used. For example, a three-layered particle in which copper is coated with nickel boron (NiB) and the nickel boron is coated with silver, or the like may be used. As for the solvent, ester such as butyl acetate and ethyl acetate; alcohol such as isopropyl alcohol and ethanol; an organic solvent such as methyl ethyl ketone and acetone; and the like is used. The viscosity of the composition is preferably set to be 20 mPa·s (cp) or less in order to prevent dryness of the composition and discharge the composition fluently through the discharge port. The surface tension of the composition is preferably set to be 40 mN/m or less. The viscosity and the like of the composition may be adjusted properly according to a solvent to be used and an intended purpose. For example, the viscosity of a composition in which ITO, organic indium and organic tin are dissolved or dispersed in a solvent is preferably set to be 5 to 20 mPa·s; the viscosity of a composition in which silver is dissolved or dispersed in a solvent may be set to be 5 to 20 mPa·s; and the viscosity of a composition in which gold is dissolved or dispersed in a solvent may be set to be 5 to 20 mPa·s.

The conductive layers may be formed by laminating a plurality of conductive materials. Alternatively, the conductive layers may be formed using silver as a conductive material by the droplet discharging method and then the conductive layers may be coated with copper and the like. The plating may be performed by electroplating or chemical (electroless) plating. A surface of the substrate may be soaked in a container filled with a solution including a material for plating. Alternatively, the substrate may be fixed obliquely (or perpendicularly) and a solution including a material for plating flows on the surface of the substrate such that the surface thereof is coated with the solution. This case has an advantage of miniaturizing a processing device.

Although the diameter of a conductive particle depends on the diameter of each nozzle and a shape of a predetermined pattern, the size of the conductive particle is preferably as small as possible for the purpose of preventing a clogged nozzle and manufacturing a microscopic pattern. Preferably, the diameter of the particle is set to be 0.1 μm or less. The composition is formed by a known method such as electrolyzing, atomizing and wet reducing, and the particle size thereof is typically about 0.01 to 10 μm. However, in the case of using a gas evaporation method, each nanometer-size particle protected with a dispersing agent is microscopic and is about 7 nm in size. Further, when each surface of the nanometer-size particles is covered with a coating material, the nanometer particles among the solvent are not aggregated but are uniformly dispersed in the solvent at a room temperature, and show a property similar to that of liquid. Therefore, the coating material is preferably used.

The step of discharging the composition may be carried out under reduced pressure. The step of discharging the composition is preferably performed under reduced pressure since an oxide film and the like are not formed on the surfaces of the conductive layers. After discharging the composition to the substrate, one or both of a drying step and a baking step is/are performed. Each step of drying and baking is a step of a heat treatment. For example, the drying step is performed at a temperature of 100° C. for 3 minutes whereas the baking step is performed at temperatures of 200 to 350° C. for 15 to 60 minutes, and the purposes, temperatures, and time thereof are varied. The drying and baking steps are performed at a normal pressure or under reduced pressure by laser light irradiation, rapid thermal annealing, a heating furnace, and the like. Further, the timing of performing the heat treatment and numbers of the heat treatment are not particularly limited. The substrate may be heated in advance so as to carry out the steps for drying and baking favorably. At this time, the heating temperature depends on a material of the substrate and the like, but it is generally set to be 100 to 800° C. (preferably, 200 to 350° C.). According to this process, the nanometer-size particles are in contact with one another and fusing together and fusing bond are accelerated by hardening and shrinking resin in the periphery as well as volatilizing the solvent in the composition or removing the dispersing agent chemically.

A continuous wave or pulsed gas laser or solid state laser may be used for laser light irradiation, which is carried out in the drying or baking step. An excimer laser, a He—Cd laser, an Ar laser and the like are cited for the former gas laser, while lasers using crystals such as YAG, $YVO_4$ and $GdVO_4$ doped with Cr, Nd and the like are cited for the latter solid state laser. Preferably, the continuous wave laser is used in relation to the absorptance of laser light. Alternatively, a so-called hybrid laser irradiation method combining a pulsed oscillation and a continuous wave may be employed. Further, the heat treatment using laser light may be instantaneously performed for several microseconds to several tens seconds so as not to destroy the substrate 100 according to a heat resistant property of the substrate 100. Rapid thermal annealing (RTA) is performed by instantaneously heating the substrate for several microseconds to several minutes while rapidly raising the temperature with an infrared lamp, a halogen lamp, and the like that emits ultraviolet light through infrared light under an inert gas atmosphere. Since this treatment is performed instantaneously, only a thin film of a top surface is substantially heated so that underlying films are not adversely affected. That is, this heat treatment does not adversely affect a substrate having a low heat resistance property such as a plastic substrate.

After forming the gate electrode layers 103 and 104, the surfaces thereof may be planarized by pressing with pressure so as to increase the planarity. As the method for pressing the surfaces of the gate electrode layers, a roller or the like may scan on the surfaces thereof to level the unevenness, or the surfaces thereof may be pressed with a flat plate or the like. In pressing the surfaces, a heating step may be carried out. Also, the surfaces of the gate electrode layers may be softened or dissolved by using a solvent or the like and the unevenness may be removed by an air knife. Alternatively, the unevenness may be polished by CMP. This step can be arbitrarily applied in the case of causing unevenness due to the droplet discharging method so as to level the uneven surface.

Figure 9A:
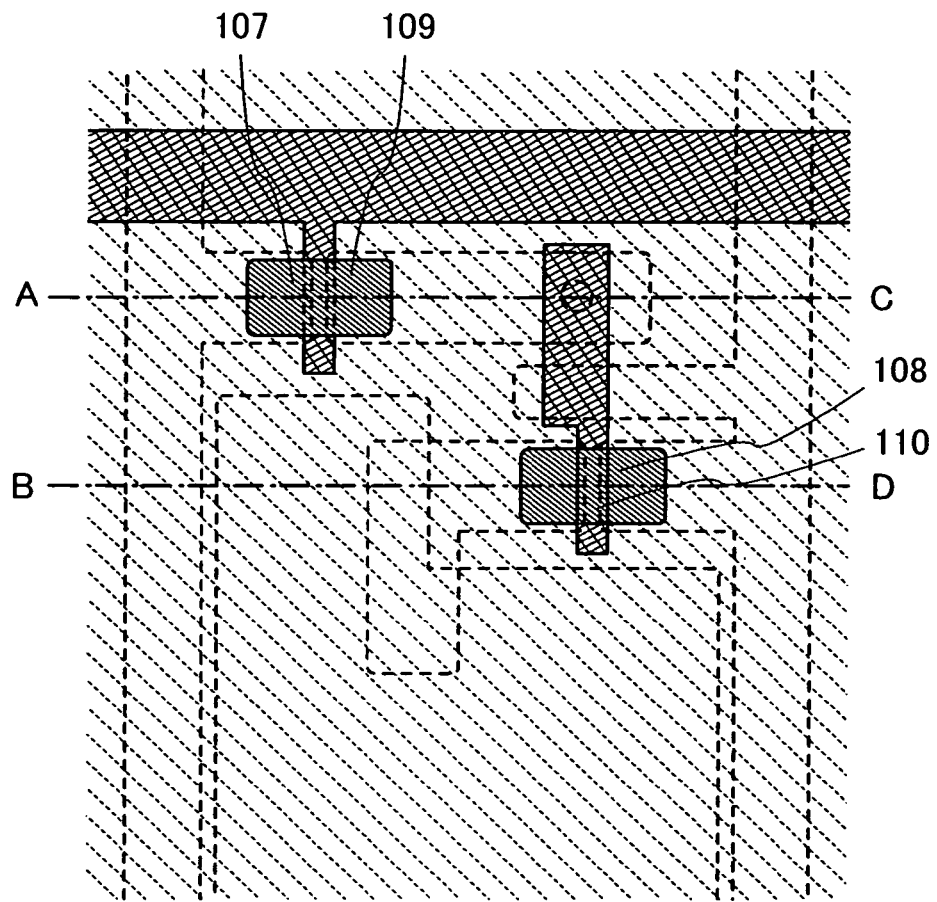
FIG. 9A is a top view and FIGS. 9B and 9C are cross sectional views explaining a method for manufacturing a display device according to the invention.
Figure 9B:
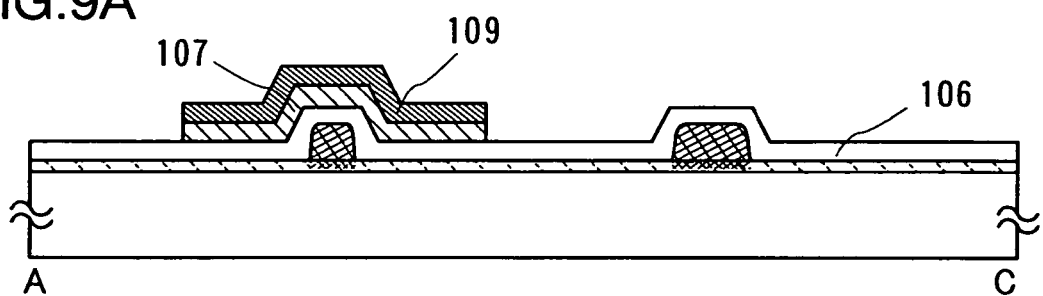

Next, a gate insulating layer 106 is formed over the gate electrode layers 103 and 104 (see FIG. 9B). The gate insulating layer 106 may be formed by using a known material such as a silicon oxide material and a silicon nitride material. The gate insulating layer may have a single layer or a lamination layer. In this embodiment mode, the gate insulating layer 106 is formed by laminating a silicon nitride film, a silicon oxide film and another silicon nitride film. Alternatively, a single layer of a silicon oxynitride film, or a two-layered film may be employed. Preferably, a dense silicon nitride film is used. When using the conductive layers made from silver, copper or the like by the droplet discharging method, a silicon nitride film or an NiB film is formed thereon as a barrier film to prevent an impurity from diffusing and to planarize the surfaces of the conductive layers. In order to form a dense insulating film with less gate current leakage at a low temperature, a reactive gas containing a rare gas element such as argon may be mixed in the insulating film to be formed.

Next, a semiconductor layer is formed. A semiconductor layer having one conductivity type may be formed, if necessary. In this embodiment mode, a semiconductor layer 107 and an N-type semiconductor layer 109 as a semiconductor layer having one conductivity type are laminated while a semiconductor layer 108 and an N-type semiconductor layer 110 as a semiconductor layer having one conductivity type are laminated (see FIGS. 9B and 9C). Alternatively, an NMOS structure of an N-channel TFT in which an N-type semiconductor layer is formed, a PMPS structure of a P-channel TFT in which a P-type semiconductor layer is formed, and a CMOS structure of the N-channel TFT and the P-channel TFT can be manufactured. In order to impart conductivity, an element imparting conductivity is added to a semiconductor layer and an impurity region is formed in the semiconductor layer so that an N-channel TFT and a P-channel TFT can be formed. Conductivity may be imparted to the semiconductor layers by performing plasma processing using $PH_3$ gas, rather than forming the N-type semiconductor layers.

As a material of the semiconductor layers, an amorphous semiconductor (hereinafter, "AS") manufactured by the vapor growth method using a semiconductor material gas typified by silane or germanium or sputtering; a polycrystalline semiconductor that is formed by crystallized the amorphous semiconductor by utilizing light energy or heat energy; a semiamorphous semiconductor (also referred to as a microcrystalline semiconductor, hereinafter, "SAS") or the like can be used. The semiconductor layers may be formed by using a known method (such as sputtering, LPCVD and plasma CVD).

The SAS has an intermediate structure between an amorphous structure and a crystalline structure (including a single crystalline structure and a polycrystalline structure), and a third condition that is stable in term of free energy. The SAS further includes a crystalline region having a short range order along with lattice distortion. A crystal region with a size of 0.5 to 20 nm can be observed in at least a part of a semiamorphous semiconductor film. In the case of containing silicon as its principal constituent, Raman spectrum is shifted toward lower wavenumbers than 520 $cm^{-1}$. The diffraction peaks of (111) and (220), which are believed to be derived from silicon crystal lattice, are observed in the SAS by X-ray diffraction. The SAS contains hydrogen or halogen of at least 1 atom % or more as a neutralizing agent for dangling bonds. The SAS is formed by glow discharge decomposition (plasma CVD) with silicide gas (plasma CVD). As for the silicide gas, $SiH_4$, $Si_2H_6$, $SiH_2Cl_2$, $SiHCl_3$, $SiC_4$, $SiF_4$ and the like can be used. In addition, $F_2$ or $GeF_4$ may be mixed in the silicide gas. The silicide gas may also be diluted with $H_2$, or a mixture of $H_2$ and one or more of rare gas elements selected from He, Ar, Kr and Ne. The dilution ratio is set to be in the range of 1:2 to 1:1,000. The pressure is set to be approximately in the range of 0.1 to 133 Pa. The frequency of the power supply is set to be 1 to 120 MHz, preferably, 13 to 60 MHz. Preferably, the substrate heating temperature may be set to be 300° C. or less, more preferably, 100 to 200° C. With respect to impurity elements contained in the film, each concentration of impurities of atmospheric constituents such as oxygen, nitrogen and carbon is preferably set to be $1\times10^{20}$ $cm^{-3}$ or less. In particular, the oxygen concentration is set to be $5\times10^{19}$ $cm^{-3}$ or less, preferably, $1\times10^{19}$ $cm^{-3}$ or less. In addition, when the lattice distortion is further promoted by adding a rare gas element such as helium, argon, krypton and neon, a favorable SAS having an increased stability can be obtained. In addition, an SAS layer formed by using silicide gas containing fluorine may be laminated with an SAS layer formed by silicide gas containing hydrogen.

A hydrogenated amorphous silicon can be typically cited as the amorphous semiconductor, while a polysilicon or the like can be typically cited as a crystalline semiconductor layer. The polysilicon includes a so-called high-temperature polysilicon mainly using a polysilicon that is formed at a process temperature of 800° C. or more; a so-called low-temperature polysilicon mainly containing a polysilicon that is formed at a process temperature of 600° C. or less; a polysilicon that is crystallized by being added with an element that promotes crystallization; and the like. As mentioned above, a semiamorphous semiconductor or a semiconductor containing a crystal phase in a part of a semiconductor layer may be used.

When a crystalline semiconductor layer is used as a semiconductor layer, the crystalline semiconductor layer may be formed by a known method (e.g., laser crystallization, thermal crystallization, thermal crystallization using an element that promotes crystallization such as nickel, and the like). Also, a microcrystalline semiconductor, which is an SAS, can be crystallized by irradiating laser light to increase its crystallinity. When the element that promotes the crystallization is not introduced, prior to irradiating laser light to an amorphous silicon film, the amorphous silicon film is heated at 500° C. for one hour under a nitrogen atmosphere to release hydrogen contained in the amorphous silicon film such that the concentration of hydrogen becomes $1\times10$ atoms/cm or less. This allows to prevent the amorphous silicon film containing a high amount of hydrogen from being destroyed by irradiating laser light.

A technique for introducing a metal element into an amorphous semiconductor layer is not particularly limited as long as it is a technique capable of providing the metal element on a surface or inside of the amorphous semiconductor layer. For example, sputtering, CVD, plasma processing (including plasma CVD), absorption, a method for coating a solution of metal salt, or the like can be employed. In the above-mentioned techniques, the method using a solution is convenience and has an advantage of easily adjusting the concentration of a metal element. In addition, in order to improve the wettability of the surface of the amorphous semiconductor layer to spread an aqueous solution to an entire surface of the amorphous semiconductor layer, an oxide film is preferably formed by irradiation UV light under an oxygen atmosphere, thermal oxidation, treatment using ozone water containing hydroxy radical or hydrogen peroxide solution, or the like.

The amorphous semiconductor layer may be crystallized by using a combination of a heat treatment and a laser light irradiation treatment. The heat treatment or the laser light irradiation treatment may be carried out several times, individually.

Also, a crystalline semiconductor layer may be formed over a substrate directly by the plasma method. Alternatively, the crystalline semiconductor layer may be selectively formed over a substrate by using the plasma method.

A semiconductor may be formed using an organic semiconductor material by printing, spraying, spin coating, the droplet discharging method or the like. In this case, since the above-described etching step is not required, the number of steps can be reduced. As an organic semiconductor, a low molecular weight organic material, a high molecular weight organic material, an organic pigment, a conductive high molecular weight organic material and the like can be employed. Preferably, a pi-conjugated system high molecular weight material with skeleton including conjugated double bonds is used as an organic semiconductor material used in the present invention. Typically, a soluble high molecular weight material such as polythiophene, polyfluorene, poly(3-alkyl thiophene), polythiophene derivative and pentacene can be used.

As another organic semiconductor material that can be used in the present invention, there is a material that can form first semiconductor regions by forming soluble precursor and processing the soluble precursor. For example, polyethylene vinylene, poly (2,5-thienylene vinylene), polyacetylene, polyacetylene derivative, polyarylene vinylene or the like can be cited as the organic semiconductor material.

When converting the precursor into an organic semiconductor, a reactive catalyst such as hydrochloric gas is added to the precursor, in addition to the heat treatment. As a typical solvent for dissolving such a soluble organic semiconductor material, toluene, xylene, chlorobenzene, dichlorobenzene, anisole, chloroform, dichloromethane, γ butyl lactone, butyl cellsolve, cyclohexane, NMP (N-methyl-2-pyrrolidone), cyclohexanone, 2-butanone, dioxane, dimethylformamide (DMF), THF (tetrahydrofuran), or the like can be applied.

In this embodiment mode, an amorphous semiconductor is used as a semiconductor. After forming the semiconductor layers, the N-type semiconductor layers are formed as semiconductor layers having one conductivity type by plasma CVD or the like.

Figure 9C:
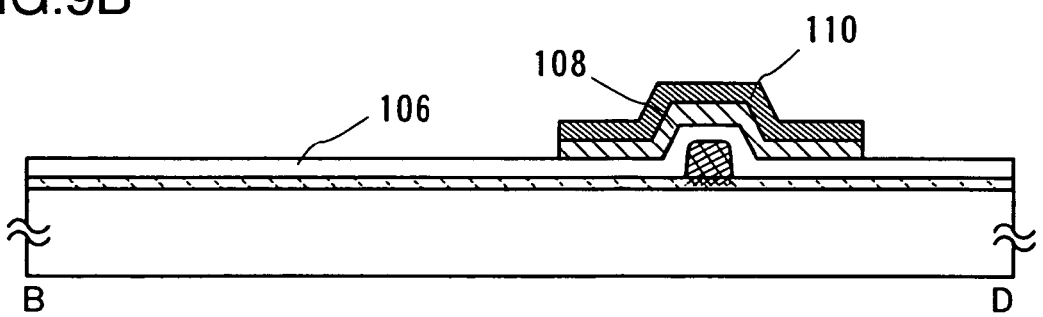
Figure 10A:
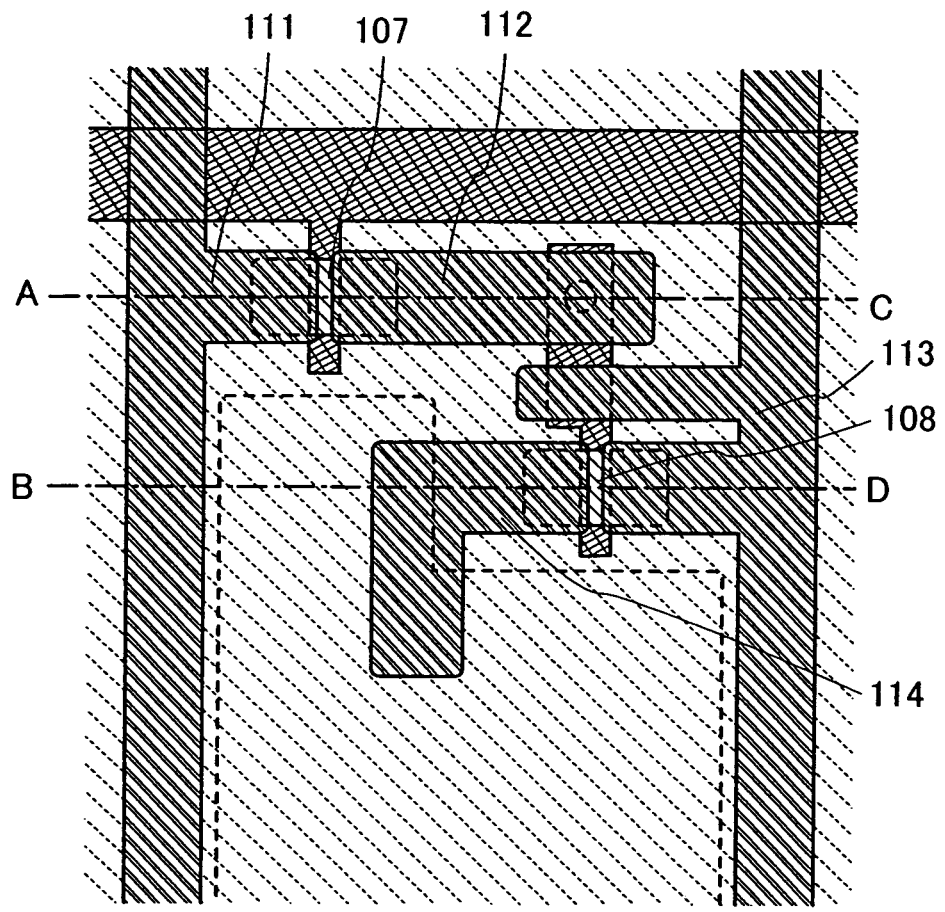
FIG. 10A is a top view and FIGS. 10B and 10C are cross sectional views explaining a method for manufacturing a display device according to the invention.
Figure 10B:
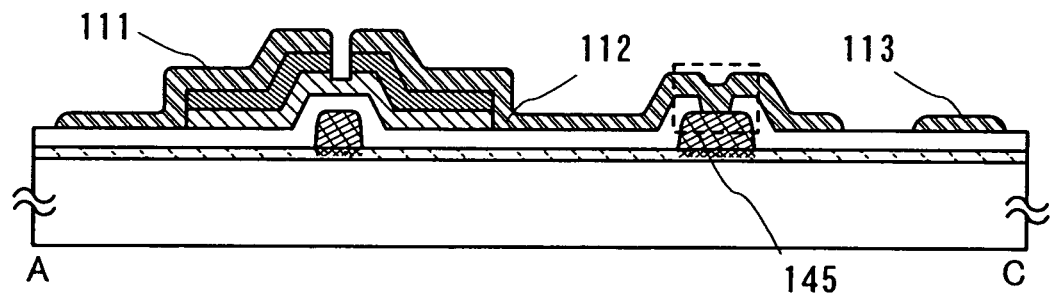
Figure 10C:
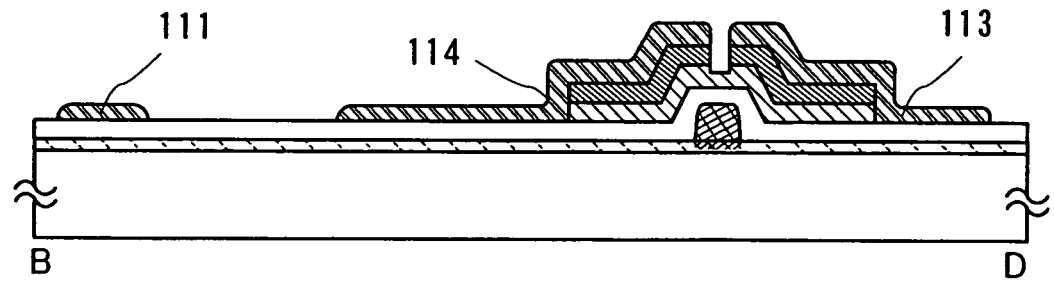

Subsequently, the semiconductor layers and the N-type semiconductor layers are simultaneously patterned by using a mask made from an insulating material such as resist and polyimide to form a semiconductor layer 107, a semiconductor layer 108, an N-type semiconductor layer 109 and an N-type semiconductor layer 110 (see FIGS. 9A to 9C). The mask can be formed by discharging a composition selectively. The mask is made from a resin material such as an epoxy resin, an acrylic resin, a phenol resin, a novolac resin, a melamine resin and an urethane resin. Alternatively, the mask is formed using an organic material such as benzocyclobutene, parylene, flare and polyimide having a light transmitting property; a compound material formed by polymerization of siloxane polymer and the like; a composition material containing a water-soluble homopolymer and a water-soluble copolymer; or the like by using the droplet discharging method. A commercially available resist material containing a photosensitive agent may be also used. For example, it is possible to use typical positive resist such as a novolac resin and a naphthoquinonediazide compound that is a photosensitive agent; and negative resist such as a base resin, diphenylsilanediol and an acid forming material. The surface tension and the viscosity of any material are appropriately adjusted by controlling the concentration of a solvent or by adding a surfactant, or the like.

When forming the mask by the droplet discharging method, a treatment of forming regions having different adherence properties may be carried out in a subject region on which the mask will be formed and the vicinity thereof as a pretreatment. In the case of forming the mask using the droplet discharging method in the present invention, a low adherence region and a high adherence region are formed in the subject region on which the mask will be formed so as to control the shape of the mask. According to this pretreatment, since the region other than the subject region has low adherence property, the unnecessary portion of the mask can be removed mechanically, thereby forming a mask layer with good controllability. This step is applicable to a pretreatment in the case of using the droplet discharging method prior to forming various kinds of patterns.

Another mask made from an insulating material such as resist and polyimide is also formed by the droplet discharging method. By utilizing this mask, a through hole 145 is formed in a part of the gate insulating layer 106 by etching to expose a part of the gate electrode layer 104 underlying the gate insulating layer. Either plasma etching (dry etching) or wet etching may be employed for the etching. In the case where a large-size substrate is processed by etching, the plasma etching is preferable. As an etching gas, a gas containing fluorine or chlorine such as $CF_4$, $NF_3$, $Cl_2$ and $BCl_3$ and an inert gas such as He and Ar may further be added thereto, appropriately. When the etching is performed by an atmospheric pressure discharge, electric discharge machining can be performed locally, and therefore, a mask layer is not necessary to be formed over an entire surface of a substrate.

After removing the mask, a composition containing a conductive material is discharged to form a source or drain electrode layer 111, a source or drain electrode layer 112, a source or drain electrode layer 113 and a source or drain electrode layer 114. By utilizing the source or drain electrode layers 111, 112, 113 and 114 as masks, the semiconductor layers 107 and 108 and the N-type semiconductor layers 109 and 110 are patterned to expose the semiconductor layers 107 and 108 (see FIGS. 10A to 10C). The source or drain electrode layer 111 also serves as a source or drain wiring layer while the source or drain electrode layer 113 also serves as a power supply line.

The step of forming the source or drain electrode layers 111, 112, 113 and 114 can be carried out in the same manner as the above-described step of forming the gate electrode layers 103 and 104. Therefore, a pretreatment of forming a low adherence region and a high adherence region may be performed and an unnecessary portion may be mechanically removed to perform microscopic patterning.

As a conductive material for forming the source or drain electrode layers 111, 112, 113 and 114, a composition mainly containing a metal particle such as Ag (silver), Au (gold), Cu (copper), W (tungsten) and Al (aluminum) can be used. Additionally, a combination of indium tin oxide (ITO) having a light transmitting property, ITSO including indium tin oxide and silicon oxide, organic indium, organic tin, zinc oxide, titanium nitride, or the like may be used.

In the through hole 145 formed in the gate insulating layer 106, the source or drain electrode layer 112 and the gate electrode layer 104 are electrically connected to each other. A part of the source or drain electrode layer constitutes a capacitor element.

Alternatively, the step of forming the through hole 145 in a part of the gate insulating layer 106 may be carried out by utilizing the source or drain electrode layers 111, 112, 113 and 114 as masks after forming these source or drain electrode layers. Then, a conductive layer is formed in the through hole 145 to electrically connect the source or drain electrode layer 112 to the gate electrode layer 104. In this case, the process can be simplified.

Figure 11A:
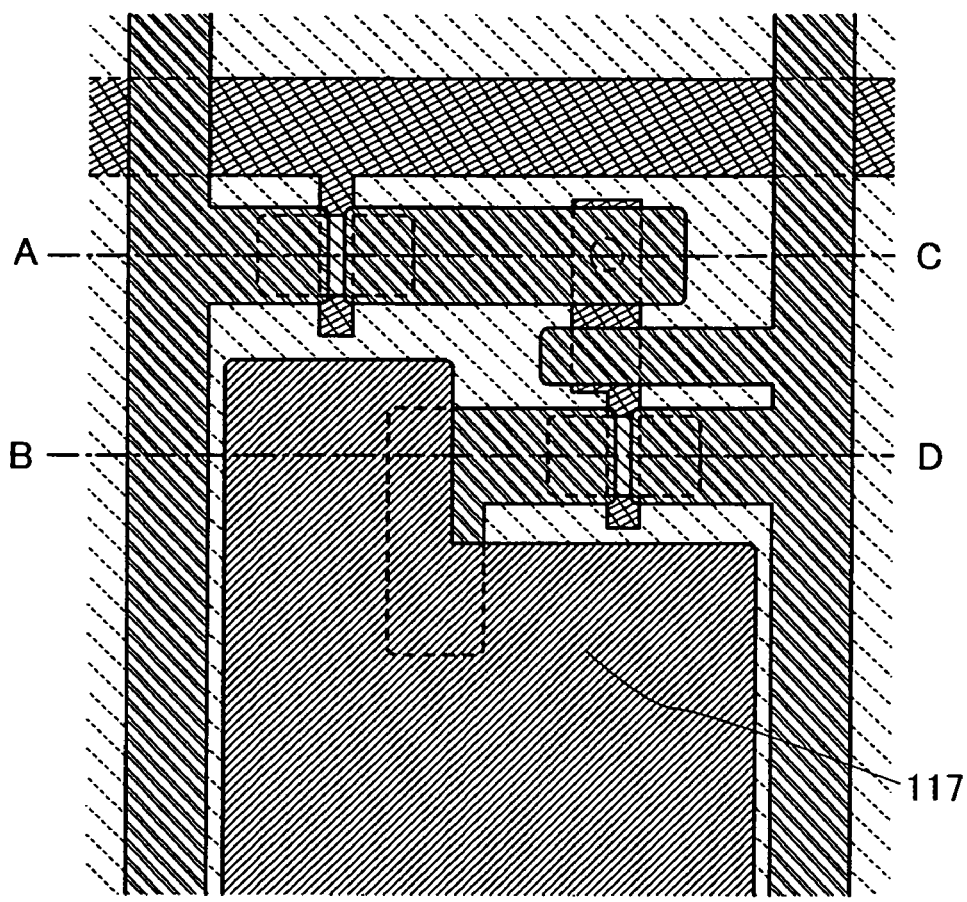
FIG. 11A is a top view and FIGS. 11B and 11C are cross sectional views explaining a method for manufacturing a display device according to the invention.
Figure 11B:
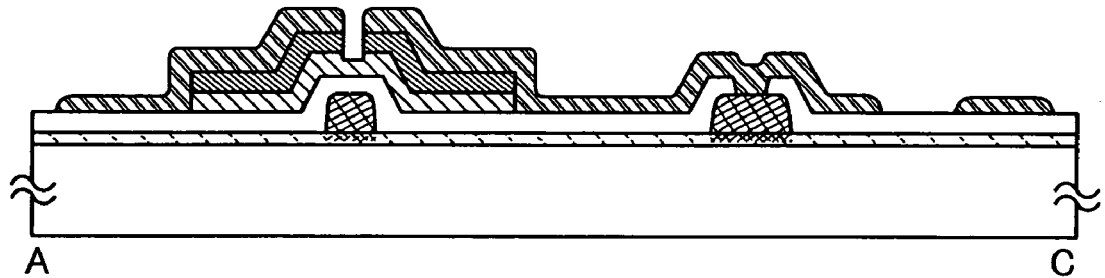
Figure 11C:
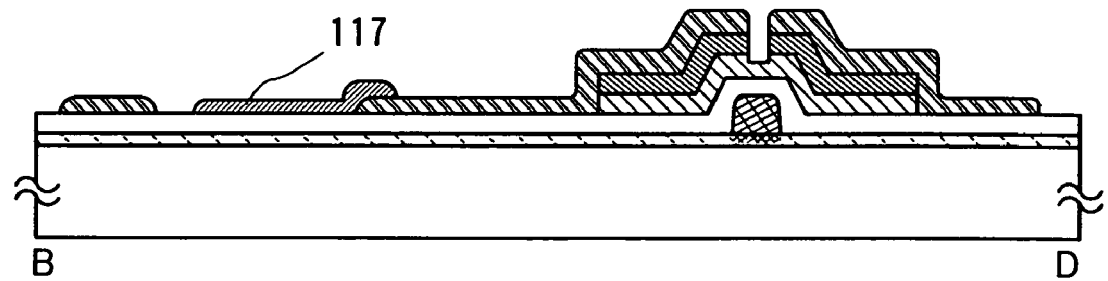

Subsequently, a composition containing a conductive material is selectively discharged on the gate insulating layer 106 to form a first electrode layer 117 (see FIGS. 11A to 11C). When forming this first electrode layer 117, a pretreatment of forming a low adherence region and a high adherence region may be carried out and an unnecessary portion may be mechanically removed to perform microscopic patterning in the same manner as the step of forming the gate electrode layers 103 and 104. By discharging the composition containing the conductive material in the high adherence region, the first electrode layer 117 can be selectively formed with good controllability. In the case where light is emitted through the substrate 100 or in the case where a transmissive display panel is manufactured, the first electrode layer 117 may be formed into a predetermined pattern by using indium tin oxide (ITO), indium tin oxide containing silicon oxide (ITSO), indium zinc oxide (IZO) containing zinc oxide (ZnO), zinc oxide (ZnO), ZnO doped with gallium (Ga), tin oxide ($SnO_2$) and the like and then baked.

Also, the first electrode layer 117 is preferably formed using indium tin oxide (ITO), indium tin oxide containing silicon oxide (ITSO), zinc oxide (ZnO) or the like by sputtering. More preferably, the first electrode layer 117 is made from indium tin oxide containing silicon oxide by sputtering with use of a target in which ITO is doped with 2 to 10 weight % silicon oxide. In addition, a conductive material in which ZnO is doped with gallium (Ga), or indium zinc oxide (IZO) containing silicon oxide that is a conductive oxide material in which indium oxide is mixed with 2 to 20% zinc oxide (ZnO) may be used. After forming the first electrode layer 117 by sputtering, a mask layer is formed by the droplet discharging method and then the first electrode layer may be etched into a predetermined pattern. In this embodiment mode, the first electrode layer 117 is formed using a conductive material having a light transmitting property by the droplet discharging method. Concretely, the first electrode layer 117 is made from indium tin oxide or ITSO including ITO and silicon oxide.

As mentioned above, the gate insulating layer is formed by laminating the silicon nitride film made from silicon nitride, the silicon oxynitride film (or the silicon oxide film) and another silicon nitride film in this embodiment mode. Preferably, the first electrode layer 117 made from indium tin oxide containing silicon oxide is formed to be in contact with an insulating layer made from silicon nitride that is included in the gate insulating layer 106. This structure allows to exhibit an effect of increasing the ratio of emitting light generated in an electroluminescent layer to the outside. Furthermore, the gate insulating layer is interposed between the gate electrode layer and the first electrode layer so that they can serve as a capacitor element.

The first electrode layer 117 can be selectively formed on the gate insulating layer 106 prior to forming the source or drain electrode layer 114. In this case, a connection structure of the source or drain electrode layer 114 and the first electrode layer 117 is inverted, and therefore, the source or drain electrode layer 114 is laminated on the first electrode layer. When the first electrode layer 117 is formed prior to forming the source or drain electrode layer 114, the first electrode layer can be formed on a flat region with good coverage and an excellent film formation property. Accordingly, a polishing treatment such as CMP can be performed sufficiently, thereby forming the first electrode layer with desirable flatness.

Alternatively, it is possible to employ a structure in which an insulating layer that will be an interlayer insulating layer is formed on the source or drain electrode layer 114 and the source or drain electrode layer 114 is electrically connected to the first electrode layer 117 by a wiring layer. In this case, an opening can be formed according to the present invention. Specifically, only a subject region on which the opening will be formed is formed to be a low adherence region with respect to an insulating layer to be formed and the other region is formed to be a high adherence region. Subsequently, an insulating layer is formed on the low adherence region and the high adherence region. Thereafter, only the insulating layer formed on the low adherence region is mechanically removed by the peeling method so that the opening is formed in the removed region. A substance formed for reducing the adherence property, which is formed in the opening, is then removed.

Alternatively, insulating layers may be selectively formed to form an opening, rather than forming the opening by partly removing the insulating layer. In this case, a substance having a low wettability with respect to the insulating layers is partly formed on the source or drain electrode layer 114. Thereafter, a composition for the insulating layer is applied on the source or drain electrode layer 114 by coating so that the insulating layers are formed in subject regions other than a region on which the substance having the low wettability is formed. The insulating layer is solidified by heating, drying and the like, and then the substance having the low wettability is removed to form an opening.

A wiring layer is formed to fill the opening that is formed in the above-described method and the first electrode layer 117 is formed to be in contact with this wiring layer. By using this method, since the opening is not necessary to be formed by etching, the process can be simplified.

Moreover, in the case where light generated in an electroluminescent layer is emitted to an opposite side of the substrate 100 or in the case where a reflective EL display panel is manufactured, a composition mainly containing a metal particle such as Ag (silver), Au (gold), Cu (copper), W (tungsten) and Al (aluminum) can be used as the first electrode layer 117. As another method for forming the first electrode layer 117, a transparent conductive film or a light reflective conductive film is formed by sputtering, a mask pattern is formed by the droplet discharging method, and the conductive film may be etched to form the first electrode layer 117.

The surface of the first electrode layer 117 may be polished by CMP or polished by using a porous body such as polyvinyl alcohol such that the surface thereof is planarized. Alternatively, after polishing the surface of the first electrode layer 117 by CMP, the surface thereof may be subjected to an ultraviolet light irradiation treatment, an oxygen plasma treatment, or the like.

According to the above-mentioned process, a TFT substrate 100 for a display panel in which a bottom-gate (also referred to as an inverted stagger type) TFT and a pixel electrode are connected to each other over the substrate 100 is completed. The TFT of this embodiment mode is of a channel-etched type.

Next, an insulating layer 121 (also referred to as a partition wall or a bank) is selectively formed. The insulating layer 121 is formed to have an opening over the first electrode layer 117. In this embodiment mode, the insulating layer 121 is formed over the entire surface of the substrate and patterned by etching utilizing a mask made from resist or the like. When the insulating layer 121 is formed by using the droplet discharging method or printing that can form a pattern directly and selectively, the patterning step by etching is not necessarily required. Also, the insulating layer 121 can be formed into a predetermined shape by the pretreatment according to the invention.

The insulating layer 121 may be made from silicon oxide, silicon nitride, silicon oxynitride, aluminum oxide, aluminum nitride, aluminum oxynitride, or another inorganic insulating material; acrylic acid, methacrylic acid or a derivative thereof; a heat-resistant polymer such as polyimide, aromatic polyamide or polybenzimidazole; or a siloxane resin. The insulating layer 121 may also be made from a photosensitive or nonphotosensitive material such as acrylic and polyimide. The insulating layer 121 is preferably formed to have a shape in which a radius of curvature is varied continuously so as to increase the coverage of an electroluminescent layer 122 and a second electrode layer 123 that are formed thereover.

After forming the insulating layer 121 by the droplet discharging method, the surface of the insulating layer 121 may be pressed with pressure so as to be planarized. As a method for pressing the surface of the insulating layer 121, a roller or the like may be scanned on the surface thereof to reduce the unevenness, or the surface thereof may be vertically pressed with a flat plate or the like. Alternatively, the surface of the insulating layer 121 may be softened or dissolved by using a solvent or the like and the unevenness on the surface thereof may be removed by using an air knife. Further, the surface of the insulating layer 121 may be polished by CMP. This step can be applied to a case where since an unevenness is formed on a surface by the droplet discharging method, the surface is necessary to be planarized. When the surface is planarized by this step, display defects of a display panel or the like can be prevented so that a high-definition image can be displayed on the display panel.

Figure 12A:
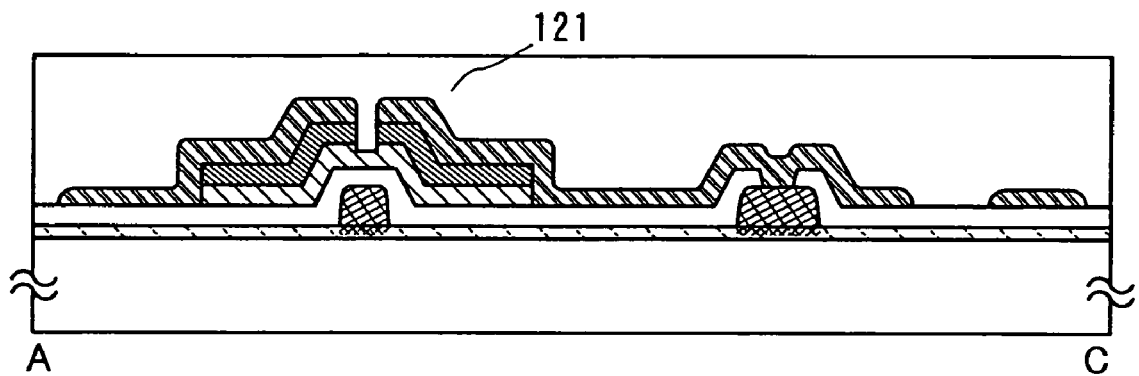
FIGS. 12A and 12B are cross sectional views explaining a method for manufacturing a display device according to the invention.
Figure 12B:
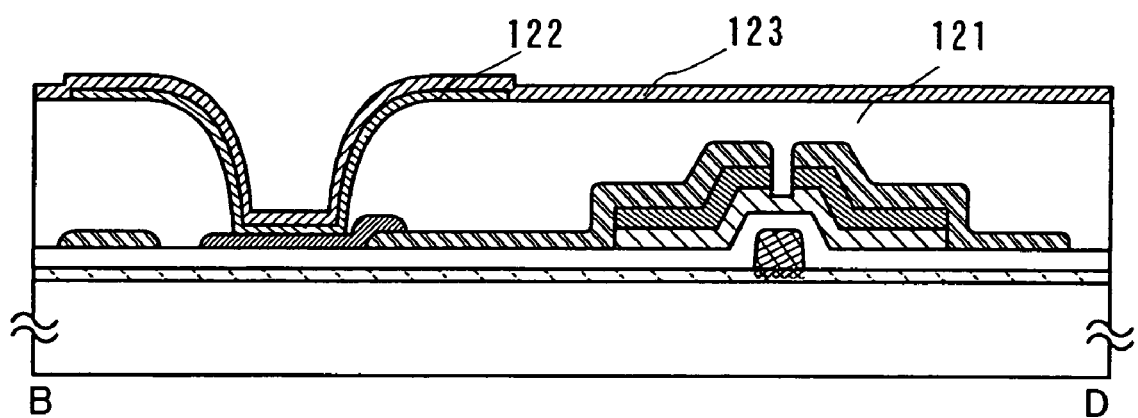

A light emitting element is formed so as to be electrically connected to a thin film transistor (see FIG. 12B).

Before forming the electroluminescent layer 122, a heat treatment is performed at 200° C. under atmospheric pressure to eliminate moisture absorbed in or adhered to the surfaces of the first electrode layer 117 and the insulating layer 121. Or, a heat treatment is performed at 200 to 400° C., preferably 250 to 350° C. under reduced pressure and the electroluminescent layer 122 is formed by vacuum evaporation or by the droplet discharging method under reduced pressure without exposing the electroluminescent layer to an atmosphere.

Materials exhibiting light emission of red (R), green (G) and blue (B) are selectively formed by evaporation using an evaporation mask or the like respectively as the electroluminescent layer 122. The material exhibiting light emission of red (R), green (G) and blue (B) (e.g., a low molecular weight material or a high molecular weight material) can be formed by the droplet discharging method like a color filter. Since the materials exhibiting light emission of the R, G and B can be individually applied without using a mask, the droplet discharging method is preferably used. A second electrode layer 123 is laminated on the electroluminescent layer 122 so that a display device using the light emitting element with a display function can be completed.

Although not shown in the drawings, it is effective to form a passivation film so as to cover the second electrode layer 123. The passivation film can be made of an insulating film including silicon nitride (SiN), silicon oxide (SiO$_2$), silicon oxynitride (SiON), silicon nitride oxide (SiNO), aluminum nitride (AlN), aluminum oxynitride (AlON), aluminum nitride oxide (AlNO) in which the nitrogen content is higher than the oxygen content, aluminum oxide, diamond like carbon (DLC) or a carbon nitride (CN$_x$) film. For instance, a lamination structure of a carbon nitride (CN$_x$) film and silicon nitride (SiN) can be used. In addition, an organic material can be used. A lamination of high molecular weight materials such as styrene polymer may be used. Also, a siloxane resin may be used.

In this case, a film with excellent coverage is preferably used as the passivation film. A carbon film, in particular, a DLC film is effectively used. Since the DLC film can be formed at a temperature in a range of a room temperature to 100° C. or less, it can be formed easily over the electroluminescent layer having a low heat resistant property. The DLC film can be formed by plasma CVD (typically, RF plasma CVD, microwave CVD, electron cyclotron resonance (ECR) CVD, heat filament CVD, or the like), combustion flame, sputtering, ion beam evaporation, laser evaporation, and the like. Hydrogen gas and a gas containing hydrocarbon (for example CH$_4$, C$_2$H$_2$, C$_6$H$_6$, etc.) are used as reactive gases which are used for forming the film. The reactive gases are ionized by glow discharge. The ions are accelerated to collide with a negatively self-biased cathode. A CN film may be formed using C$_2$H$_4$ gas and N$_2$ gas as reactive gases. The DLC film has a high blocking property with respect to oxygen and can prevent the electroluminescent layer from being oxidized. Accordingly, the DLC film can prevent the electroluminescent layer from being oxidized during a subsequent sealing step.

Subsequently, a sealing material is formed and the substrate is sealed with a sealing substrate. Afterwards, a flexible wiring substrate may be connected to the gate wiring layer that is formed electrically contacting to the gate electrode layer 103 so as to be electrically connected to an outside portion. This is the same for the source wiring layer that is formed electrically connecting to the source or drain electrode layer 111.

Figure 18A:
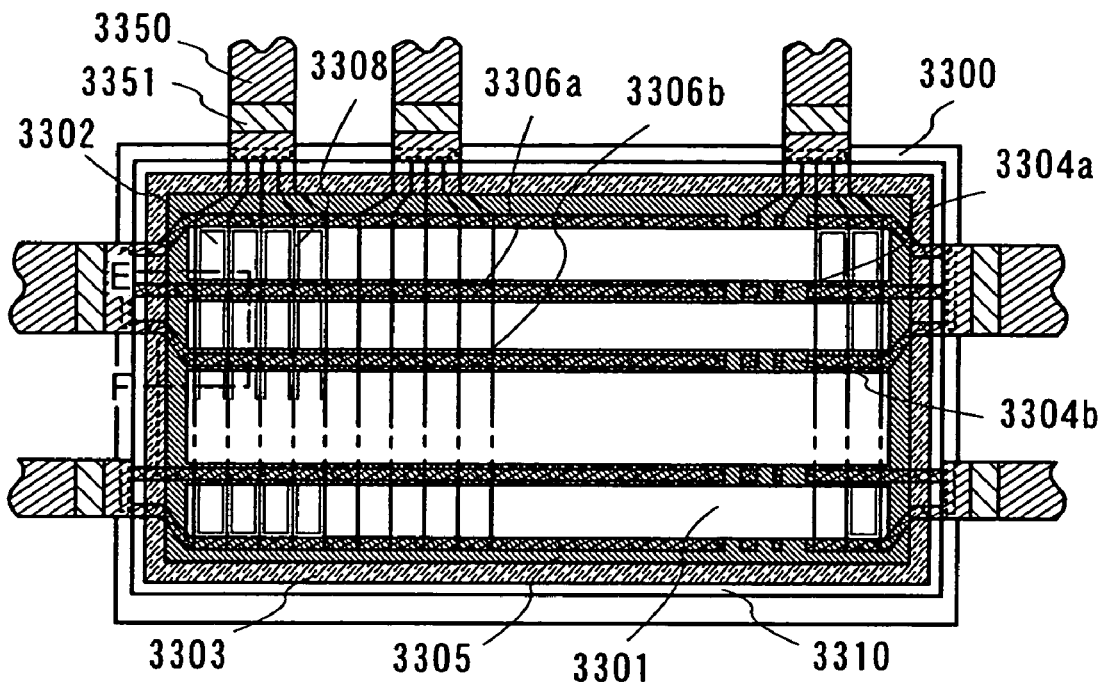
FIG. 18A is a top view and FIG. 18B is a cross sectional view explaining a display panel according to the invention.
Figure 18B:
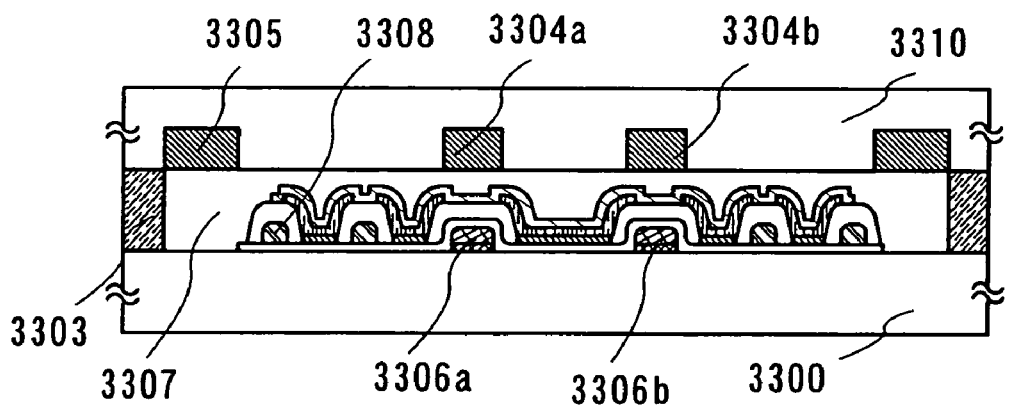

A completed EL display panel according to the invention is shown in FIGS. 18A and 18B. FIG. 18A is a top view of the EL display panel, while FIG. 18B is a cross sectional view thereof along a line E-F of FIG. 18A. In FIGS. 18A and 18B, a pixel portion 3301 formed over an element substrate 3300 includes: pixels 3302; gate wiring layers 3306a, 3306b; and a source wiring layer 3308. The element substrate 3300 is firmly attached to a sealing substrate 3310 with a sealing material 3303. In this embodiment mode, driver ICs 3351 are disposed over FPCs 3350, and the FPCs are mounted over the substrate by the TAB technology.

As shown in FIGS. 18A and 18B, drying agents 3305, 3304a and 3304b are disposed inside the display panel to prevent deterioration of the elements due to moisture. The drying agent 3305 is disposed so as to surround the pixel portion, whereas the drying agents 3304a, 3304b are disposed in regions corresponding to the gate wiring layers 3306a and 3306b. In this embodiment mode, the drying agents are disposed in depression portions that are formed in the sealing substrate as shown in FIG. 18B, and therefore, the display panel can be formed thinly. Since the drying agents are formed in the regions corresponding to the gate wiring layers, a moisture absorbing area can be enlarged, which results in an improved moisture absorbing property. Also, since the drying agents are formed over the gate wiring layers, which themselves do not emit light, the light extraction efficiency is not be reduced. In the embodiment mode, a filler 3307 is filled in the display panel. When a substance having a hygroscopic property such as a drying agent is used as the filler 3307, the moisture absorbing property is further improved, thereby preventing the deterioration of the elements.

An example in which a light emitting element is sealed with a glass substrate is shown in this embodiment mode. This sealing treatment is carried out to protect the light emitting element from moisture. Any one of the following methods can be used: a method in which a light emitting element is mechanically sealed with a cover material; a method in which a light emitting element is sealed with a heat curable resin or an ultraviolet light curable resin; and a method in which a light emitting element is sealed with a thin film having an excellent barrier property such as metal oxide and nitride. As for the cover material, glass, ceramic, plastic or metal can be used. When light is emitted through the cover material, the cover material is required to be formed of a material with a light transmitting property. The cover material is attached to the substrate over which the above-mentioned light emitting element is formed with a sealing material such as a heat curable resin or an ultraviolet light curable resin and then the resin is cured by a heat treatment or an ultraviolet irradiation treatment to form an enclosed space. It is also effective to provide a hydroscopic material typified by barium oxide in the enclosed space. This hydroscopic material may be provided on the sealing material or over a partition wall or a peripheral part so as not to block light emitted from a light emitting element. Furthermore, it is also possible to fill a gap between the cover material and the substrate over which the light emitting element is formed with a heat curable resin or an ultraviolet light curable resin. In this case, it is effective to add a hydroscopic material typified by barium oxide in the heat curable resin or the ultraviolet light curable resin.

Although a switching TFT having a single gate structure is shown in this embodiment mode, a multi-gate structure such as a double gate structure may be also employed. When a semiconductor is formed by using an SAS or a crystalline semiconductor, an impurity region can be formed by adding an impurity imparting one conductivity type. In this case, the semiconductor layer may have impurity regions having different concentrations. For example, a region laminated with a gate electrode layer in the vicinity of a channel region of a semiconductor layer may be a low concentration impurity region while a region outside of the low concentration impurity region may be a high concentration impurity region.

As set forth above, the process can be simplified in this embodiment mode. Also, by forming various kinds of components (parts) directly over a substrate using the droplet discharging method, a display panel can be manufactured easily using a glass substrate of the fifth generation or later having 1,000 mm or more on a side.

According to the invention, a component having a predetermined shape included in a display device can be formed easily with good controllability. Moreover, loss of materials can be suppressed, thereby reducing the cost. As a consequence, a high performance, highly reliable display device can be manufactured with high yield.

Embodiment Mode 3

Another embodiment mode of the invention will be described referring to FIGS. 13A to 13E and FIGS. 14A to 14C. In this embodiment mode, a display device is manufactured by using a top-gate (staggered type) thin film transistor. Further, an example of a liquid crystal display device using liquid crystal material for a display element will be shown.

Identical portions or portions having similar functions to those in Embodiment Modes 1 and 2 will not be further described. FIGS. 13A to 13E and FIGS. 14A to 14C are cross sectional views of the display device.

By the light irradiation treatment, an adherence property of a region irradiated with the light is changed in this embodiment mode. A composition containing a substance with low adherence property is discharged over a substrate 300 by a discharging device 382 to put the composition 351 on the substrate 300 (see FIG. 13A). In this embodiment mode, laser light is used.

Figure 13A:
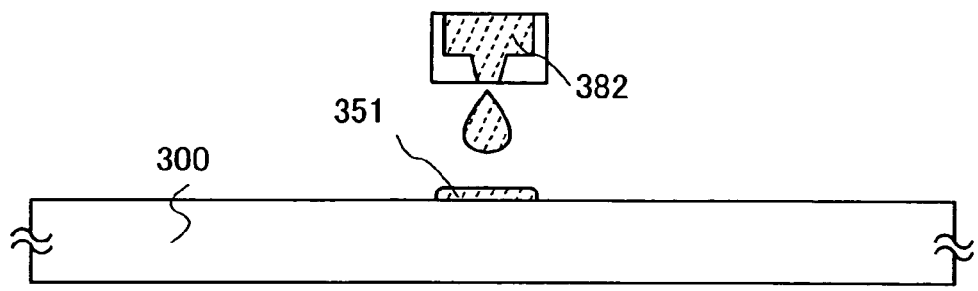
FIGS. 13A to 13E are cross sectional views explaining a method for manufacturing a display device according to the invention.
Figure 13B:
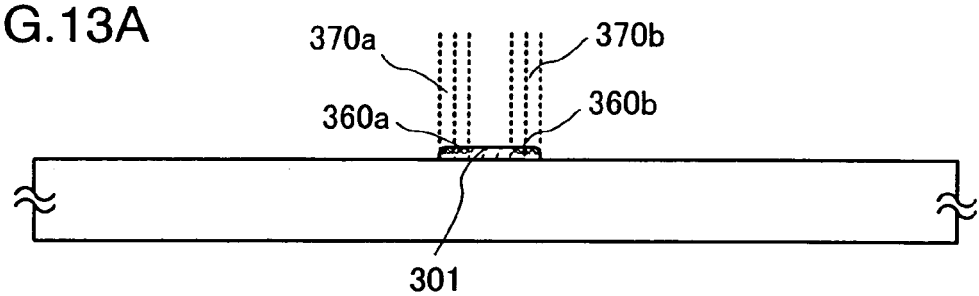
Figure 13C:
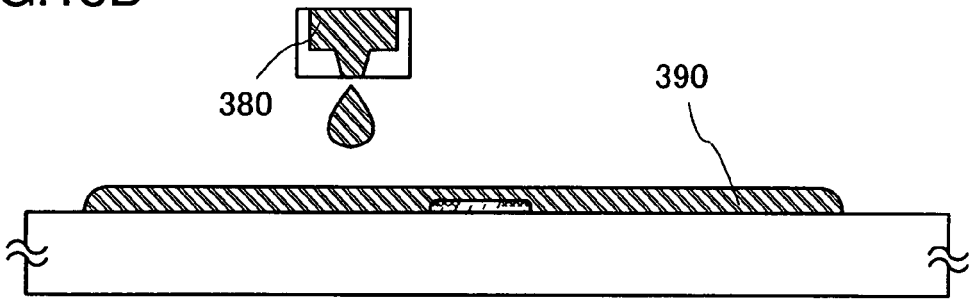
Figure 13D:
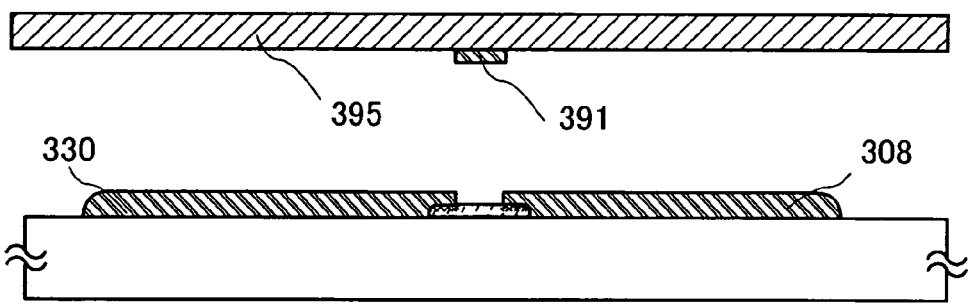

The both ends of the composition 351 are irradiated with laser light 370a and laser light 370b to form a high adherence region 360a and a high adherence region 360b having high adherence properties (see FIG. 13B). A film can be modified with good controllability by laser light since fine processing is possible by laser light. By using droplet discharging method, wasted material can be prevented as compared with a case where a material is applied over an entire surface by spin coating or the like, therefore, it is possible to reduce the cost. A low adherence region 301 sandwiched between the high adherence regions 360a and 360b is formed by the microscopic processing using laser light, and therefore, the low adherence region has a thin line shape. In this embodiment mode, a plurality of regions of the high adherence regions 360a and 360b are irradiated with laser light to form the low adherence region with thin line shape. However, the present invention is not limited thereto. Laser light may be irradiated to the composition 351 with low adherence property corresponding to a predetermined width between wirings so as to control the adherence property. A composition containing conductive material is discharged and put on the low adherence region 301 and the neighboring high adherence regions 360a and 360b by a droplet discharging device 380. The composition containing the conductive material is dried and baked to form a conductive layer 390 (see FIG. 13C).

An object 395 having a surface to which an adhesive is adhered is attached to the conductive layer 390 such that the surface to which an adhesive is adhered is in contact with the surface of the conductive layer. After the attachment, the object 395 is separated to remove the conductive layer 391 formed on the low adherence region, which is an unnecessary portion of the conductive layer 390, from the substrate 300. Since the conductive layers formed on the high adherence regions 360a and 360b in which the adherence property is improved by laser light irradiation are well-adhered to the high adherence regions over the substrate, the conductive layers formed on the high adherence regions are not separated by the object 395 and remain over the substrate 300. Consequently, a source or drain electrode layer 330 and a source or drain electrode layer 308 that are patterned into predetermined shapes are formed (see FIG. 13D).

A thin gap is formed between the source or drain electrode layers 330 and 308 with good controllability so that the source or drain electrode layers 330 and 308 do not contact each other. Therefore, since a channel length of a semiconductor is narrow and the source or drain electrode layers 330 and 308 can be formed with good controllability, it is possible to prevent defects such as short-circuiting. According to the invention, when small, thin wirings or the like are designed densely and intricately, they can be formed with good controllability.

After forming the electrode layers, the substance with low adherence property, which has been formed previously, may remains as it is. Alternatively, an unnecessary portion of the substance with low adherence property may be removed after forming a pattern. The unnecessary portion may be removed by ashing with or etching with use of oxygen or the like while utilizing the pattern as a mask.

An N-type semiconductor layer is formed over the source or drain electrode layers 330 and 308 and etched by using a mask made of resist or the like. The resist may be formed by using the droplet discharging method. A semiconductor layer is formed over the N-type semiconductor layers and patterned by using a mask or the like. Consequently, the semiconductor layer 307 and the N-type semiconductor layers 306 are formed.

Figure 13E:
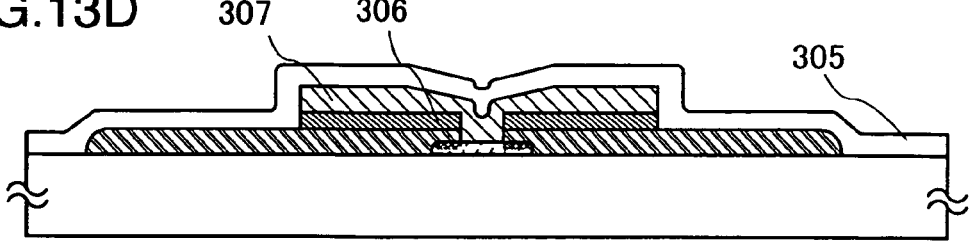

Next, a gate insulating layer 305 is formed to have a single layer or a lamination structure by plasma CVD or sputtering (see FIG. 13E). Preferably, the gate insulating layer may be formed by laminating an insulating layer made of silicon nitride, an insulating layer made of silicon oxide and an insulating layer made of silicon nitride.

A mask is formed using a resist or the like over the gate insulating layer 305. By utilizing the mask, the gate insulating layer 305 is etched to form a penetrating hole 345 (see FIG. 14A). In this embodiment mode, the mask is selectively formed by the droplet discharging method.

Figure 14A:
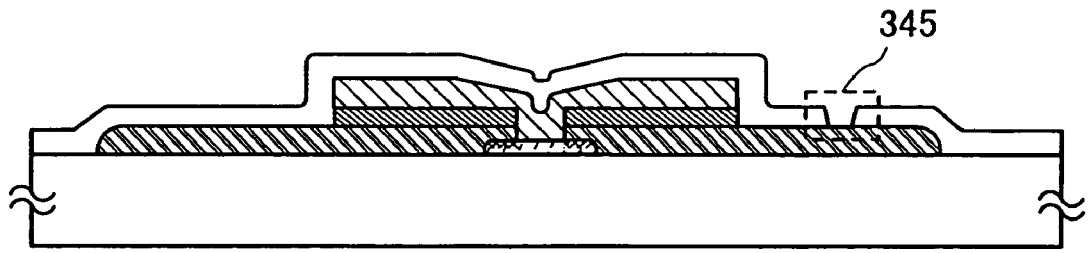
FIGS. 14A to 14C are cross sectional views explaining a method for manufacturing a display device according to the invention.
Figure 14B:
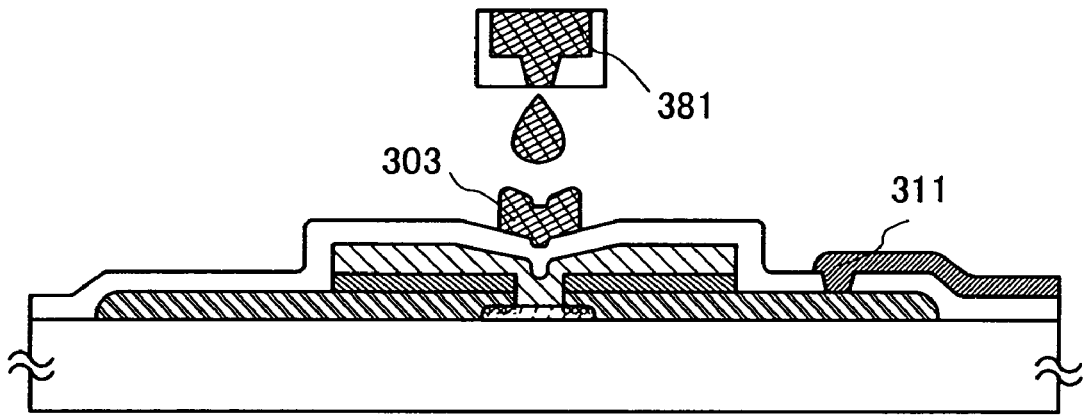
Figure 14C:
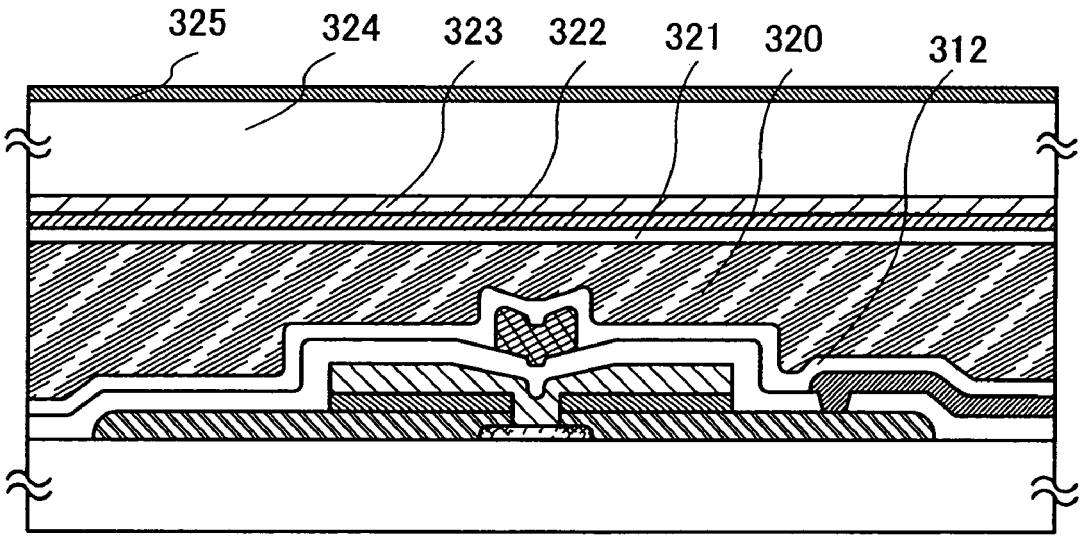

A composition containing a conductive material is discharged and put on the gate insulating layer 305 by a droplet discharging device 381 to form a gate electrode layer 303 (see FIG. 14B). Also, the width of the gate electrode layer may be further diminished to have a predetermined thin line shape according to the present invention as well as Embodiment Mode 1. The width in a channel direction of the gate electrode layer 303 can be narrowed according to the invention, and hence, the resistance can be reduced.

A pixel electrode layer 311 is formed by the droplet discharging method. The pixel electrode layer 311 and the source or drain electrode layer 308 are electrically connected to each other in the penetrating hole 345, which has been previously formed. The pixel electrode layer 311 can be made of the same material as the above described first electrode layer 117. In the case of manufacturing a transmissive liquid crystal display panel, the pixel electrode layer may be formed by using a composition containing indium tin oxide (ITO), indium tin oxide including silicon oxide (ITSO), zinc oxide (ZnO), tin oxide ($SnO_2$) or the like to have a predetermined pattern, and then baking the composition.

Next, an insulating layer 312, which is referred to as an orientation film, is formed by printing or spin coating so as to cover the pixel electrode layer 311. This insulating layer 312 can be selectively formed by screen printing or offset printing. Thereafter, a rubbing treatment is carried out. Subsequently, a sealing material is formed in a peripheral region of a pixel by the droplet discharging method (not shown).

Thereafter, a counter substrate 324 on which an insulating layer 321 functioning as an orientation film, a colored layer 322 functioning as a color filter, a conductive layer 323 functioning as a counter electrode and a polarizing plate 325 are provided is attached to the substrate 300 while sandwiching a spacer therebetween. A liquid crystal layer 320 is provided in a gap between the counter substrate 324 and the substrate 300 so as to achieve a liquid crystal display panel (see FIG. 14C). A polarizing plate may also be provided on the other side of the substrate 300 on which the TFT is not provided. The sealing material may contain a filler. In addition, a light shielding film (black matrix) and the like may be formed on the counter substrate 324. Further, the liquid crystal layer can be formed by using a dispenser (a dropping method), a dipping method in which a liquid crystal is injected between the attached substrates by utilizing capillary phenomenon, and the like.

Figure 29:
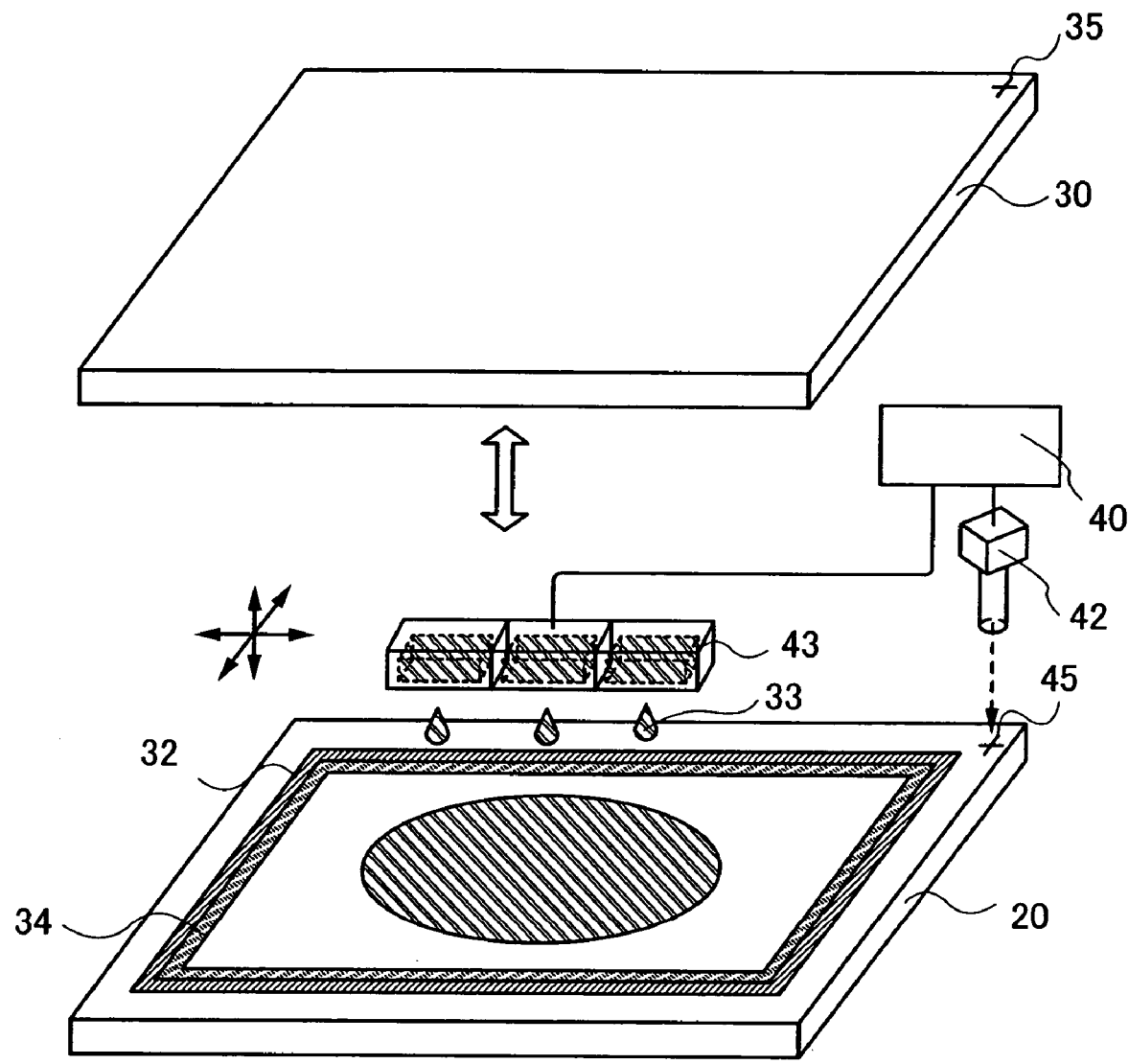
FIG. 29 is a diagram explaining a method for dropping a liquid crystal that can be applied to the present invention.

A liquid crystal dropping method employing a dispenser will be described with reference to FIG. 29. In FIG. 29, the liquid crystal dropping method includes a controlling device 40, image pickup means 42, a head 43, a liquid crystal 33, a marker 35, a marker 45, a barrier layer 34, a sealing material 32, a TFT substrate 30, and a counter substrate 20. A closed loop is formed on the counter substrate 20 by using a sealing material 32, and the liquid crystal 33 is dropped therein at one or more times from the head 43. When the viscosity of the liquid crystal material is high, the liquid crystal is discharged continuously to be attached to a subject region on which a liquid crystal layer will be formed. On the other hand, when the viscosity of the liquid crystal is low, the liquid crystal is discharged intermittently as shown in FIG. 29. At this moment, the barrier layer 34 is formed to prevent the sealing material 32 from reacting with the liquid crystal 33. Subsequently, the substrates are attached to each other in vacuum. The sealing material is cured by being irradiated with ultraviolet light so that the liquid crystal is enclosed between the substrates. Alternatively, a sealing material may be formed on the TFT substrate and liquid crystal may be dropped therein.

In order to connect the pixel portion manufactured in the above process to an external wiring substrate, a connection portion is formed. An insulating layer in the connection portion is removed by ashing using oxygen gas under atmospheric pressure or almost atmospheric pressure. The ashing treatment uses oxygen gas together with one or more of hydrogen, $CF_4$, $NF_3$, $H_2O$ and $CHF_3$. In this step, the ashing treatment is performed after sealing the liquid crystal with the counter substrate so as to prevent damage or breakage due to electrostatic. In the case of having a less possibility of adverse effect due to electrostatic, however, the ashing treatment can be carried out at any time.

Subsequently, a connection wiring substrate is provided so as to be electrically connected to the wiring layer through an anisotropic conductive layer. The wiring substrate serves to transmit a signal or an electric potential from the outside. According to the above mentioned process, a liquid crystal display panel having a display function can be achieved.

Although a switching TFT having a single gate structure is shown in this embodiment mode, a multi-gate structure such as a double gate structure may also be used. When a semiconductor is formed by using an SAS or a crystalline semiconductor, an impurity region can be formed by adding an impurity that imparts one conductivity type. In this case, the semiconductor layer may have impurity regions having different concentrations. For example, a region laminated with a gate electrode layer in the vicinity of a channel region of a semiconductor layer may be a low concentration impurity region while a region outside of the low concentration impurity region may be a high concentration impurity region.

As set forth above, the process can be simplified according to the present embodiment mode. Also, by forming various kinds of components (parts) over a substrate using the droplet discharging method, a display panel can be manufactured easily using a glass substrate of the fifth generation or later having 1,000 mm or more on a side.

According to the invention, components having a predetermined pattern of a display device can be easily formed with good controllability. Moreover, loss of materials can be suppressed, thereby reducing the cost. As a consequence, a high performance display device having a high reliability can be manufactured with high yield.

Embodiment Mode 4

A thin film transistor can be formed according to the present invention, and a display device can be fabricated using the thin film transistor. When a light emitting element and an N-type transistor for driving the light emitting element are used, light generated from the light emitting element emits downward, upward, or both downward and upward (i.e., bottom emission, top emission, or dual emission). In the present embodiment mode, laminated structures of a light emitting element will be described according to each type of light emission with reference to FIGS. 31A to 31C.

In this embodiment mode, channel protective type thin film transistors 481, 461 and 471 to which the invention is applied are used. A channel protective film may be formed by dropping polyimide, polyvinyl alcohol, or the like with the droplet discharging method. Consequently, an exposing step can be omitted. As the channel protective film, a film including one or more kinds selected from an inorganic material (e.g., silicon oxide, silicon nitride, silicon oxynitride, silicon nitride oxide, and the like), a photosensitive or nonphotosensitive organic (resin) material (e.g., polyimide, acrylic, polyamide, polyimide amide, benzocyclobutene, and the like), resist, a low-k material that has a low dielectric constant, and the like can be used. Alternatively, a lamination layer of these films can be used. Also, a siloxane resin may be used. As a method for manufacturing the channel protective film, a vapor phase growth method such as plasma CVD and thermal CVD, or sputtering can be used. The droplet discharging method or the printing method (a method for forming a pattern directly, such as screen printing or offset printing) can also be used. A TOF film or an SOG film obtained by applying a liquid can be used.

Firstly, the case where light is emitted through a substrate 480, i.e., downward, is described with reference to FIG. 31A. In the case of the bottom emission, a source or drain electrode 482, a first electrode 484, an electroluminescent layer 485 and a second electrode 486 are sequentially laminated over the substrate 480 such that a light emitting element is electrically connected to the thin film transistor 481. Secondly, the case where light is emitted to an opposite direction of a substrate 460, i.e., upward (top emission), is described with reference to FIG. 31B. A source or drain electrode 462, which is electrically connected to the thin film transistor 461, a first electrode 463, an electroluminescent layer 464 and a second electrode 465 are sequentially laminated over the substrate 460. According to this structure, even when light is transmitted through the first electrode 463, the light is reflected by the source or drain electrode 462 and emitted to the opposite direction of the substrate 460. In this structure, the first electrode 463 is not necessary to be made of a material having a light transmitting property. Lastly, the case where light is emitted from both sides of the substrate 470, i.e., both upward and downward (dual emission), is described with reference to FIG. 31C. A source or drain electrode 475, which is electrically connected to the thin film transistor 471, a first electrode 472, an electroluminescent layer 473 and a second electrode 474 are sequentially laminated over the substrate 470. In the case of the dual emission, when both the first electrode 472 and the second electrode 474 are formed of materials having light transmitting properties, or formed to have film thicknesses which can transmit light, light can be emitted both upward and downward.

A light emitting element has a structure in which an electroluminescent layer is sandwiched between a first electrode and a second electrode. It is necessary to select materials for the first and second electrodes in consideration of work functions. The first and second electrodes can be either an anode or a cathode depending on a pixel structure. In this embodiment mode, it is preferable that the first electrode serves as a cathode and the second electrode serves as an anode, since a polarity of a driving TFT is an n-channel type. In addition, when a polarity of the driving TFT is a p-channel type, it is preferable that the first electrode be an anode and the second electrode be a cathode.

When the first electrode is an anode, the electroluminescent layer is preferably formed by sequentially laminating an HIL (a hole injecting layer), an HTL (a hole transporting layer), an EML (a light emitting layer), an ETL (an electron transporting layer) and an EIL (an electron injecting layer) over the anode. When the first electrode serves as a cathode, it is preferable to laminate these layers reversely, i.e., the electroluminescent layer is formed by sequentially laminating an EIL (an electron injecting layer), an ETL (an electron transporting layer), an EML (a light emitting layer), an HTL (a hole transporting layer), an HIL (a hole injecting layer), and an anode, which is the second electrode, over the cathode. Further, the electroluminescent layer can also be formed with a single layer structure or a mixed structure, in addition to the above laminated structure.

As the electroluminescent layer, materials each exhibits luminescence of red (R), green (G) and blue (B) are selectively formed by evaporation using an evaporation mask and the like, respectively. The materials (low molecular weight materials, high molecular weight materials, and the like) each exhibits luminescence of red (R), green (G) and blue (B) can be formed by the droplet discharging method as well as a color filter. The droplet discharging method is preferable since layers exhibiting R, G and B light can be separately applied without using a mask.

In the case of the top emission and a second electrode is made of ITO or ITSO with light transmitting property, BzOS-Li in which benzoxazole derivative (BzOs) is doped with Li, or the like can be used. Also, for instance, as the EML, $Alq_3$ doped with a dopant corresponding to respective luminescent colors of R, G and B (DCM etc. in the case of R, and DMQD etc. in the case of G) may be used.

Further, the electroluminescent layer is not limited to the above materials. For example, hole injecting property can be enhanced by co-evaporation of oxide such as molybdenum oxide ($MoO_X$: X=2 to 3) with α-NPD or rubrene as substitute for CuPc or PEDOT. In addition, an organic material (including a low molecular weight material or a high molecular weight material) or a composite material of an organic material and an inorganic material can be used as a material for the electroluminescent layer. Materials for forming a light emitting element will be described in more detail below.

As substances having excellent electron transporting properties among charge injecting/transporting substances, for example, metal complexes having quinoline skeleton or benzoquinoline skeleton such as: tris(8-quinolinolate)aluminum (abbreviation: $Alq_3$); tris(5-methyl-8-quinolinolate)aluminum (abbreviation: $Almq_3$); bis(10-hydroxybenzo[h]quinolinato)beryllium (abbreviation: $BeBq_2$); bis(2-methyl-8-quinolinolate)-4-phenylphenolato-aluminum (abbreviation: BAlq); and the like can be given. As substances having superior hole transporting properties, for example, aromatic amine (i.e., one having a benzene ring-nitrogen bond) based compounds such as: 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4''-tris(N,N-diphenyl-amino)-triphenylamine (abbreviation: TDATA), 4,4',4''-tris[N-(3-methylphenyl)-N-phenyl-amino]-triphenylamine (abbreviation: MTDATA), and the like can be given.

As substances having extremely superior electron injecting properties among charge injecting/transporting substances, there are compounds of alkali metal or alkali earth metal such as lithium fluoride (LiF), cesium fluoride (CsF) and calcium fluoride ($CaF_2$). In addition, a mixture of a substance having high electron transportation property such as $Alq_3$ and alkali earth metal such as magnesium (Mg) may be used.

As substances having excellent hole injecting properties among the charge injecting/transporting substances, for example, metal oxide such as molybdenum oxide (MoOx), vanadium oxide (VOx), ruthenium oxide (RuOx), tungsten oxide (WOx) and manganese oxide (MnOx) can be cited. Besides, a phthalocyanine compound such as phthalocyanine (abbreviation: $H_2Pc$) and copper phthalocyanine (CuPc) can be given.

Light emitting layers having different light emission wavelength bands may be formed in respective pixels so as to perform color display. Typically, light emitting layers corresponding to respective luminescent colors of R (red), G (green) and B (blue) are formed. In this case, when a filter that transmits light of a certain light emission wavelength band is provided at a side of light emission of pixels, color purity can be improved and specular reflexion (reflection) of a pixel portion can be prevented. By providing the filter, a circular polarizing plate etc., which has been conventionally thought to be required, can be eliminated, thereby reducing loss of light emitted from the light emitting layers. Also, change in color tone, that is caused in the case where a pixel portion (a display screen) is seen obliquely, can be reduced.

There are various kinds of light emitting materials. With respect to low molecular weight organic light emitting materials, the following substances can be used: 4-dicyanomethylene-2-methyl-6-[2-(1,1,7,7-tetramethyl-9-julolidyl) ethenyl]-4H-pyran (abbreviation: DCJT); 4-dicyanomethylene-2-t-butyl-6-[2-(1,1,7,7-tetramethyl-julolidine-9-il)ethenyl]-4H-pyran (abbreviation: DCJTB); periflanthene; 2,5-dicyano-1,4-bis[2-(10-methoxy-1, 1,7,7-tetramethyl-julolidine-9-il)ethenyl]benzene, N,N'-dimethylquinacridone (abbreviation: DMQd); coumarin 6; coumarin 545T; tris(8-quinolinolate)aluminum (abbreviation: $Alq_3$); 9,9'-biantryl; 9,10-diphenylanthracene (abbreviation: DPA); 9,10-bis(2-naphthyl)anthracene (abbreviation: DNA); and the like. Also, another substances may be used.

On the other hand, as compared with the low molecular weight organic light emitting materials, the high molecular weight organic light emitting materials have higher physical strength, which results in more durable elements. In addition, since the high molecular weight organic light emitting materials can be formed by applying a liquid, an element can be formed relatively easily. A structure of a light emitting element made from the high molecular weight organic light emitting material may be basically similar to that of using the low molecular weight organic light emitting material, and may be formed by sequentially laminating a cathode, an organic light emitting layer and an anode. However, when a light emitting layer is made of the high molecular weight organic light emitting material, it is difficult to form a lamination structure like the case of using the low molecular weight organic light emitting material. In many cases, such the light emitting element made of the high molecular weight organic light emitting material has a two layer structure. Concretely, it is a lamination structure formed by sequentially laminating a cathode, a light emitting layer, a hole transporting layer and an anode.

A luminescent color is determined by a material for forming a light emitting layer, and hence, a light emitting element that emits a intended color of light can be formed by selecting the material. As high molecular weight electroluminescent materials that can be used to form a light emitting layer, polyparaphenylene vinylene, polyparaphenylene, polythiophene, polyfluorene and the like can be mentioned.

Specifically, the following substances can be given as polyparaphenylene vinylene: a derivative of poly(paraphenylenevinylene) (PPV); poly(2,5-dialkoxy-1,4-phenyenevinylene) (RO-PPV); poly(2-[2'-ethyl-hexoxy]-5-methoxy-1, 4-phenylenevinylene) (MEH-PPV); poly(2-[dialkoxyphenyl]-1,4-phenylenevinylene) (ROPh-PPV); and the like. As the polyparaphenylene, the following substances can be given: a derivative of polyparaphenylene (PPP); poly(2,5-dialkoxy-1,4-phenylene) (RO-PPP); poly(2,5-dihexoxy-1,4-phenylene); and the like. As the polythiophene, the following substances can be given: a derivative of polythiophene (PT); poly(3-alkylthiophene) (PAT); poly(3-hexylthiophene) (PHT); poly(3-cyclohexylthiophene) (PCHT); poly(3-cyclohexyl-4-methylthiophene) (PCHMT); poly(3,4-dicyclohexylthiophene) (PDCHT); poly(3-[4-octylphenyl]-thiophene) (POPT); poly(3-[4-octylphenyl]-2,2-bithiophene) (PTOPT); and the like. As the polyfluorene, the following substances can be given: a derivative of polyfluorene (PF); poly(9,9-dialkylfluorene) (PDAF); poly(9,9-dioctylfluorene) (PDOF); and the like.

When a high molecular weight organic light emitting material with hole transporting property is sandwiched between an anode and a high molecular weight organic light emitting material with light emitting property, hole injecting property from the anode can be improved. Typically, a solution in which a high molecular weight organic light emitting material with hole transporting property is dissolved in water along with an acceptor material is applied by spin coating or the like. Since the high molecular weight organic light emitting material with hole transporting property is insoluble in an organic solvent, it can be laminated together with the above-mentioned organic light emitting material with light emitting property. As the high molecular weight organic light emitting material with hole transporting property, a mixture of PEDOT and camphor sulfonic acid (CSA) as an acceptor material; a mixture of polyaniline (PANI) and polystyrenesulfonic acid (PSS) as an acceptor material; and the like can be cited.

A light emitting layer can emit monochromatic light or white light. In the case of using a white light emitting material, a color display can be achieved by providing a filter (a colored layer) that transmits light of a certain wavelength in a light emitting direction side of a pixel.

In order to form a light emitting layer that emits white light, for example, white light emission can be achieved by sequentially laminating $Alq_3$, $Alq_3$ partially doped with Nile red, which is a red light emitting pigment, $Alq_3$, p-EtTAZ and TPD (aromatic diamine) by evaporation. Also, when an EL is formed by coating using spin coating, the EL is preferably baked by vacuum heating after applying a liquid. For example, an aqueous solution of poly(ethylene dioxythiophene)/poly(styrenesulfonic acid) (PEDOT/PSS), which functions as a hole injecting layer, may be applied over the entire surface of a substrate and baked. Afterwards, a solution of polyvinyl carbazole (PVK) doped with a pigment for luminescence center (such as 1,1,4,4-tetraphenyl-1,3-butadiene (TPB), 4-dicyanomethylene-2-methyl-6-(p-dimethylamino-styryl)-4H-pyran (DCM1), Nile red and coumarin 6), which serves as a light emitting layer, may then be applied over the entire surface and baked.

A light emitting layer may be formed to have a single layer. In this case, 1,3,4-oxadiazole derivative (PBD) with electron transporting property may be dispersed in polyvinyl carbazole (PVK) with hole transporting property. In addition, white light emission can be obtained by dispersing 30 wt % PBD as an electron transporting agent and dispersing a suitable amount of four kinds of pigments (TPB, coumarin 6, DCM1, and Nile red). In addition to the above-mentioned light emitting elements that emit white light, a light emitting element capable of emitting red light, green light or blue light can be manufactured by properly selecting materials for the light emitting layer.

Further, triplet excited light emitting materials including metal complex and the like may be used for a light emitting layer in addition to singlet excited light emitting materials. For example, pixels emitting red light, in which luminance half-life is relatively shorter than those of pixels emitting green and blue light, may be formed by a triplet excited light emitting material, and the pixels emitting green and blue lights may be formed of singlet excited light emitting materials. Since the triplet excited light emitting material has an excellent light emitting efficiency, it has a feature of requiring lower power consumption in order to obtain the same level of luminance as compared with the singlet excited light emitting material. That is, when the pixels for emitting red light are formed by a triplet excited light emitting material, only a small amount of current flowing through the light emitting element is required, therefore, it is possible to realize higher reliability. To reduce power consumption, pixels emitting red and green lights may be formed of the triplet excited light emitting materials, while pixels emitting blue light may be formed of a singlet excited light emitting material. In the case where light emitting elements that emit green lights, which has high visibility for human eyes, are also formed of the triplet excited light emitting material, power consumption can be further reduced.

As an example of the triplet excited light emitting material, there is one that uses a metal complex as a dopant. In particular, a metal complex with platinum, which belongs to the third transition series, as its central metal, a metal complex with iridium as its central metal and the like are known. The triplet excited light emitting materials are not limited to these compounds, and it is possible to use a compound having the above mentioned structure and including an element that belongs to groups 8 to 10 of the periodic table as its central metal.

Above mentioned substances for forming a light emitting layer are just examples, and a light emitting element can be formed by properly laminating respective layers with various properties such as a hole injecting/transporting layer, a hole transporting layer, an electron injecting/transporting layer, an electron transporting layer, a light emitting layer, an electron blocking layer and a hole blocking layer. In addition, a mixed layer or a mixed junction of these layers may be used. A layer structure of a light emitting layer can be varied. The structural change of the light emitting layer may be allowable without deviating the purpose of the invention; for example, an electrode is provided or a light emitting material is dispersed so as to function as a light emitting layer, instead of providing a certain electron injecting region or light emitting region.

When a forward bias voltage is applied to a light emitting element formed of the above-mentioned materials, it can emit light. Each pixel of a display device formed using the light emitting element can be driven by either a simple matrix system or an active matrix system as described in Embodiment Mode 2. In either case, each pixel emits light by applying a forward bias voltage at a certain timing, whereas each pixel does not emit light in a certain period. In this non-light emitting period, a reverse bias voltage is applied to the light emitting element so that the reliability of the light emitting element can be improved. The light emitting element has deterioration modes in which light intensity is reduced under a certain drive condition or in which apparent luminance is reduced due to expansion of non-light emitting regions within pixels. When the light emitting element is driven by applying alternating voltage such that each pixel is added with a forward bias voltage and a reverse bias voltage alternately, the deteriorations of the light emitting elements can be slowed, thereby improving the reliability of the light emitting device. Furthermore, either digital driving or analog driving is applicable.

Figure 31A:
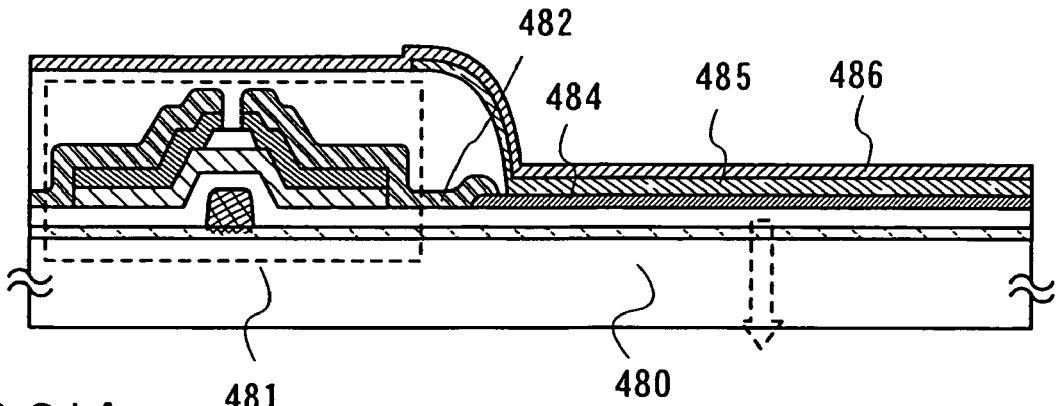
FIGS. 31A to 31C are cross sectional views of display devices according to the invention.
Figure 31B:
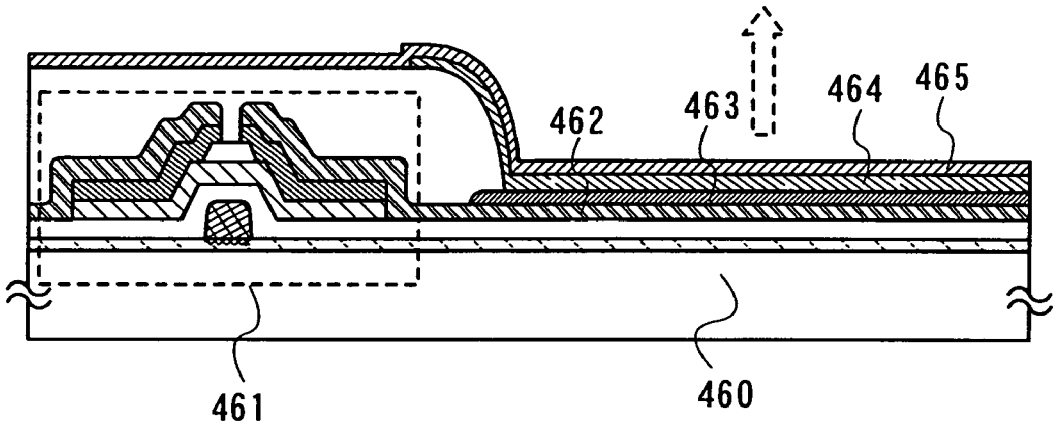
Figure 31C:
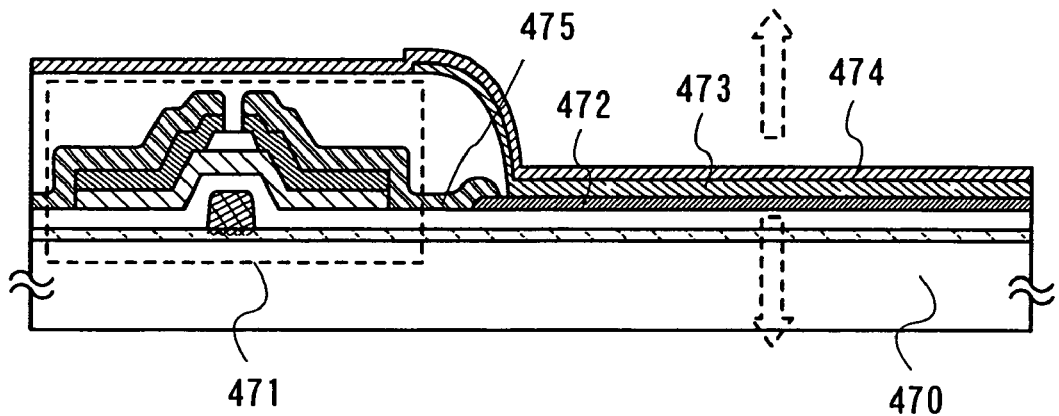

Although not shown in FIGS. 31A to 31C, a color filter (colored layer) may be formed over a counter substrate with respect to the substrate 480. The color filter (colored layer) can be formed by the droplet discharging method. In this case, the laser irradiation treatment can be employed as the above-mentioned pretreatment. According to the present invention, the color filter (colored layer) can be formed into a predetermined pattern with good controllability. Since broad peaks of the emission spectrum for respective R, G and B can be adjusted sharply by the color filter (colored layer), a high-definition image can be displayed by using this color filter (colored layer).

Although the case of forming the material exhibiting light emission of respective R, G and B is described above, a full color display can also be achieved by forming a material exhibiting a monochromatic light in combination with a color filter or a color conversion layer. For example, the color filter (colored layer) or the color conversion layer may be formed on a second substrate (sealing substrate). As described above, the material exhibiting monochromatic light, the color filter (colored layer) and the color conversion layer can be formed by the droplet discharging method.

Of course, a monochromatic light emitting display may be performed. For instance, an area color display device using a monochromatic light may be formed. A passive matrix display portion is suitable for the area color display device and characters and symbols can be mainly displayed thereon.

In the above-mentioned structures, the cathodes can be formed of a material having low work function. For example, the cathodes are desirably formed of Ca, Al, CaF, MgAg, AlLi, and the like. The electroluminescent layers may have any one of a single-layer structure, a lamination structure and a mixed structure having no interface between layers. Further, the electroluminescent layers may be formed of any materials such as a singlet material; a triplet material; a material with a combination of the singlet and triplet materials; a charge injecting/transporting substance containing an organic compound or an inorganic compound; or a light emitting material. The electroluminescent layers may include one or plural kinds of layers selected from a low molecular weight organic compound, an intermediate molecular weight organic compound (which indicates an organic compound that does not have a sublimation property and has 20 or less degree of polymerization or a chained molecule with a length of 10 µm or less) and a high molecular weight organic compound depending on the number of its molecules, in combination with an inorganic compound with electron injecting/transporting property or hole injecting/transporting property. The first electrodes 484, 463 and 472 are formed of transparent conductive films, which transmit light. For example, a transparent conductive film, in which indium oxide is mixed with 2 to 20% of zinc oxide (ZnO) may be used besides ITO, and ITSO. It is preferable that a plasma treatment be carried out under an oxygen atmosphere or a heat treatment be performed under a vacuum atmosphere prior to forming the first electrodes 484, 463 and 472. Partition walls (also referred to as banks) are formed of a material including silicon, an organic material, or a compound material. Also, a porous film may be used. When the partition walls are formed of a photosensitive or nonphotosensitive material such as acrylic and polyimide, the radius of curvature for each side surface thereof is continuously varied. Therefore, a thin film formed on each partition wall is not disconnected. Accordingly, it is preferable that the partition walls be formed of the photosensitive or nonphotosensitive material. The present embodiment mode can be implemented by being freely combined with the above-mentioned embodiment modes.

Embodiment Mode 5

By forming a semiconductor layer using an SAS in the display panel manufactured according to Embodiment Mode 4 to 6, a scanning line driver circuit can be formed over a substrate 3700 as described in FIG. 33B.

Figure 25:
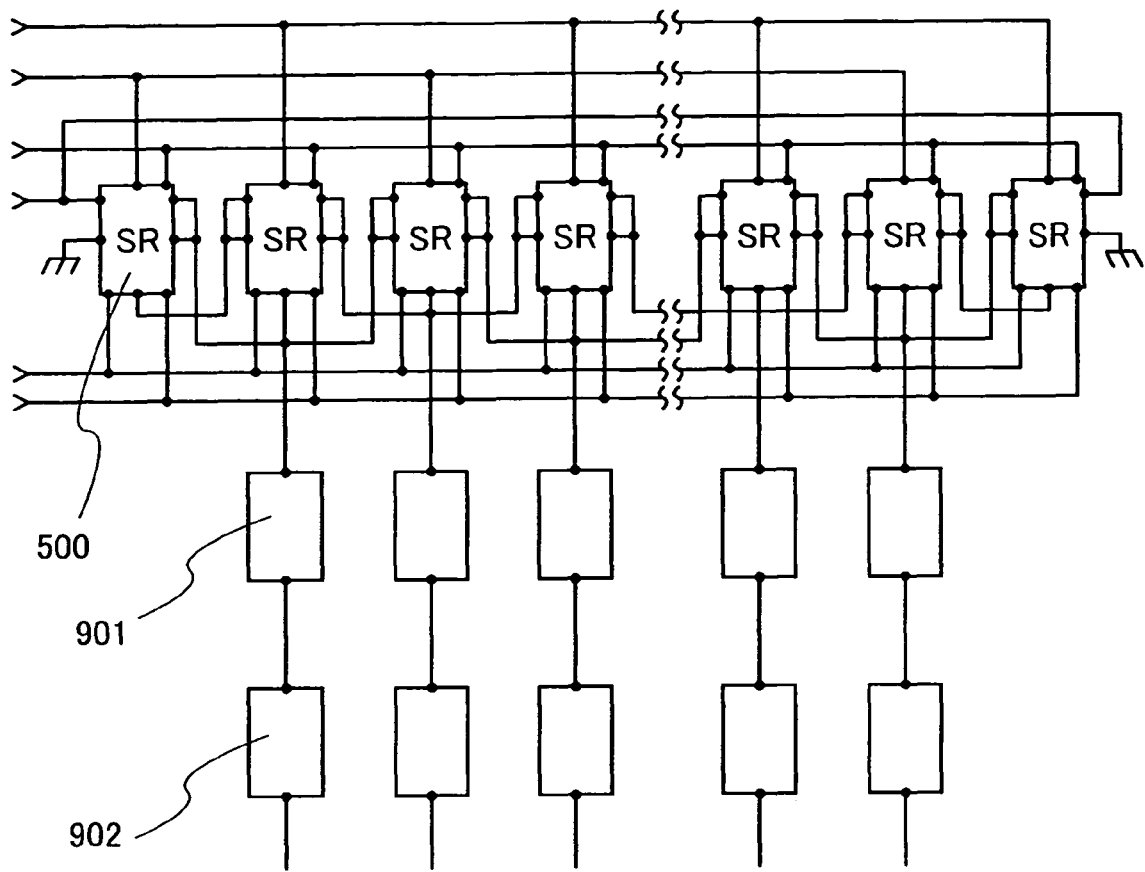
FIG. 25 is a diagram explaining a circuit structure in the case where a scanning line driver circuit is formed using a TFT in an EL display panel according to the invention.

FIG. 25 is a block diagram of a scanning line driver circuit formed using an n-channel TFT that uses an SAS with an electron field-effect mobility of 1 to 15 cm$^2$/V·sec.

In FIG. 25, a block 500 corresponds to a pulse output circuit outputting a sampling pulse for one stage. A shift register includes n pieces of pulse output circuits. Reference numeral 901 represents a buffer circuit and a pixel 902 is connected to the end of the buffer circuit.

Figure 26:
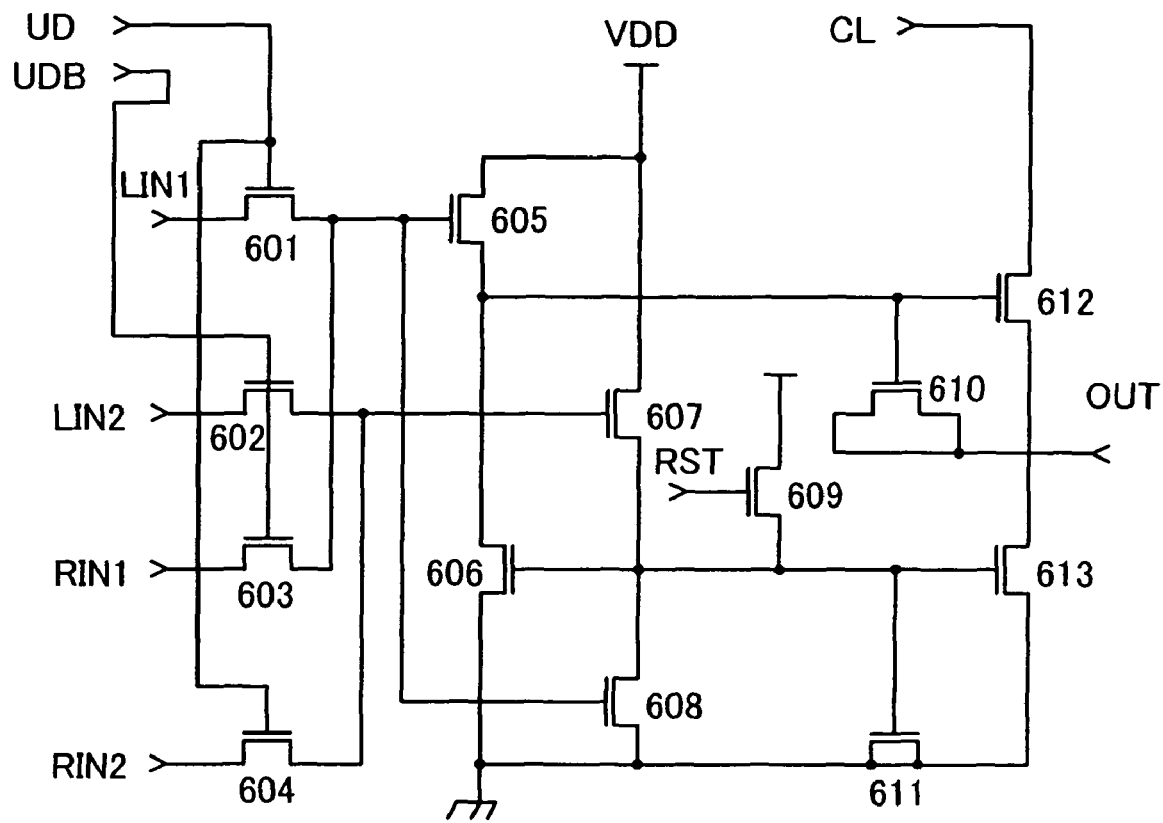
FIG. 26 is a circuit diagram explaining a circuit structure (a shift register circuit) in the case where a scanning line driver circuit is formed using a TFT in an EL display panel according to the invention.

FIG. 26 shows a specific configuration of the block 500 corresponding to a pulse output circuit, wherein the circuit includes n-channel TFTs 601 to 612. In this case, the sizes of the TFTs may be determined in consideration of operation characteristics of the n-channel TFTs using an SAS. For instance, when the channel length is set to be 8 µm, the channel width can be set to be in the range of 10 to 80 µm.

Figure 27:
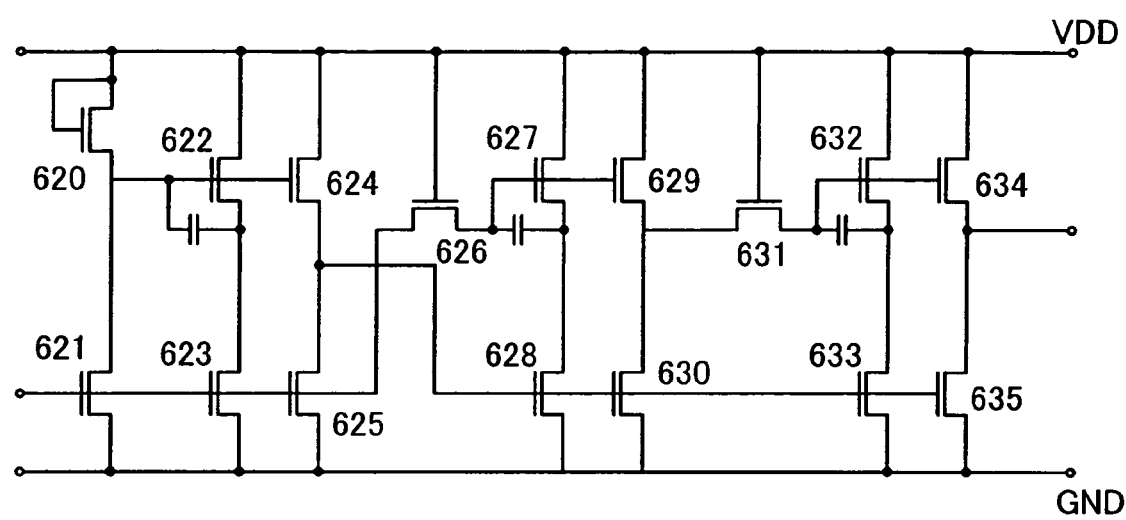
FIG. 27 is a circuit diagram explaining a circuit structure (a buffer circuit) in the case where a scanning line driver circuit is formed using a TFT in an EL display panel according to the invention.

Further, a specific configuration of a buffer circuit 901 is shown in FIG. 27. Similarly, the buffer circuit includes n-channel TFTs 620 to 635. In this case, the sizes of the TFTs may be determined in consideration of operation characteristics of the n-channel TFTs using an SAS. For example, when the channel length is set to be 10 µm, the channel width can be set to be in the range of 10 to 1,800 µm. A wiring can be formed to have a predetermined shape with good controllability according to the invention, and hence, a thin wiring with a channel width of, e.g., 10 µm can be formed stably.

Figure 16:
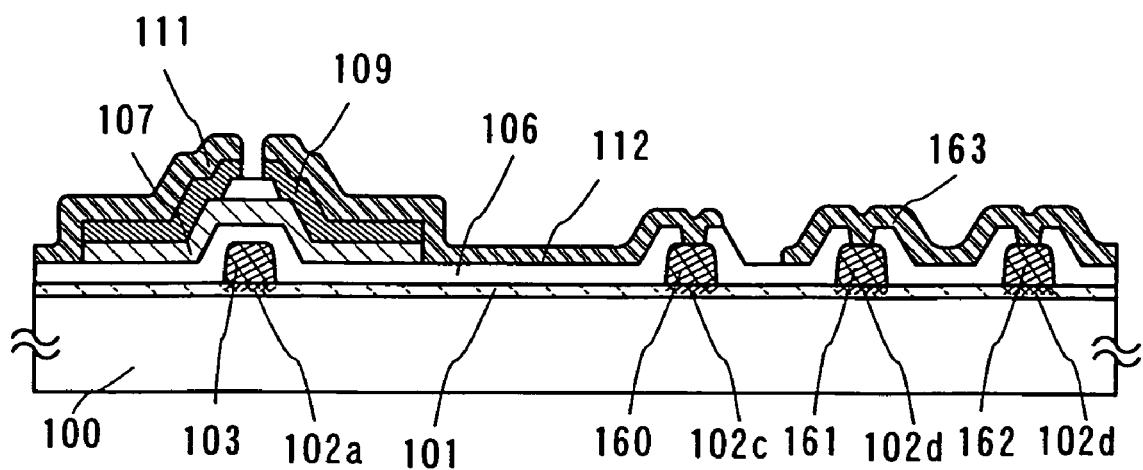
FIG. 16 is a cross sectional view explaining a method for manufacturing a display device according to the invention.

In order to realize such a circuit, TFTs are necessary to be connected to one another. An example of a wiring arrangement in such a case is illustrated in FIG. 16. In FIG. 16, a gate electrode layer 103, a gate insulating layer 106 (formed by laminating an insulating layer 106a made from silicon nitride, an insulating layer 106b made from silicon oxide and an insulating layer 106c made from silicon nitride), a semiconductor layer 107 made from an SAS, an N-type semiconductor layer 109 constituting a source or drain, a source or drain electrode layer 111 and a source or drain electrode layer 112 are formed as well as Embodiment Mode 4. In this case, a connection wiring layer 160, a connection wiring layer 161 and a connection wiring layer 162 are formed over a substrate 100 in the same manner as the gate electrode layer 104. A substance with low adherence property containing a light-absorbing material is formed over the substrate 100. Subject regions on which the gate electrode layer 104, the connection wiring layers 160, 161 and 162 will be formed are subjected to irradiation of laser light having a wavelength which is absorbed by the light-absorbing material. Therefore, these subject regions irradiated with laser light become high adherence regions 102a, 102b, 102c and 102d in comparison with the peripheral region. The gate insulating layer is partly etched to expose the connection wiring layers 160, 161 and 162. TFTs are appropriately connected to each other by the source or drain electrode layers 111 and 112 and the connection wiring layer 163 formed in the same step as the source or drain electrode layers so that various kinds of circuits can be realized.

Embodiment Mode 6

A method for mounting a driver circuit over the display panel manufactured according to Embodiment Modes 4 to 7 will be described.

A display device employing COG technique will first be described with reference to FIG. 15A. A pixel portion 2701 for displaying information such as a character or an image is provided over a substrate 2700. A substrate over which a plurality of driver circuits are provided is divided into rectangular shapes. The divided driver circuits (also denoted by driver ICs) 2751 are mounted over the substrate 2700. FIG. 15A shows a case in which FPCs 2750 are mounted on the ends of the plural driver ICs 2751. Alternatively, one side of the divided driver IC may be set to be almost the same as the length of the side of the pixel portion along the driver IC, and a tape may be attached to the end of one driver IC.

Meanwhile, TAB technique may be employed. In this case, a plurality of tapes may be attached to the substrate and the driver ICs may be attached to the tapes as shown in FIG. 15B. In the same manner as COG technique, one driver IC may be attached to a tape. In this case, a metal piece or the like for fixing the driver IC may also be attached to the tape from a viewpoint of strength.

In order to improve the productivity, a plurality of driver ICs, which will be mounted over display panels, are preferably formed on a rectangular substrate having 300 to 1,000 mm on a side.

That is, a plurality of circuit patterns each including a driver circuit portion and an input/output terminal as a unit may be formed over a substrate and then be divided from one another. In consideration of the length of one side of the pixel portion or a pixel pitch, rectangular driver ICs each having a long side of 15 to 80 mm and a short side of 1 to 6 mm may be formed. Alternatively, driver ICs each having the sum of one side of a pixel portion and one side of each driver circuit may be formed.

The advantage of an outside dimension of the driver ICs with respect to IC chips is a length of a long side. When using driver ICs each having a long side of 15 to 80 mm, the number of the driver ICs required for attaching them according to a pixel portion can be lower as compared with the case of using IC chips, thereby increasing the manufacturing yield. When the driver ICs are formed over a glass substrate, the shape of a mother substrate is not limited, and hence, the productivity is not impaired. This is very advantageous point as compared with the case of forming IC chips using a circular silicon wafer.

When a scanning line driver circuit 3702 is formed over a substrate 3700 as shown in FIG. 33B, driver ICs on which signal line driver circuits are formed are mounted on a region outside of a pixel portion 3701. These driver ICs are signal line driver circuits. In order to form a pixel portion corresponding to RGB full color, 3,027 signal lines are required in a XGA class whereas 4,800 signal lines are required in an UXGA class. Such signal lines are separated into several blocks at the end of the pixel portion 3701 to form leading lines. The leading lines are gathered in accordance with a pitch of an output terminal of each driver IC.

The driver ICs are preferably formed by using a crystalline semiconductor formed over a substrate. The crystalline semiconductor is preferably formed by being irradiated with continuous wave laser light. Therefore, an oscillator for generating laser light uses a continuous wave solid state laser or gas laser. By using a continuous wave laser, a transistor can be formed with less crystal defect by using a polycrystalline semiconductor layer having a large grain size. Since the mobility and the response speed are favorable, this transistor can be driven at higher speed so that the operating frequency of an element can be increased as compared with the conventional transistor. In addition, this transistor has less characteristic variation, thereby providing a high reliability. Further, in order to further increase the operating frequency, a channel length direction of this transistor may correspond to a scanning direction of laser light. In a laser crystallization step using the continuous wave laser, the highest mobility can be obtained in the case where the channel length direction of the transistor is approximately parallel (preferably, −30° C. or more and 30° C. or less) to the scanning direction of laser light with respect to a substrate. Furthermore, the channel length direction corresponds to a direction of flowing current, or, a direction of moving charge in a channel formation region. The thus-manufactured transistor has an active layer including a polycrystalline semiconductor layer in which the crystal grain extends in a channel direction. This indicates that a crystal grain boundary is approximately formed along the channel direction.

To perform the laser crystallization, laser light is preferably condensed drastically. The width of the laser light (i.e., beam spot) is preferably set to be about 1 mm or more and 3 mm or less that is equal to a width of a short side for the driver IC. In order to secure the efficient energy density with respect to an object, a region to be irradiated by laser light has preferably a linear shape. Further, the term "linear shape" here indicates a rectangular shape or a highly elliptical shape having high aspect ratio, rather than a line in the truest sense. For example, the linear shape indicates a shape having 2 or more (preferably, 10 or more and 10,000 or less) aspect ratio. By matching the width of the shape (beam spot) of laser light with the length of the short side for a driver IC, a method for manufacturing a display device with improved productivity can be provided.

As shown in FIGS. 15A and 15B, driver ICs may be provided as scanning line driver circuits and signal line driver circuits. In this case, the design of the scanning line driver circuits may be differed from the design of the signal line driver circuits.

In a pixel region, signal lines and scanning lines intersect with one another in a matrix form and transistors are placed in each intersection. One feature of the present invention is that TFTs each including an amorphous semiconductor or a semiamorphous semiconductor as a channel portion are used as the transistors arranged in the pixel region. The amorphous semiconductor is formed by plasma CVD, sputtering or the like. The semiamorphous semiconductor can be formed at a temperature of 300° C. or less by plasma CVD. For example, the semiamorphous semiconductor with a necessary thickness for forming a transistor can be formed over a non-alkali glass substrate having a dimension of 550 mm×650 mm at short times. This feature of manufacturing technique is effective in manufacturing a large-size device. By forming a channel formation region using an SAS, a semiamorphous TFT can obtain the electron field-effect mobility of 2 to 10 $cm^2$/V·sec. In addition, since a wiring having a desired shape can be formed with good controllability according to the present invention, a wiring with an extremely narrow channel width can be formed stably without cutting off the wiring. Also, a TFT having a sufficient electric property that is necessary to operate a pixel adequately can be formed. Therefore, this TFT can be used as a switching element of a pixel or an element constituting a scanning line driver circuit. Consequently, a display panel in which a system-on-panel is realized can be manufactured.

A scanning line driver circuit can also be formed over the substrate by using a TFT having a semiconductor layer formed using an SAS. When a TFT having a semiconductor layer formed using an AS is used, the drive ICs may be mounted over a substrate as both a scanning line driver circuit and a signal line driver circuit.

In this case, the design of the driver IC used as the scanning line driver circuit is preferably differed from the design of the driver IC uses as the signal line driver circuit. For example, although the withstand pressure of approximately 30 V is required for a transistor constituting a scanning line driver IC, a driving frequency of 100 kHz or less is also required, and therefore, high-speed operation is not relatively required. Accordingly, it is preferable that the channel length (L) of the transistor constituting the scanning line driver IC be set to be sufficiently long. On the other hand, although the transistor of the signal line driver IC requires the withstand pressure of only about 12 V, it requires a driving frequency of about 65 MHz at 3V, and therefore, high-speed operation is required. Accordingly, the channel length of a transistor constituting a driver is preferably set to be in micrometer unit. According to the present invention, a microscopic pattern can be formed by using laser light, it can be formed in the micrometer unit.

The method for mounting driver ICs is not particularly limited, and the known COG technology, wire bonding technology, or TAB technology can be used.

By adjusting the thickness of a driver IC to the thickness of a counter substrate, the height of the driver IC is approximately equal to the height of the counter substrate, thereby contributing to the reduction in thickness of a display device as a whole. Also, by forming respective substrates using a same material, heat stress is not generated even when a temperature of the display device is changed and the characteristics of a circuit manufactured using a TFT are not impaired. Additionally, by forming driver circuits using longer driver ICs than IC chips as shown in this embodiment mode, the number of the driver ICs mounted on one pixel portion can be reduced.

As mentioned above, the driver circuits can be incorporated into a display panel.

Embodiment Mode 7

Structures of pixels for a display panel shown in this embodiment mode will be described with reference to equivalent circuit diagrams illustrated in FIGS. 17A to 17F.

Figure 17A:
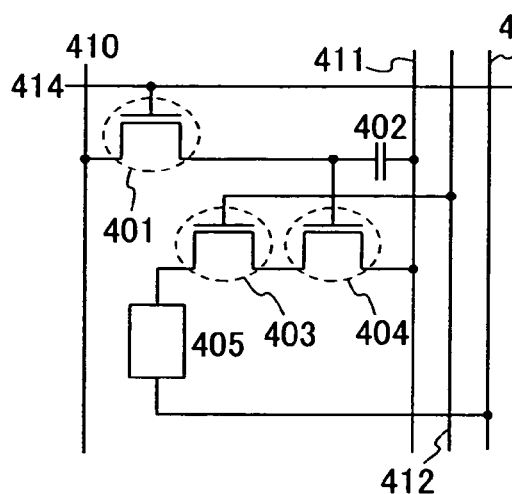
FIGS. 17A to 17F are circuit diagrams explaining structures of pixels that can be applied to an EL display panel of the invention.

In a pixel as shown in FIG. 17A, a signal line 410 and power supply lines 411 to 413 are arranged in columns, whereas a scanning line 414 is arranged in a row. The pixel also includes a switching TFT 401, a driving TFT 403, a current controlling TFT 404, a capacitor element 402 and a light emitting element 405.

Figure 17B:
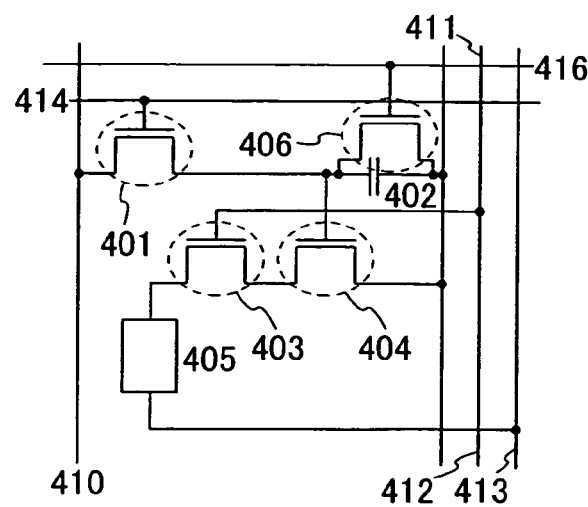
Figure 17C:
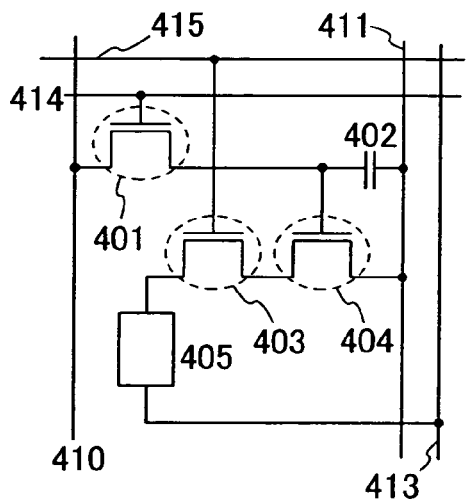

A pixel as shown in FIG. 17C has the same structure as the one shown in FIG. 17A, except that a gate electrode of the driving TFT 403 is connected to a power supply line 415 that is arranged in a row. That is, both pixels depicted in FIGS. 17A and 17C show same equivalent circuit diagrams. However, respective power supply lines are formed of conductive layers in different layers between the cases where the power supply line 412 is arranged in a column (FIG. 17A) and where the power supply line 415 is arranged in a row (FIG. 17C). In order to emphasis on the different arrangements of the power supply lines to which the gate electrodes of the driving TFTs 403 are connected, the equivalent circuit diagrams are individually illustrated in FIGS. 17A and 17C.

In each FIGS. 17A and 17C, the driving TFT 403 and the current controlling TFT 404 are connected in series in each pixel, and the channel length $L_3$ and the channel width $W_3$ of the driving TFT 403 and the channel length $L_4$ and the channel width $W_4$ of the current controlling TFT 404 are set to satisfy the relation as follows: $L_3/W_3:L_4/W_4=5$ to 6000:1. For example, when $L_3$, $W_3$, $L_4$, and $W_4$ are set to be 500 µm, 3 µm, 3 µm and 100 µm, respectively, they satisfies 6000:1. Since a wiring can be formed to have a predetermined shape with good controllability according to the present invention, such a thin wiring having a channel width ($W_3$) of 3 µm can be formed stably without breaking the wiring. Accordingly, a TFT having electronic characteristics that are required for sufficiently functioning the pixels as shown in FIGS. 17A and 17C can be formed, thereby manufacturing a display device with an excellent display function along with high reliability.

The driving TFT 403 is operated in a saturation region and controls the amount of current flowing through the light emitting element 405, whereas the current controlling TFT 404 is operated in a linear region and controls a current supplied to the light emitting element 405. The both TFTs 403 and 404 preferably have a same conductivity type in view of the manufacturing process. For the driving TFT 403, a depletion type TFT may be used instead of an enhancement type TFT. According to the invention having the above structure, slight variations in VGS of the current controlling TFT 404 does not adversely affect the amount of current flowing through the light emitting element 405, since the current controlling TFT 404 is operated in a linear region. That is, the amount of current flowing through the light emitting element 405 is determined by the driving TFT 403 operated in the saturation region. Accordingly, it is possible to provide a display device in which image quality is improved by improving variations in luminance of the light emitting element due to variation of the TFT characteristics.

The switching TFT 401 of each pixel as shown in FIGS. 17A to 17D controls a video signal input to the pixel. When the switching TFT 401 is turned on and a video signal is input in the pixel, the video signal is held in the capacitor element 402. Although the arrangements in which each pixel includes the capacitor element 402 are shown in FIGS. 17A and 17C, the invention is not limited to these arrangements. When a gate capacitance or the like can serve as a capacitor for holding a video signal, the capacitor element 402 may not be provided.

The light emitting element 405 has a structure in which an electroluminescent layer is sandwiched between a pair of electrodes. A potential difference is maintained between a pixel electrode and a counter electrode (i.e., between an anode and a cathode) such that a forward bias voltage is applied. The electroluminescent layer is formed of various kinds of materials such as an organic material and an inorganic material. Luminescence in the electroluminescent layer includes luminescence that is generated when an excited singlet state returns to a ground state (fluorescence) and luminescence that is generated when an exited triplet state returns to a ground state (phosphorescence).

Figure 17D:
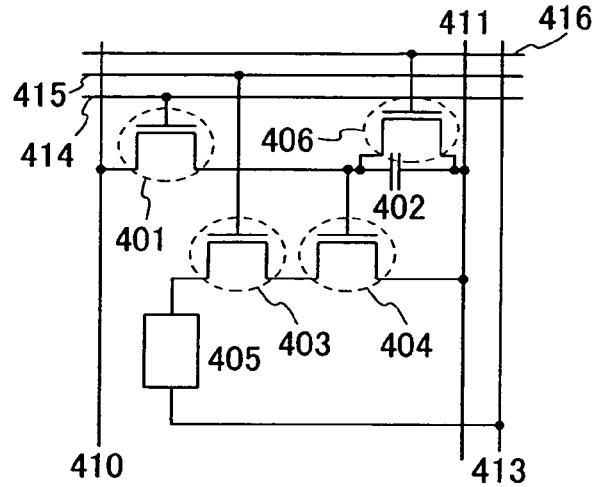

A pixel as shown in FIG. 17B has the same structure as the one shown in FIG. 17A, except that a TFT 406 and a scanning line 416 are added thereto. Similarly, a pixel as shown in FIG. 17D has the same structure as the one shown in FIG. 17C, except that a TFT 406 and a scanning line 416 are added thereto.

The TFT 406 is controlled to be turned on/off by the newly provided scanning line 416. When the TFT 406 is turned on, charges held in the capacitor element 402 are discharged, thereby turning the TFT 404 off. That is, supply of current flowing through the light emitting element 405 can be forcibly stopped by providing the TFT 406. Therefore, a lighting period can start simultaneously with or immediately after a writing period starts before signals are written into all the pixels according to the structures shown in FIGS. 17B and 17D, and hence, the duty ratio can be improved.

Figure 17E:
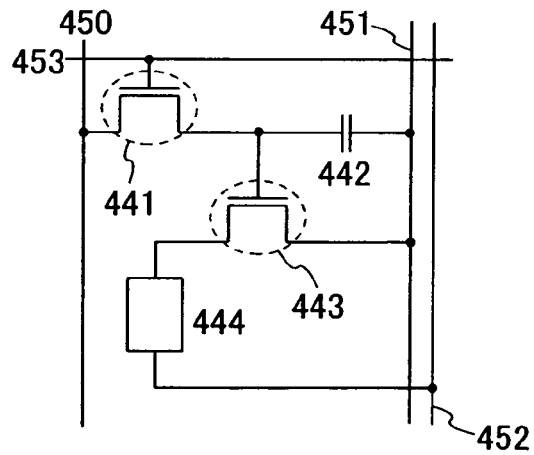
Figure 17F:
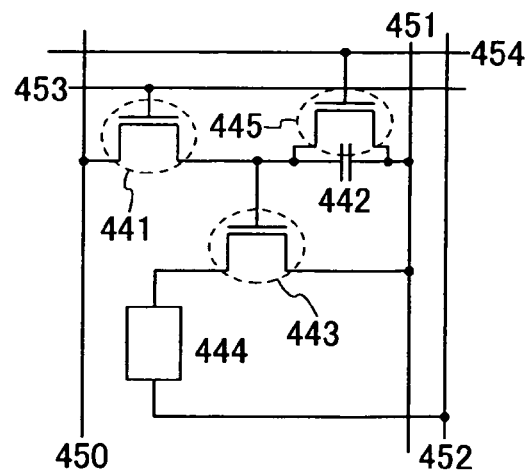

In a pixel as shown in FIG. 17E, a signal line 450 and power supply lines 451 and 452 are arranged in columns while a scanning line 453 is arranged in a row. The pixel further includes a switching TFT 441, a driving TFT 443, a capacitor element 442 and a light emitting element 444. A pixel shown in FIG. 17F has the same structure as the one shown in FIG. 17E, except that a TFT 445 and a scanning line 454 are added. Further, the structure as shown in FIG. 17F also allows a duty ratio to be improved by providing the TFT 445.

According to the present invention, a wiring or the like can be formed stably with good controllability, which results in a TFT having excellent electronic characteristics and high reliability. The present invention can be applicable to an applied technology for improving a displaying function of a pixel in accordance with an intended purpose.

Embodiment Mode 8

Figure 24:
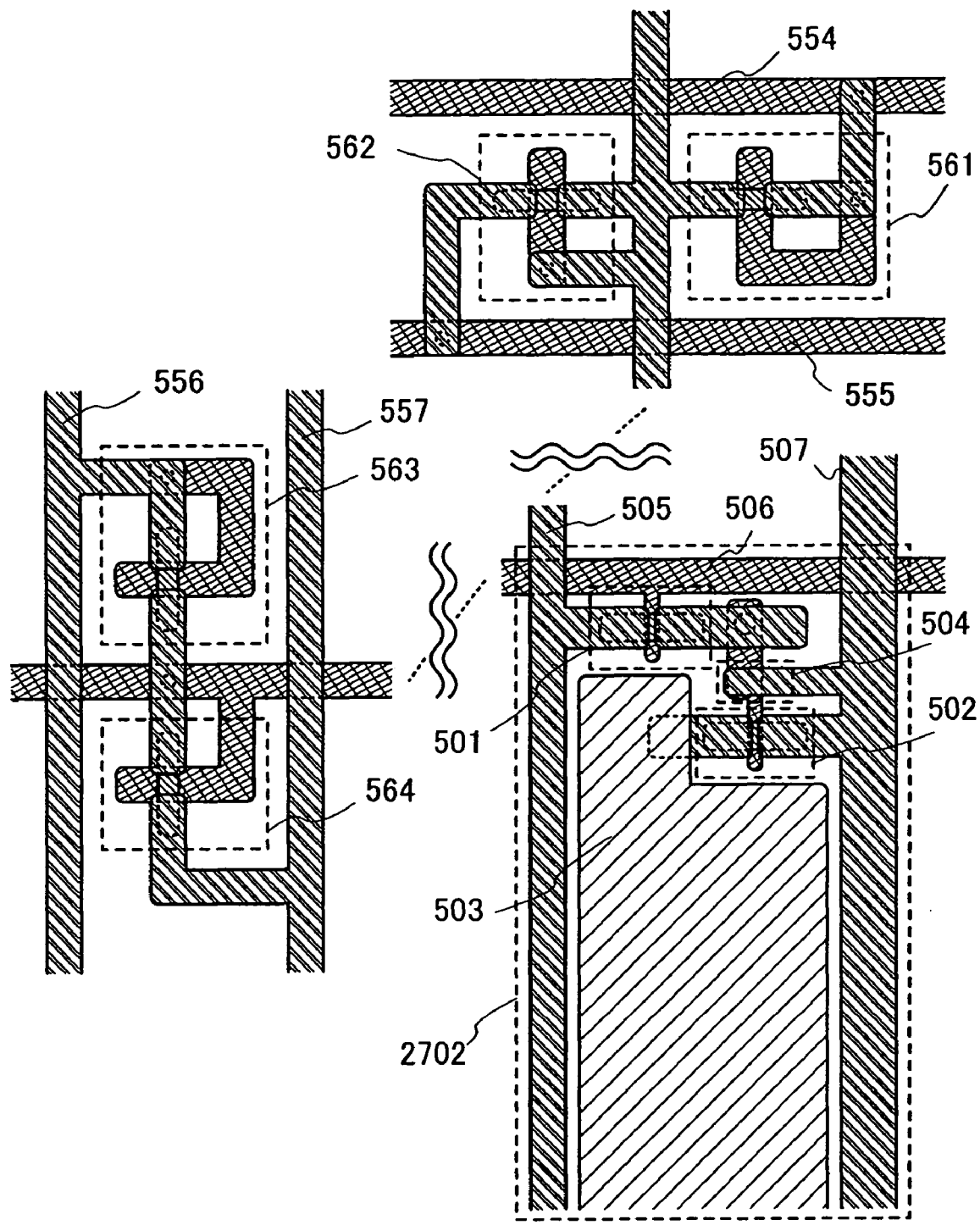
FIG. 24 is a top view explaining an EL display panel according to the invention.

Another embodiment mode in which protective diodes are provided in both a scanning line input terminal portion and a signal line input terminal portion will be described with reference to FIG. 24. In FIG. 24, TFTs 501, 502, a capacitor element 504 and a light emitting element 503 are provided in a pixel 2702. The TFTs have the identical structure as the one as shown in Embodiment Mode 2.

Figure 23:
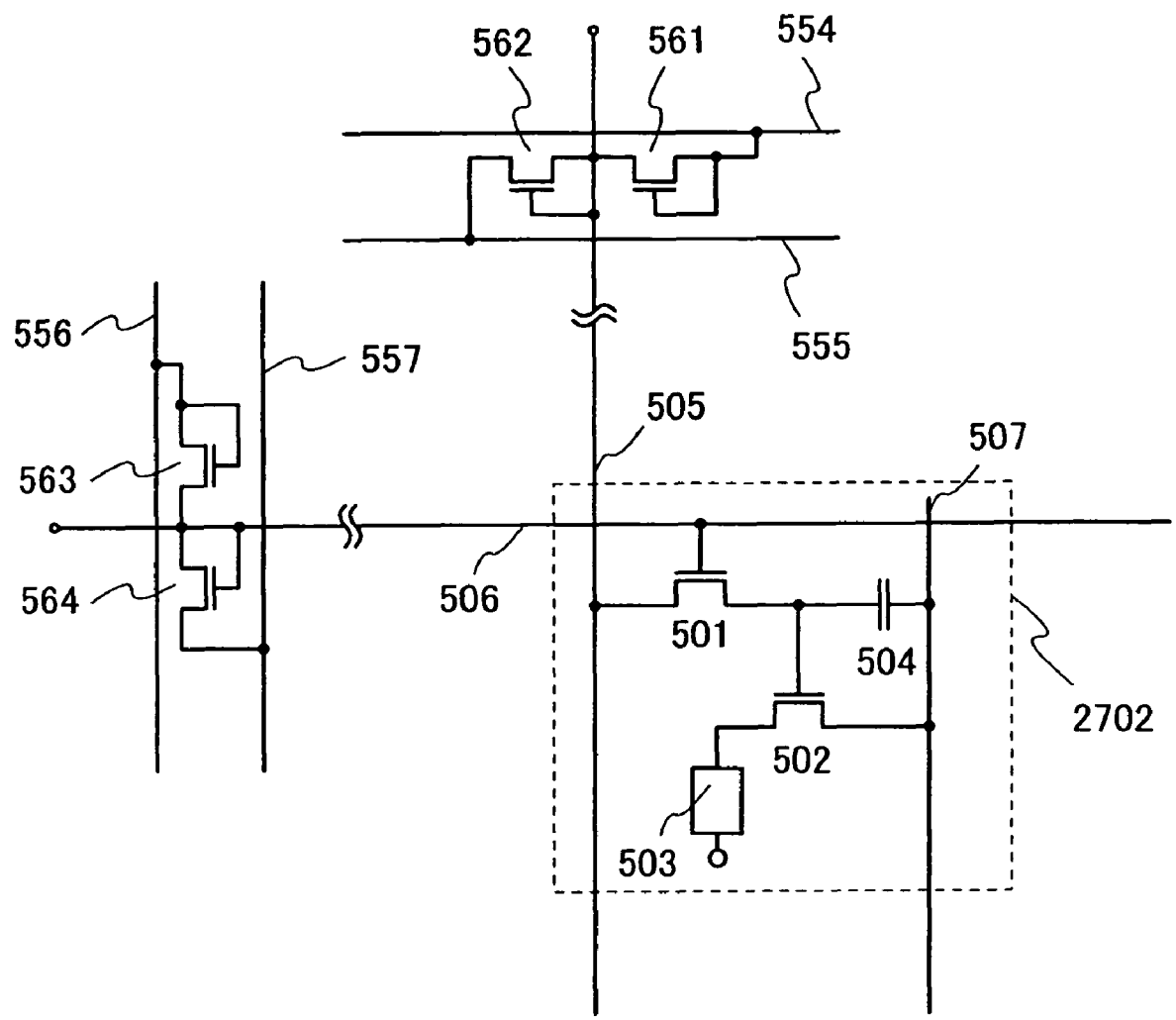
FIG. 23 is an equivalent circuit diagram explaining an EL display panel as shown in FIG. 24.

Protective diodes 561 and 562 are provided in the signal line input terminal portion. These protective diodes are manufactured in the same step as the TFT 501 or 502. The protective diodes 561 and 562 are operated as diodes by connecting a gate to a drain or a source. FIG. 23 shows an equivalent circuit diagram of a top view shown in FIG. 24.

The protective diode 561 includes a gate electrode layer, a semiconductor layer and a wiring layer. The protective diode 562 has the same structure. Common potential lines 554 and 555 connecting to the protective diodes are formed in the same layer as the gate electrode layer. Therefore, it is necessary to form a contact hole in a gate insulating layer such that each common potential line is electrically connected to the wiring layer.

To form the contact hole, a mask layer may be formed on the gate insulating layer and then etched. When the gate insulating layer is etched under an atmospheric pressure discharging condition, a local discharge processing can be carried out without forming a mask layer over the entire surface of a substrate.

A signal wiring layer is formed in the same layer as a source or drain wiring layer 505 in the TFT 501 and is connected to a source or drain of the source or drain wiring layer.

A scanning signal line input terminal portion has a similar structure. The protective diodes provided in an input stage can be formed at the same time. Further, the position of inserting a protective diode is not limited to this embodiment mode and can be also provided between a driver circuit and a pixel.

According to the present invention, a wiring and the like can be formed stably with good controllability. Therefore, in the case where wirings and the like are formed intricately and densely by providing a protective circuit, a short-circuit and the like due to an arrangement failure are not caused. In addition, a large margin is not necessary to be provided, a device can be miniaturized sufficiently. Consequently, a display device with an excellent electronic characteristics and high reliability can be manufactured.

Embodiment Mode 9

Figure 22:
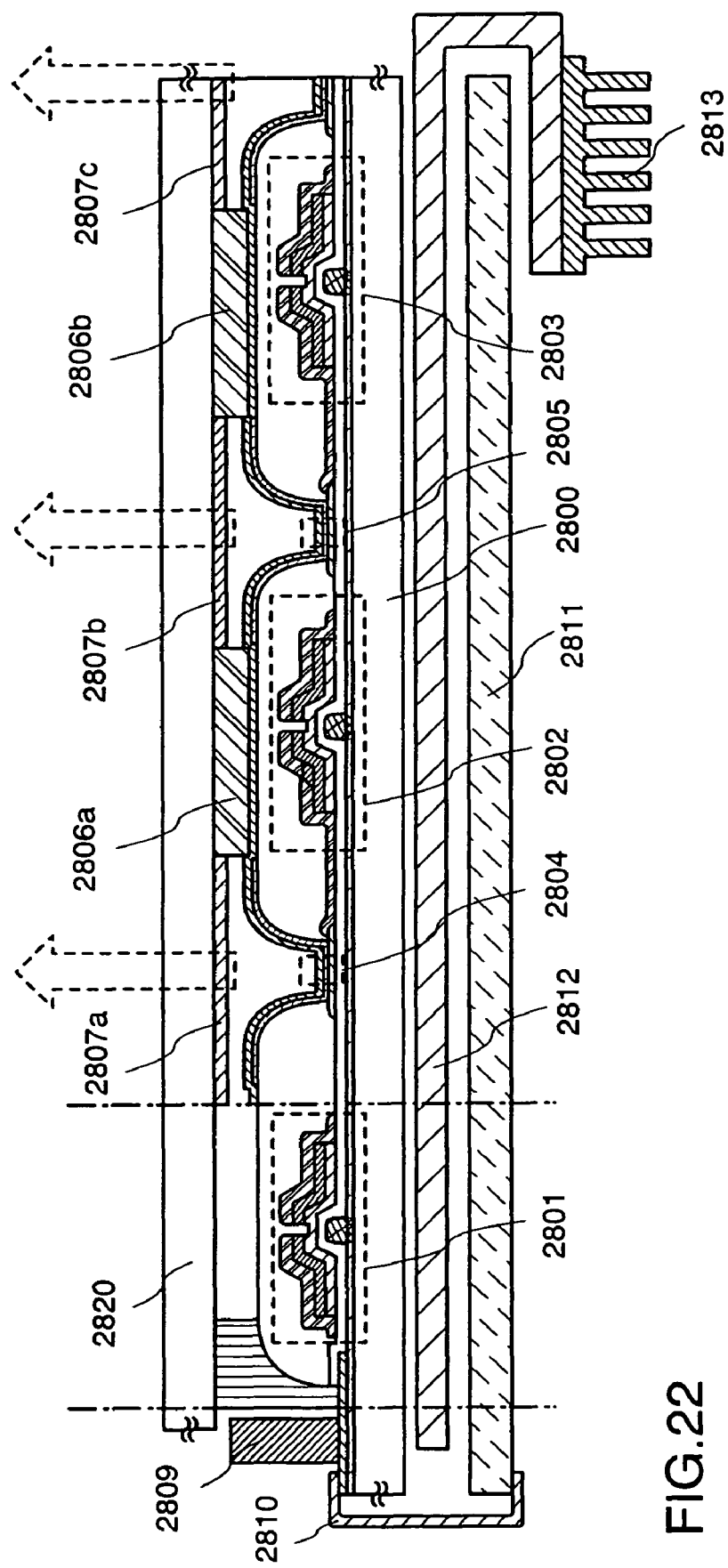
FIG. 22 is a cross sectional view explaining a structural example of an EL display module according to the invention.

FIG. 22 shows an example of a structure of an EL display module formed by using a TFT substrate 2800 manufactured according to the present invention. In FIG. 22, a pixel portion including pixels is formed over the TFT substrate 2800.

In FIG. 22, a protective circuit portion 2801 including a TFT that is same as one formed in a pixel or a diode in which a gate and a source or drain of the TFT are connected to each other is provided between a driver circuit and the pixel and outside of the pixel portion. A driver IC formed of a single crystal semiconductor, a stick driver IC formed of a polycrystalline semiconductor film over a glass substrate, a driver circuit formed using an SAS, or the like is applied as a driver circuit 2809.

The TFT substrate 2800 is firmly attached to a sealing substrate 2820 while sandwiching spacers 2806a and 2806b, which are formed by the droplet discharge method, therebetween. The spacers are preferably provided to keep a constant gap between the two substrates, even when the substrates are thin and an area of the pixel portion is increased. A resin material having a light transmitting property may be filled in the gap between the TFT substrate 2800 and the sealing substrate 2820, over light emitting elements 2804 and 2805 and then be cured. Alternatively, the gap therebetween may be filled with anhydrous nitrogen or an inert gas.

FIG. 22 shows a case where the light emitting elements 2804 and 2805 have a top emission type structure, wherein light is emitted in a direction indicated by arrows as illustrated in the drawing. By forming pixels having different luminescent colors of red, green and blue, multicolor display can be carried out. In addition, color purity of light emitted to the outside can be increased by forming colored layers 2807a, 2807b and 2807c corresponding to each color over the sealing substrate 2820. Alternatively, the pixels may be formed as white light emitting elements in combination with the colored layers 2807a, 2807b and 2807c.

The driver circuit 2809 is connected to a scanning line or a signal line connection terminal provided in an edge of the TFT substrate 2800 with a wiring substrate 2810. Alternatively, a heat pipe 2813 and a radiator plate 2812 may be provided to be in contact with or adjacent to the TFT substrate 2800 so as to enhance the effect of heat release.

Although a top emission EL module is shown in FIG. 22, a bottom emission structure or a dual emission structure in which light is emitted upward and downward may also be employed by changing the structure of a light emitting element or the arrangement of an external circuit substrate. In the case of the top emission structure, an insulating layer serving as a partition wall may be colored to be uses as a black matrix. This partition wall can be formed by the droplet discharge method. For example, it can be formed by mixing a black pigment resin, a carbon black or the like into a resin material such as polyimide. Further, a lamination of the partition walls may also be used.

Alternatively, a resin film may be attached to the TFT substrate 2800 using a sealing material or an adhesive resin so as to seal the pixel portion formed over the TFT substrate 2800. Although the pixel portion is sealed using a glass substrate in this embodiment mode, it can be sealed using various materials such as a resin, plastic and a film. A gas barrier film is preferably formed on the surface of the resin film to prevent moisture vapor from penetrating therethrough. By sealing the pixel portion with the resin film, a display device can be made thinner and lighter.

Embodiment Mode 10

A television device can be manufactured by using a display device formed according to the present invention. There are many types of display panels in which only a pixel portion is formed over a substrate as shown in FIG. 33A and a scanning line driver circuit and a signal line driver circuit are attached to the substrate by the TAB technology as shown in FIG. 15B; in which a TFT is formed of an SAS, a pixel portion and a scanning line driver circuit are formed over a substrate, and a signal line derive circuit is separately attached to the substrate as a driver IC as shown in FIG. 33B; in which a pixel portion, a signal line driver circuit and a scanning line driver circuit are formed over a substrate as shown in FIG. 33C; or the like. Any types of display panels may be used.

In addition, a structure of an external circuit may include a video signal amplifier circuit which amplifies a video signal among signals received by a tuner, a video signal processing circuit which converts signals output from the video signal amplifier circuit into chrominance signals corresponding to respective colors of red, green and blue, a control circuit which converts the video signal into an input specification of a driver IC, and the like on an input side of a video signal. The control circuit outputs signals to both a scanning line side and a signal line side. In the case of digital driving, a signal dividing circuit may be provided in the signal line side and an input digital signal may be divided into m parts to be supplied.

An audio signal among signals received by the tuner is sent to an audio signal amplifier circuit and is supplied to a speaker through an audio signal processing circuit. A control circuit receives control information about a receiving station (reception frequency) or sound volume from an input portion and transmits signals to the tuner and the audio signal processing circuit.

Figure 30:
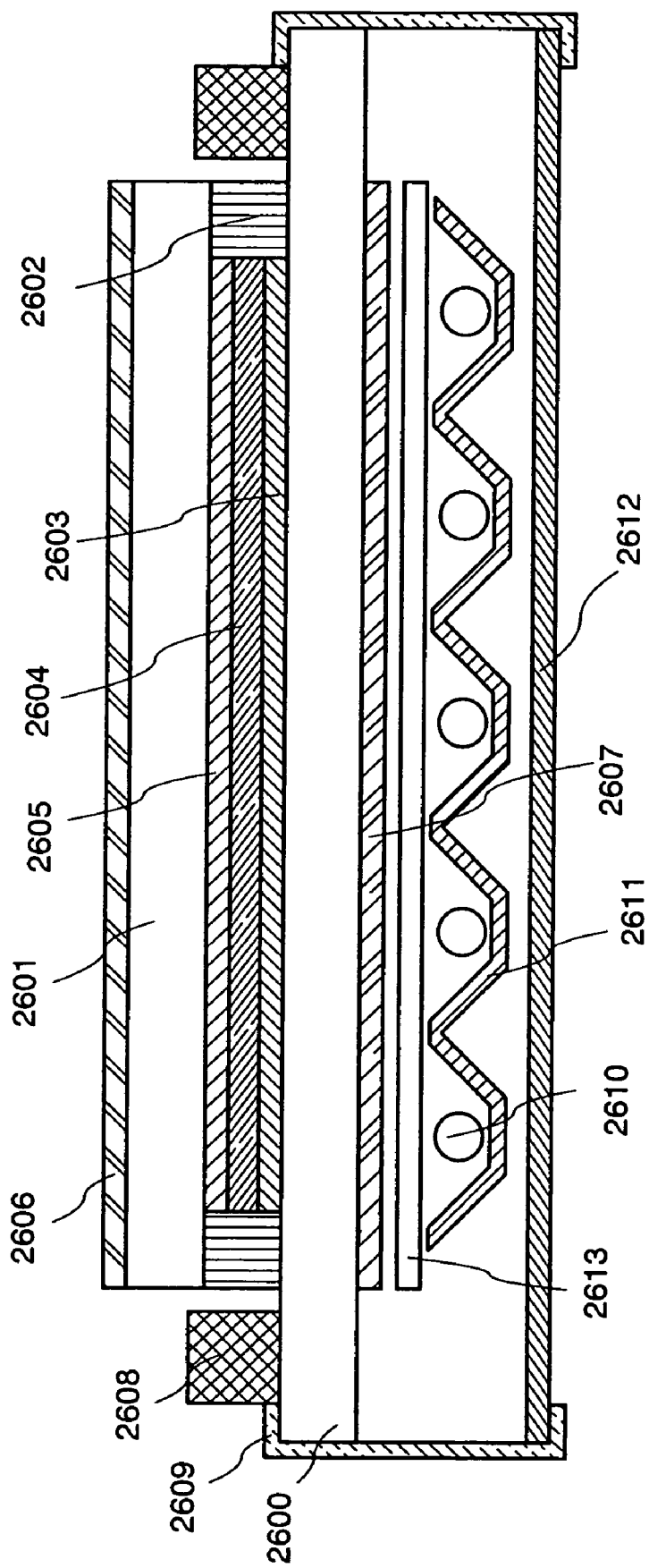
FIG. 30 is a cross sectional view explaining a structural example of a liquid crystal display module according to the invention.

FIG. 30 shows an example of a liquid crystal display module, wherein a TFT substrate 2600 and a counter substrate 2601 are attached to each other with a sealing material 2602, and a pixel portion 2603 and a liquid crystal layer 2604 are provided therebetween to form a display region. A colored layer 2605 is required to display a color image. In the case of the RGB method, colored layers corresponding to red, green and blue are provided in each pixel. Polarizing plates 2606, 2607, and a lens film 2613 are disposed outside of the TFT substrate 2600 and the counter substrate 2601. A light source includes a cold-cathode tube 2610 and a reflecting plate 2611. A circuit substrate 2612 is connected to the TFT substrate 2600 by a driver circuit 2608 and a flexible wiring substrate 2609, wherein an exterior circuit such as a control circuit and a power supply circuit is incorporated therein.

Figure 20A:
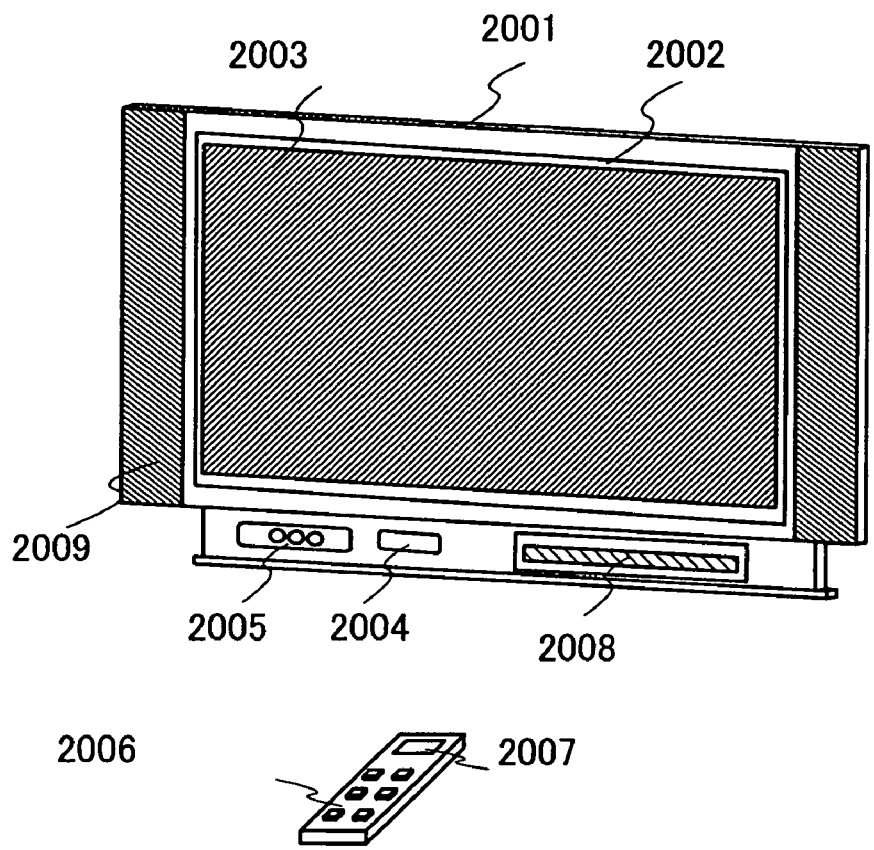
FIGS. 20A and 20B are diagrams showing electronic appliances according to the invention.
Figure 20B:
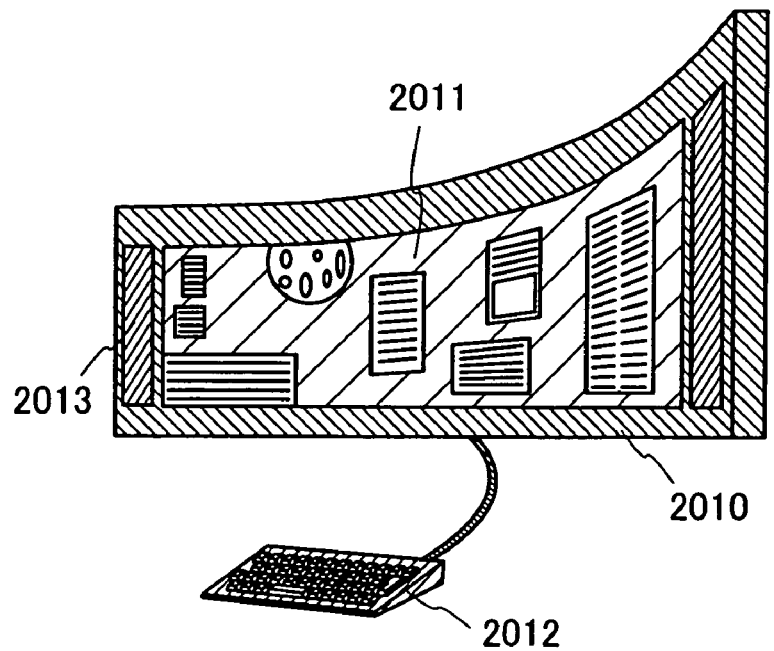

A television device can be completed by incorporating a display module into a housing as shown in FIGS. 20A and 20B. When an EL display module as shown in FIG. 22 is used, an EL television device can be achieved. When using a liquid crystal display module as shown in FIG. 30, a liquid crystal television can be obtained. A main display screen 2003 is formed by using the display module, and speaker portions 2009, an operation switch, and the like are provided as its accessory equipment. Thus, a television device can be completed according to the present invention.

Figure 19:
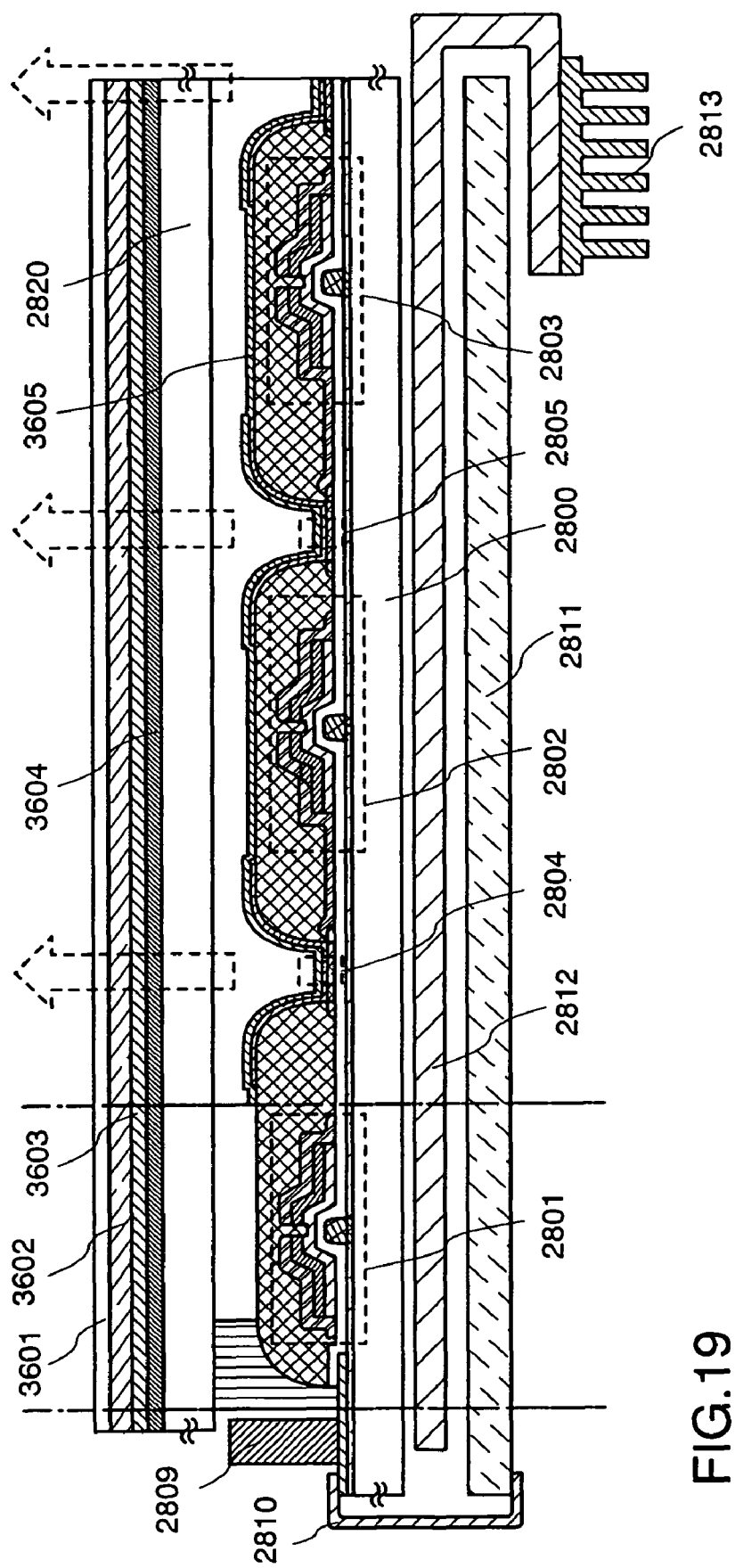
FIG. 19 is a cross sectional view explaining a structural example of an EL display module according to the invention.

In addition, in a television device as shown in FIG. 19, reflected light of light entering from the outside may be blocked by using a retardation plate and a polarizing plate. FIG. 19 shows a top emission structure in which an insulating layer 3605, which will be a partition wall, is colored to be used as a black matrix. This partition wall can be formed by the droplet discharging method. The partition wall may be made using a resin material such as polyimide mixed with carbon black etc. A lamination layer thereof may also be used. Different kinds of materials may be discharged in a same region at several times by the droplet discharging method to form the partition wall. In the embodiment mode, a black pigment resin is employed. As retardation plates 3603 and 3604, $\lambda/4$ and $\lambda/2$ plates may be used to control light. A TFT substrate 2800, a light emitting element 2804, a sealing substrate (sealing member) 2820, the retardation plates 3603, 3604 ($\lambda/4$ and $\lambda/2$ plates), and a polarizing plate 3602 are sequentially laminated. Light generated in the light emitting element is emitted to the outside portion through the polarizing plate. The retardation plates and polarizing plate may be disposed in a side through which light is emitted. In the case of a dual-emission type display device, which emits light both upward and downward, retardation plates and polarizing plates can be provided over both surfaces of the display device. In addition, antireflection films 3601 may be provided on the outer sides of the polarizing plates. According to this structure, more high-definition images can be displayed.

As shown in FIG. 20A, a display panel 2002 using a display element is incorporated in a housing 2001 and a receiver 2005 is connected to a communication network by wired or wireless connections via a modem 2004 to receive general TV broadcast so that one-way (from a sender to a receiver) or two-way (between a sender and a receiver or between receivers) information communication can be carried out. The television device can be operated by using a switch built in the housing or a remote control unit 2006. Also, a display portion 2007 for displaying output information may also be provided in the remote control unit.

Further, the television device may include a sub screen 2008 formed using a second display panel to display channels, volume, and the like, in addition to the main screen 2003. In this structure, the main screen 2003 may be formed by using an EL display panel having wide viewing angle and the sub screen may be formed by using a liquid crystal display panel capable of displaying images at lower power consumption. Or, in order to reduce the power consumption preferentially, the main screen 2003 may be formed by using a liquid crystal display panel capable of displaying at lower power consumption and the sub screen may be formed by using an EL display panel having wide view angle, which can be switched on/off. According to the present invention, a highly reliable display device can be formed even when a large size substrate is used and a large number of TFTs or electronic parts are used.

FIG. 20B shows a television device having a display portion with a size of 20 to 80 inches. The television device includes a housing 2010, a keyboard portion 2012 that is an operation portion, a display portion 2011, speakers 2013 and the like. The present invention is applied to the display portion 2012. Since the display portion of FIG. 20B is formed using a flexible substance, this television device has a curved display portion. Since the shape of the display portion can be designed freely in such a manner, a television device with a predetermined shape can be manufactured.

By using the present invention, the manufacturing process can be simplified. Also, a display panel can be manufactured easily using a glass substrate of the fifth generation or later with 1,000 mm on a side.

According to the present invention, a composition of a display device having a predetermined shape can be formed with good controllability with minimum loss of materials, thereby reducing the cost. Accordingly, a thin television device having a large size display screen manufactured according to the invention can be formed at low cost. In addition, formation defects are not caused even if wirings and the like are densely formed. Consequently, a high-performance, highly reliable television device can be manufactured with high yield.

Of course, the invention is not limited to the television device, and can be applied to various use applications, e.g., a large-size display medium such as an information display board in a train station, an airport, and the like, or an advertisement display board on the street, as well as a monitor of a personal computer.

Embodiment Mode 11

According to the invention, various kinds of display devices can be manufactured. Namely, various kinds of electronic appliances can be manufactured by incorporating such display devices of the invention to display portions of the electronic appliances.

Examples of the electronic appliances include: a camera such as a video camera and a digital camera; a projector; a head-mounted display (a goggle type display); a car navigation system; a car audio; a personal computer; a game machine; a portable information terminal (such as a mobile computer, a cellular telephone, a portable game machine and an electronic book); an image reproduction device provided with a recording medium (concretely, a device which can reproduce the recording medium such as a digital versatile disc (DVD) and display images thereof); and the like. Specific examples thereof are shown in FIGS. 21A and 21D.

Figure 21A:
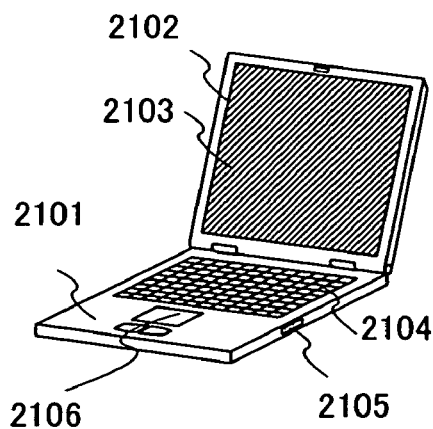
FIGS. 21A to 21D are diagrams showing electronic appliances according to the invention.

FIG. 21A shows a personal laptop computer, which includes a main body 2101, a housing 2102, a display portion 2103, a keyboard 2104, an external connection port 2105, a pointing mouse 2106, and the like. The display portion 2103 can be manufactured according to the invention. According to the invention, a highly reliable, high-quality image can be displayed on the display portion even if the personal computer is miniaturized and a wiring and the like are formed precisely.

Figure 21B:
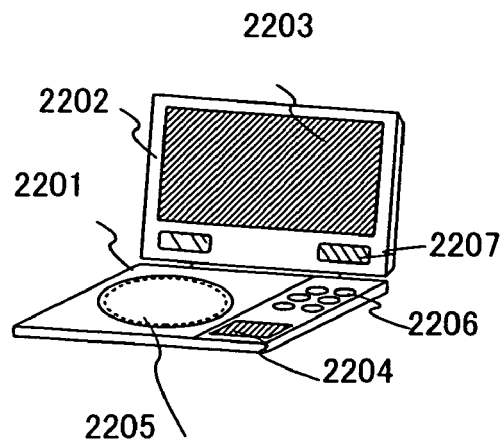

FIG. 21B shows an image reproduction device comprising a recording medium (specifically, a DVD reproducing device), which includes a main body 2201, a housing 2202, a display portion A 2203, a display portion B 2204, a recording medium (a DVD and the like) reading portion 2205, operation keys 2206, speaker portions 2207, and the like. The display portion A 2203 mainly displays image information, while the display portion B 2204 mainly displays character information. These display portion A 2203 and display portion B 2204 can be manufactured according to the invention. According to the invention, a highly reliable, high-quality image can be displayed on the display portions even if the image reproduction device is miniaturized and a wiring and the like are formed precisely.

Figure 21C:
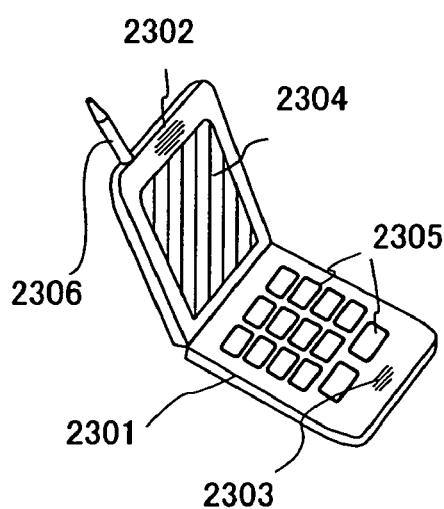
Figure 21D:
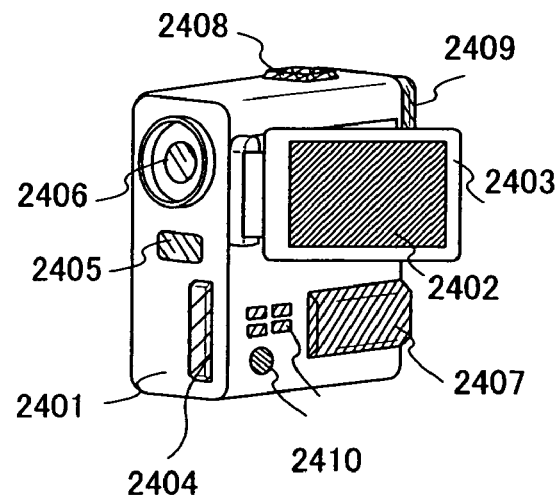

FIG. 21C shows a cellular phone, which includes a main body 2301, an audio output portion 2302, an audio input portion 2303, a display portion 2304, operation switches 2305, an antenna 2306, and the like. According to the invention, a highly reliable, high-quality image can be displayed on the display portion even if a cellular phone is miniaturized and a wiring and the like are formed precisely.

FIG. 21D shows a video camera, which includes a main body 2401, a display portion 2402, a housing 2403, an external connection port 2404, a remote control receiver 2405, an image receiving portion 2406, a battery 2407, an audio input portion 2408, an eye piece portion 2409, operation keys 2410, and the like. The invention can be applied to the display portion 2402. According to the invention, a highly reliable, high-quality image can be displayed on the display portion 2402 even if a video camera is miniaturized and a wiring and the like are formed precisely. The present embodiment mode can be freely combined with the above described embodiment modes.

The present invention is further applied to a semiconductor device. A semiconductor device manufactured according to the invention is used for various purposes. For example, ID chips that are one mode of the semiconductor devices according to the invention can be used for bills, coins, portfolios, documents, bearer bond certificates, packing containers, books, recording mediums, personal belongings, carriages, foods, clothes, health goods, livingwares, medicals, electronic devices and the like. Moreover, the present invention can be used for a processor chip that is an aggregate having various signal processing functions.

Embodiment 1

Advantageous effects of the present invention will be described based on experimental results in this embodiment.

Figure 34A:
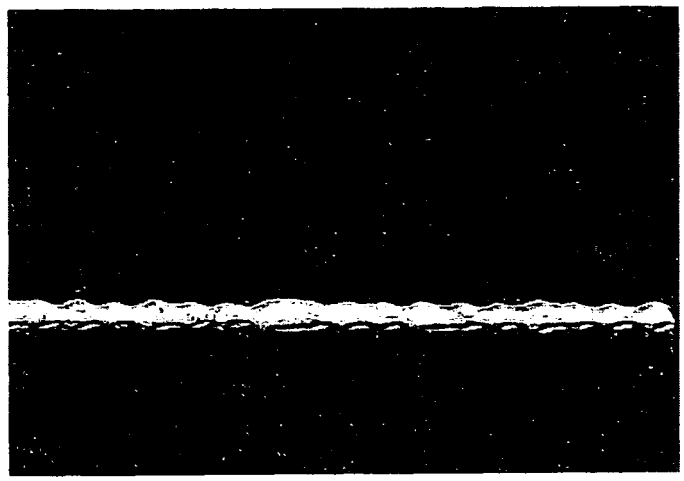
FIGS. 34A to 34D show microscope photographs of a silver wiring manufactured according to Embodiment 1.
Figure 34B:
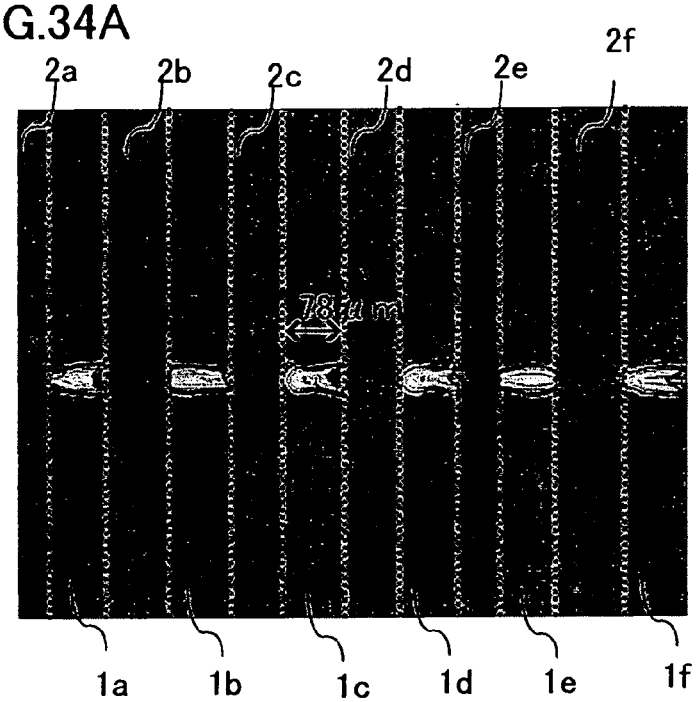
Figure 34C:
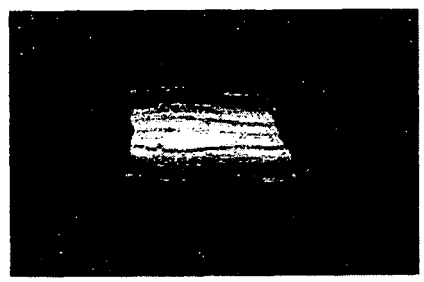
Figure 34D:

As described in Embodiment Mode 1, a substance with low adherence property was formed over a substrate. In this embodiment, a light-absorbing material was added to the substance with low adherence property. FAS, which is a silane coupling agent, was used as the low adherence property and rhodamine B, which is a pigment, was used as the light-absorbing material. The FAS and rhodamine B were diluted with a solvent of isopropyl alcohol to form a composition with low adherence property. This composition with low adherence property was applied over the substrate by spin coating. Since a $YVO_4$ laser with a wavelength of 532 nm was used, the rhodamine B that is a pigment having an absorption band in a 532 nm wavelength of laser light was used as the light-absorbing material. The rhodamine B was mixed in the FAS so as to be saturated to form a solution. Laser light having a wavelength of 532 nm was irradiated to the composition with low adherence property while moving a stage on which the subject substrate was placed. Thereafter, the substrate was washed with water to remove the pigment to some extent, and then a composition containing silver was discharged as a conductive material over the substrate. The discharged composition was baked at 100° C. for 30 minutes and then at 230° C. for 1 hour under an atmospheric air so as to form a silver wiring as shown in FIG. 34A. A Kapton® (which is a registered trademark of DuPont) tape is attached to the silver wiring as shown in FIG. 34A, followed by peeling off the Kapton® tape. According to this peeling test, the shapes of patterns formed on subject regions irradiated by laser light and regions not irradiated by laser light were observed. The adhesion of the Kapton® tape used in this test is 5.39 N/25 mm width and the tensile strength thereof is 122.6 N/25 mm width. FIG. 34B shows the silver wirings after the peeling test and FIGS. 34C and 34D shows enlarged views of the silver wirings as shown in FIG. 34B. FIGS. 34A to 34D are microscope photographs, respectively. A scanning direction of laser light was a longitudinal direction of each photograph while a direction of discharging the composition containing silver as the conductive material was a horizontal direction thereof which was perpendicular to the scanning direction.

In FIG. 34B, the regions irradiated by laser light are denoted by reference numerals 1a, 1b, 1c, 1d, 1e and 1f while the regions not irradiated by laser light are denoted by reference numerals 2a, 2b, 2c, 2d, 2e and 2f. In the regions irradiated by laser light, the substance with low adherence property was decomposed by laser light to improve its adherence property. Therefore the adherence properties in the regions irradiated by laser light and the regions not irradiated by laser light were different from one another so that the regions irradiated by laser light became high adherence regions having high adherence properties and the region not irradiated by laser light became low adherence regions having low adherence properties. Accordingly, as shown in FIGS. 34B to 34D, the silver wirings formed on the regions not irradiated by laser light 2a, 2b, 2c, 2d, 2e and 2f, where were the low adherence regions, were peeled off from the substrate due to the peeling treatment using the tape. Only the silver wirings formed on the regions irradiated by laser light 1a, 1b, 1c, 1d, 1e and 1f, where were the high adherence regions, remained thereon without being peeled off. It was known that the high adherence regions were well-adhered to the silver wirings formed thereon whereas the low adherence regions were not well-adhered to the silver wirings formed thereon. Since the laser light used in this test had a beam diameter of 80 μm, the silver wirings remaining on the regions irradiated by laser light 1a, 1b, 1c, 1d, 1e and 1f had a width of about 80 μm, respectively. In the microscope photograph of FIG. 34B, the length in a long axis direction of the silver wirings formed in the regions irradiated by laser light is 78 μm, which is almost equal to the width of each region irradiated by laser light. As shown in FIGS. 34C and 34D, the shapes of the remaining silver wirings reflects the shapes of the regions irradiated by laser light. Consequently, it can be confirmed that microscopic processing can be carried out.

According to the above described results, a predetermined pattern can be formed with good controllability. Furthermore, the loss of materials can be reduced, thereby reducing the cost. As a result, a high performance, highly reliable display device can be manufactured with high yield.

What is claimed is:

1. A method for manufacturing a semiconductor device, comprising:
    forming a second object by adding a light-absorbing material to a first object;
    discharging the second object over a substrate;
    irradiating a part of a surface of the second object with a light to form a first region and a second region on the surface of the second object, the second region having a higher adherence property with respect to a conductive layer, which is to be formed over the second object, than the first region;
    discharging a composition containing a conductive material over at least a part of the second region by a droplet discharging method while exposing a part of the first region;
    solidifying the composition containing the conductive material to form the conductive layer; and
    removing a part of the conductive layer formed over the first region, while leaving a part of the conductive layer formed over the second region.

2. The method for manufacturing the semiconductor device according to claim 1, wherein the first object comprises a fluorocarbon chain.

3. The method for manufacturing the semiconductor device according to claim 1, wherein the composition containing the conductive material is continuously discharged.

4. The method for manufacturing the semiconductor device according to claim 1, wherein the part of the conductive layer formed over the first region is removed from the surface of the second object.

5. The method for manufacturing the semiconductor device according to claim 1, wherein the second object is discharged by a droplet discharging method.

6. A method for manufacturing a semiconductor device, comprising:
    forming a second object by adding a light-absorbing material to a first object;
    discharging the second object over a substrate;
    modifying a part of a surface of the second object to form a first region and a second region, the second region having a higher adherence property with respect to a conductive layer, which is to be formed over the second object, than the first region;
    discharging a composition containing a conductive material over at least a part of the second region by a droplet discharging method while exposing a part of the first region;
    solidifying the composition containing the conductive material to form the conductive layer;
    attaching a third object having a surface with adherence property to the conductive layer; and
    peeling off the third object having the surface with adherence property and the conductive layer formed over the first region.

7. The method for manufacturing the semiconductor device according to claim 6, wherein the first object comprises a fluorocarbon chain.

8. The method for manufacturing the semiconductor device according to claim 6, wherein the composition containing the conductive material is continuously discharged.

9. The method for manufacturing the semiconductor device according to claim 6, wherein the conductive layer formed over the first region is peeled off from the surface of the second object.

10. The method for manufacturing the semiconductor device according to claim 6, wherein the second object is discharged by a droplet discharging method.

11. A method for manufacturing a semiconductor device, comprising:
    forming a second object by adding a light-absorbing material to a first object;
    discharging the second object over a substrate;
    modifying a part of a surface of the second object by irradiating light to form a first region and a second region on the surface of the second object, the second region having a higher adherence property with respect to a conductive layer, which is to be formed over the second object, than the first region;
    discharging a composition containing a conductive material over at least a part of the second region by a droplet discharging method while exposing a part of the first region;
    solidifying the composition containing the conductive material to form the conductive layer; and
    removing a part of the conductive layer formed over the first region, while leaving a part of the conductive layer formed over the second region.

12. The method for manufacturing the semiconductor device according to claim 1 or 11, wherein a laser light is used as the light.

13. The method for manufacturing the semiconductor device according to claim 11, wherein the first object comprises a fluorocarbon chain.

14. The method for manufacturing the semiconductor device according to claim 11, wherein the composition containing the conductive material is continuously discharged.

15. The method for manufacturing the semiconductor device according to claim 11, wherein the part of the conductive layer formed over the first region is removed from the surface of the second object.

16. The method for manufacturing the semiconductor device according to claim 11, wherein the second object is discharged by a droplet discharging method.

17. A method for manufacturing a semiconductor device, comprising:
forming a second object by adding a light-absorbing material to a first object;
discharging the second object over a substrate;
modifying a part of a surface of the second object by irradiating light to form a first region and a second region, the second region having a higher adherence property with respect to a conductive layer, which is to be formed over the second object, than the first region;
discharging a composition containing a conductive material over at least a part of the second region by a droplet discharging method while exposing a part of the first region;
solidifying the composition containing the conductive material to form the conductive layer;
attaching a third object having a surface with adherence property to the conductive layer; and
peeling off the third object having the surface with adherence property and the conductive layer formed over the first region.

18. The method for manufacturing the semiconductor device according to claim 17, wherein a laser light is used as the light.

19. The method for manufacturing the semiconductor device according to claim 17, wherein the first object comprises a fluorocarbon chain.

20. The method for manufacturing the semiconductor device according to claim 17, wherein the composition containing the conductive material is continuously discharged.

21. The method for manufacturing the semiconductor device according to claim 17, wherein the conductive layer formed over the first region is peeled off from the surface of the second object.

22. The method for manufacturing the semiconductor device according to claim 17, wherein the second object is discharged by a droplet discharging method.

23. A method for manufacturing a thin film transistor, comprising:
forming a second object by adding a light-absorbing material to a first object;
discharging the second object over a substrate;
irradiating a part of a surface of the second object with a light to form a first region and a second region on the surface of the second object, the second region having a higher adherence property with respect to a conductive layer, which is to be formed over the second object, than the first region;
discharging a composition containing a conductive material over at least a part of the second region by a droplet discharging method while exposing a part of the first region;
solidifying the composition containing the conductive material to form the conductive layer; and
removing a part of the conductive layer formed over the first region, while leaving a part of the conductive layer formed over the second region, thereby forming a gate electrode.

24. The method for manufacturing the thin film transistor according to claim 23, wherein the first object comprises a fluorocarbon chain.

25. The method for manufacturing the thin film transistor according to claim 23, wherein the composition containing the conductive material is continuously discharged.

26. The method for manufacturing the thin film transistor according to claim 23, wherein the part of the conductive layer formed over the first region is removed from the surface of the second object.

27. The method for manufacturing the thin film transistor according to claim 23, wherein the second object is discharged by a droplet discharging method.

28. A method for manufacturing a thin film transistor, comprising:
forming a second object by adding a light-absorbing material to a first object;
forming the second object over a substrate;
modifying a part of a surface of the second object to form a first region and a second region, the second region having a higher adherence property with respect to a conductive layer, which is to be formed over the second object, than the first region;
discharging a composition containing a conductive material over at least a part of the second region by a droplet discharging method while exposing a part of the first region;
solidifying the composition containing the conductive material to form the conductive layer;
attaching a third object having a surface with adherence property to the conductive layer; and
peeling off the third object having the surface with adherence property and the conductive layer formed over the first region, thereby forming a gate electrode.

29. The method for manufacturing the thin film transistor according to claim 28, wherein the first object comprises a fluorocarbon chain.

30. The method for manufacturing the thin film transistor according to claim 28, wherein the composition containing the conductive material is continuously discharged.

31. The method for manufacturing the thin film transistor according to claim 28, wherein the conductive layer formed over the first region is peeled off from the surface of the second object.

32. The method for manufacturing the thin film transistor according to claim 28, wherein the second object is discharged by a droplet discharging method.

33. A method for manufacturing a thin film transistor, comprising:
forming a second object by adding a light-absorbing material to first object;
discharging the second object over a substrate;
modifying a part of a surface of the second object by irradiating light to form a first region and a second region on the surface of the second object, the second region having a higher adherence property with respect to a conductive layer, which is to be formed over the second object, than the first region;
discharging a composition containing a conductive material over at least a part of the second region by a droplet discharging method while exposing a part of the first region;
solidifying the composition containing the conductive material to form the conductive layer; and removing a part of the conductive layer formed over the first region, while leaving a part of the conductive layer formed over the second region, thereby forming a gate electrode.

34. The method for manufacturing the thin film transistor according to claim 33, wherein the first object comprises a fluorocarbon chain.

35. The method for manufacturing the thin film transistor according to claim 33, wherein the composition containing the conductive material is continuously discharged.

36. The method for manufacturing the thin film transistor according to claim 33, wherein the part of the conductive layer formed over the first region is removed from the surface of the second object.

37. The method for manufacturing the thin film transistor according to claim 33, wherein the second object is discharged by a droplet discharging method.

38. A method for manufacturing a thin film transistor, comprising:
    forming a second object by adding a light-absorbing material to a first object;
    forming the second object over a substrate;
    modifying a part of a surface of the first object by irradiating light to form a first region and a second region, the second region having a higher adherence property with respect to a conductive layer, which is to be formed over the second object, than the first region;
    discharging a composition containing a conductive material over at least a part of the second region by a droplet discharging method while exposing a part of the first region;
    solidifying the composition containing the conductive material to form the conductive layer;
    attaching a third object having a surface with adherence property to the conductive layer; and
    peeling off the third object having the surface with adherence property and the conductive layer formed over the first region, thereby forming a gate electrode.

39. The method for manufacturing the thin film transistor according to claim 23 or 33, wherein a laser light is used as the light.

40. The method for manufacturing the thin film transistor according to claim 38, wherein a laser light is used as the light.

41. The method for manufacturing the thin film transistor according to claim 38, wherein the first object comprises a fluorocarbon chain.

42. The method for manufacturing the thin film transistor according to claim 38, wherein the composition containing the conductive material is continuously discharged.

43. The method for manufacturing the thin film transistor according to claim 38, wherein the conductive layer formed over the first region is peeled off from the surface of the second object.

44. The method for manufacturing the thin film transistor according to claim 38, wherein the second object is discharged by a droplet discharging method.

* * * * *